United States Patent
Pan

(10) Patent No.: US 10,325,894 B1
(45) Date of Patent: Jun. 18, 2019

(54) INTEGRATED MULTI-COLOR LIGHT-EMITTING PIXEL ARRAYS BASED DEVICES BY BONDING

(71) Applicant: Shaoher Pan, Palo Alto, CA (US)

(72) Inventor: Shaoher Pan, Palo Alto, CA (US)

( * ) Notice: Subject to any disclaimer, the term of this patent is extended or adjusted under 35 U.S.C. 154(b) by 0 days.

(21) Appl. No.: 15/955,392

(22) Filed: Apr. 17, 2018

(51) Int. Cl.
  *H01L 25/16* (2006.01)
  *H01L 27/12* (2006.01)
  (Continued)

(52) U.S. Cl.
  CPC ........ *H01L 25/167* (2013.01); *H01L 24/29* (2013.01); *H01L 24/32* (2013.01); *H01L 24/83* (2013.01); *H01L 24/94* (2013.01); *H01L 27/124* (2013.01); *H01L 27/1218* (2013.01); *H01L 27/1248* (2013.01); *H01L 27/1262* (2013.01); *H01L 33/007* (2013.01); *H01L 33/0079* (2013.01); *H01L 33/62* (2013.01); *H01L 33/06* (2013.01); *H01L 33/32* (2013.01); *H01L 33/42* (2013.01); *H01L 2224/29025* (2013.01); *H01L 2224/29028* (2013.01); *H01L 2224/29186* (2013.01);
  (Continued)

(58) Field of Classification Search
  CPC ..... H01L 25/167; H01L 27/15; H01L 27/153; H01L 27/156; H01L 27/1233; H01L 27/1248
  See application file for complete search history.

(56) References Cited

U.S. PATENT DOCUMENTS 5,827,753 A  10/1998 Huang et al.
6,844,903 B2  1/2005 Mueller-Mach et al.
(Continued)

FOREIGN PATENT DOCUMENTS

CN  102751296  10/2012
JP  2002-141492  5/2002
(Continued)

OTHER PUBLICATIONS

Horng et al., "Performance of GaN-based Light-emitting Diodes Fabricated Using GaN Epilayers Grown on Silicon Substrates," Optics Express, 22(1):179-187.
(Continued)

*Primary Examiner* — Scott B Geyer
(74) *Attorney, Agent, or Firm* — Fish & Richardson P.C.

(57) ABSTRACT

Integrated active-matrix multi-color light emitting pixel arrays based displays and methods of fabricating the integrated displays are provided. An example integrated device includes a backplane device and different color light emitting diodes (LEDs) devices arranged in different height planar layers on the backplane device. The backplane device includes at least one backplane having a number of pixel circuits. Each LED device includes an array of LEDs each operable to emit light with a particular color and conductively coupled to respective pixel circuits in the backplane to form active-matrix LED sub-pixels. The different color LED sub-pixels form an array of active-matrix multi-color display pixels. Plug vias can be arranged in different planar layers to conductively couple upper-level LEDs to respective pixel circuits in respective regions over the backplane device. The plug vias can extend from an upper planar layer into a lower planar layer to fix the two planar layers together.

28 Claims, 46 Drawing Sheets

(51) Int. Cl.

| | | |
|---|---|---|
| *H01L 23/00* | (2006.01) | |
| *H01L 33/00* | (2010.01) | |
| *H01L 33/62* | (2010.01) | |
| *H01L 33/32* | (2010.01) | |
| *H01L 33/42* | (2010.01) | |
| *H01L 33/06* | (2010.01) | |

(52) U.S. Cl.
CPC .......... *H01L 2224/32146* (2013.01); *H01L 2224/83143* (2013.01); *H01L 2224/83194* (2013.01); *H01L 2224/83951* (2013.01); *H01L 2224/83986* (2013.01); *H01L 2924/0549* (2013.01); *H01L 2924/12041* (2013.01); *H01L 2924/1426* (2013.01); *H01L 2924/1437* (2013.01); *H01L 2924/1443* (2013.01); *H01L 2933/005* (2013.01); *H01L 2933/0033* (2013.01); *H01L 2933/0066* (2013.01)

(56) References Cited

U.S. PATENT DOCUMENTS

| | | | |
|---|---|---|---|
| 7,248,310 B2 | 7/2007 | Mueller-Mach et al. | |
| 7,956,370 B2 | 6/2011 | Pan | |
| 8,642,363 B2 | 2/2014 | Lau et al. | |
| 8,674,383 B2 | 3/2014 | Pan | |
| 9,423,535 B1 | 8/2016 | Hu et al. | |
| 10,128,308 B1* | 11/2018 | Shin | H01L 25/162 |
| 2003/0025118 A1 | 2/2003 | Yamazaki et al. | |
| 2003/0082889 A1 | 5/2003 | Maruyama et al. | |
| 2004/0238827 A1 | 12/2004 | Takayama et al. | |
| 2008/0116468 A1 | 5/2008 | Radkov et al. | |
| 2009/0032799 A1 | 2/2009 | Pan | |
| 2010/0308300 A1 | 12/2010 | Pan | |
| 2011/0193056 A1 | 8/2011 | Wang | |
| 2011/0309378 A1* | 12/2011 | Lau | H01L 27/1214 257/88 |
| 2012/0169682 A1 | 7/2012 | Kuhlman et al. | |
| 2012/0241809 A1 | 9/2012 | Pan et al. | |
| 2014/0063393 A1 | 3/2014 | Zhong et al. | |
| 2014/0152619 A1 | 6/2014 | Hotelling et al. | |
| 2014/0225838 A1 | 8/2014 | Gupta et al. | |
| 2014/0367633 A1* | 12/2014 | Bibl | G02F 1/133603 257/13 |
| 2015/0091849 A1 | 4/2015 | Ludden | |
| 2015/0332635 A1* | 11/2015 | Lau | H01L 33/24 345/691 |
| 2015/0362165 A1* | 12/2015 | Chu | H01L 25/0753 362/235 |
| 2016/0163765 A1 | 6/2016 | Hu et al. | |
| 2016/0259368 A1 | 9/2016 | Bibl et al. | |
| 2016/0299395 A1 | 10/2016 | Kosuge et al. | |
| 2016/0313848 A1 | 10/2016 | Rhee | |
| 2017/0069612 A1* | 3/2017 | Zhang | G03B 21/005 |
| 2017/0123529 A1 | 5/2017 | Ho | |
| 2017/0179097 A1* | 6/2017 | Zhang | H01L 25/50 |
| 2017/0179192 A1* | 6/2017 | Zhang | H01L 23/29 |
| 2017/0185193 A1 | 6/2017 | Kim | |
| 2017/0250167 A1* | 8/2017 | Bower | H01L 21/67144 |
| 2017/0352791 A1 | 12/2017 | Kang | |

FOREIGN PATENT DOCUMENTS

| | | |
|---|---|---|
| JP | 2007-005372 | 1/2007 |
| WO | WO 2013-105347 | 7/2013 |

OTHER PUBLICATIONS

Huang et al., "Static active-matrix OLED Display without Pixel Refresh Enabled by Amorphous-silicon Non-volatile Memory," Journal of the SID, 18/11, 2010, pp. 879-883.

Setlur, "Phosphors for LED-based Solid-State Lighting," The Electrochemical Society Interface, Winter 2009, pp. 32-36.

Singh et al., "Design and Fabrication of InGaN/GaN MQWs Blue LED on Sapphire Substrate for High Voltage Operation," IRACST—Engineering Science and Technology: an International Journal (ESTIJ), ISSN: 2250-3498, 5(4):299-301, Aug. 2015.

Authorized officer Sang Bum Chin, International Search Report and Written Opinion in PCT/US2017/056378, dated Mar. 6, 2018, 17 pages.

* cited by examiner

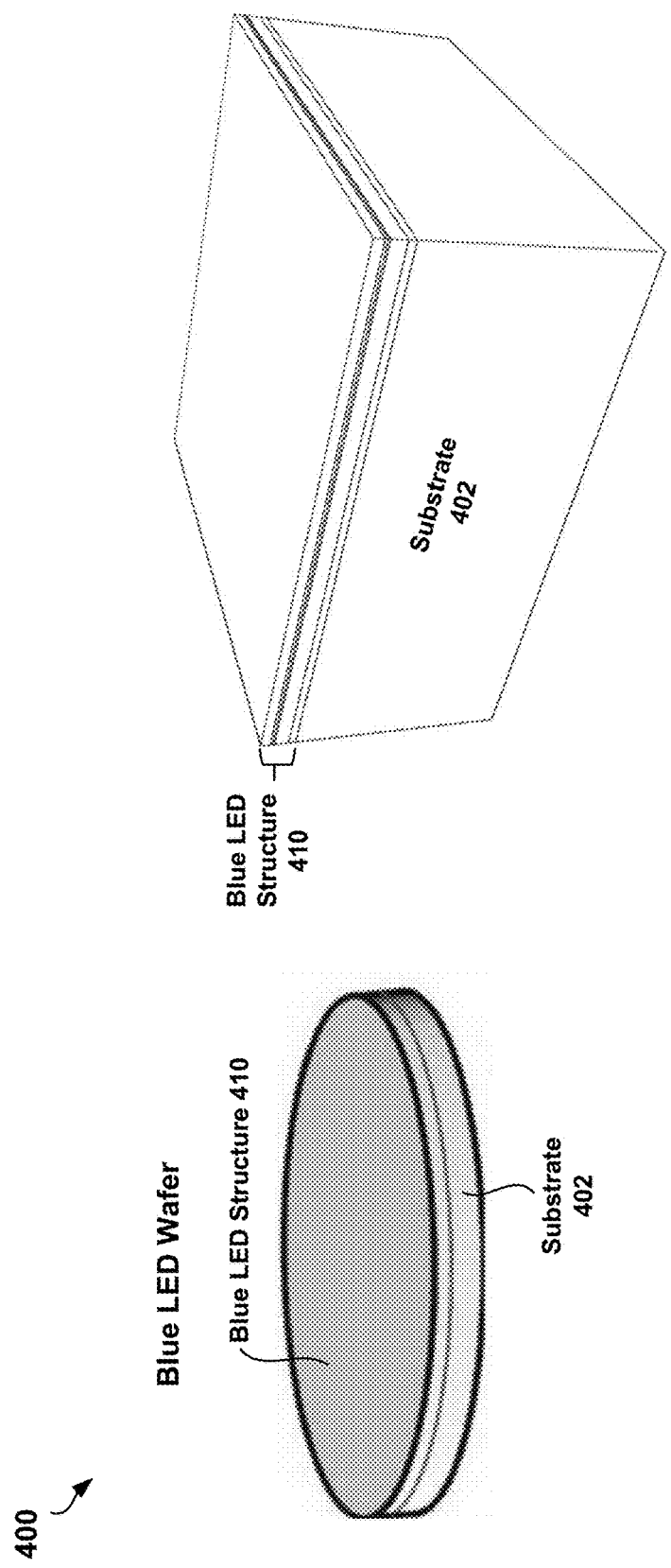

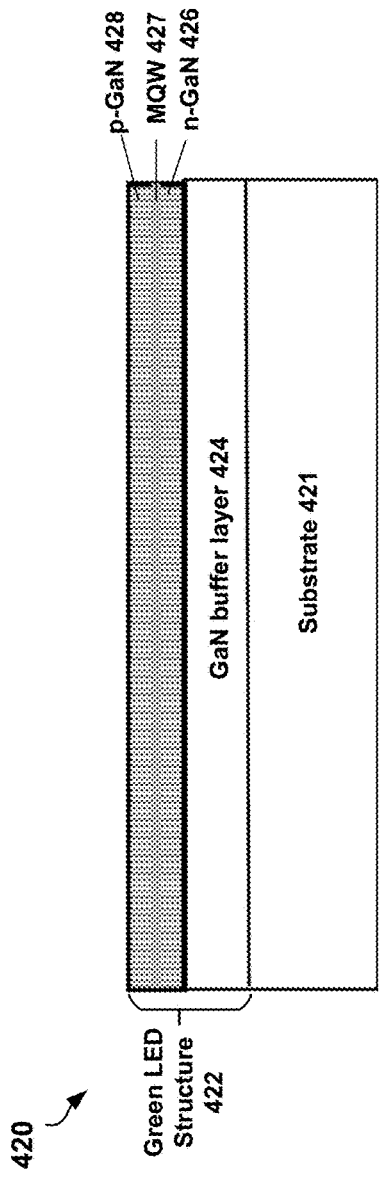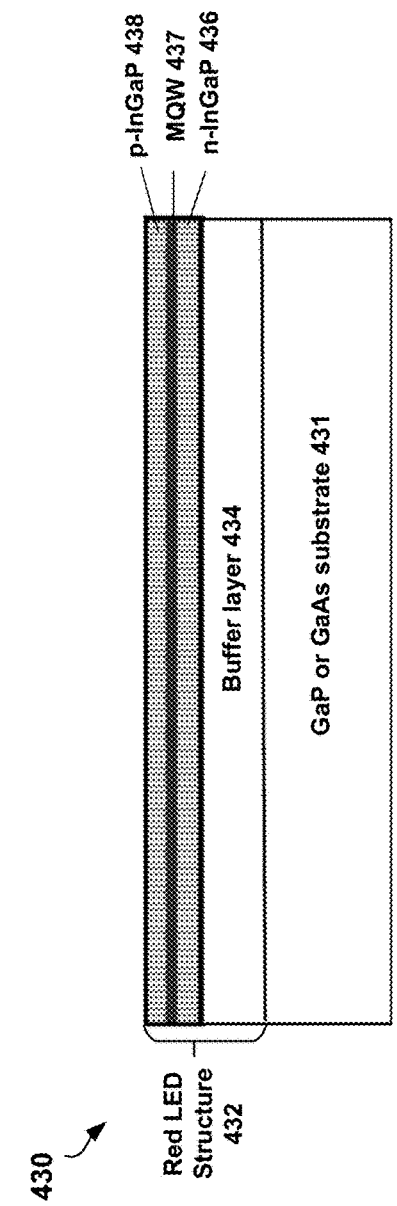
FIG. 4B
FIG. 4C

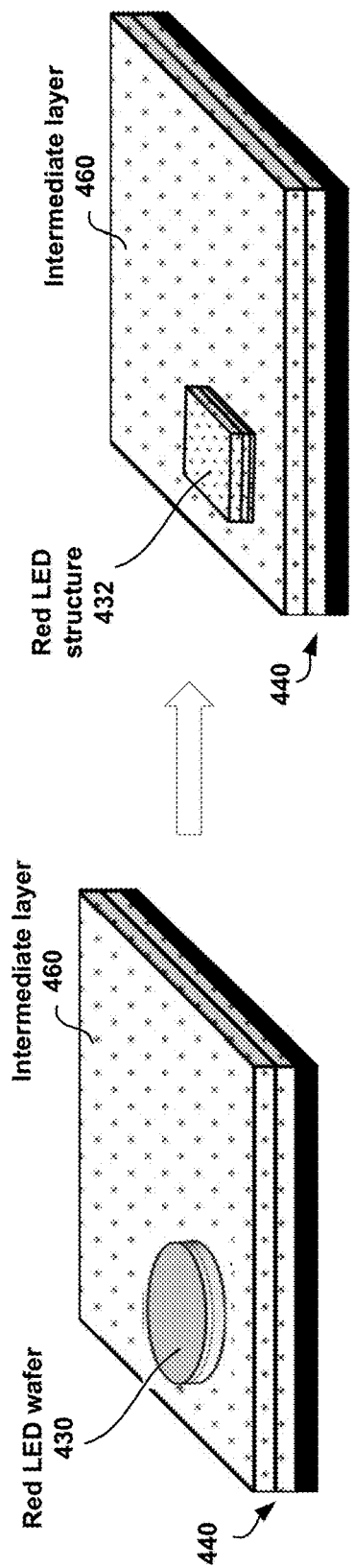

US 10,325,894 B1

INTEGRATED MULTI-COLOR LIGHT-EMITTING PIXEL ARRAYS BASED DEVICES BY BONDING

TECHNICAL FIELD

This disclosure relates generally to display devices or systems, particularly to integrated multi-color light-emitting pixel arrays based display devices or systems.

BACKGROUND

Displays utilizing arrays of light emitting pixels are popular in the electronic field and especially in portable electronic and communication devices, because large amounts of data and pictures can be transmitted rapidly and virtually to any location. Light emitting diode (LED) arrays are becoming more popular than liquid crystal displays (LCD) as an image source in both direct view and virtual image displays. One reason for this is that LEDs are capable of generating relatively high luminance, thus displays incorporating LED arrays can be used in a greater variety of ambient conditions.

Although LED arrays offer certain advantages, a major disadvantage is the complexity of their manufacturing process. In some cases, the arrays are manufactured by depositing materials on a supporting substrate, and addressing/driver connections to row and column buses are made around the edges. Thus, the supporting substrate size is larger than the array size because of the necessary I/O pads or terminals. Providing very small contact pads in an effort to increase the array size greatly reduces the assembly yield. Another problem is that the driver circuitry for the LED arrays has a relatively high power consumption and adds a further manufacturing complexity.

SUMMARY

Described herein are integrated multi-color light-emitting pixel array-based devices or systems and methods of making them by sequentially forming different color light emitting devices in different height planar layers on a backplane device, which can greatly simplify the manufacturing complexity and improve manufacturing efficiency and quality.

One aspect of the present disclosure features a method of fabricating an integrated device, including: integrating a first light emitting structure formed on a first substrate with a backplane device, where the backplane device includes at least one backplane having a plurality of pixel circuits, and the first light emitting structure includes a plurality of first layers formed on the first substrate; patterning the first light emitting structure to form a plurality of first light emitting elements in a first region over the backplane device, where each of the first light emitting elements is operable to emit light with a first color and conductively coupled to a respective pixel circuit in the first region to thereby form a plurality of first light emitting pixels; forming a plurality of first plug vias in a first remaining region over the backplane device, the first remaining region being non-overlapping with the first region, where each of the first plug vias is conductively coupled to a respective pixel circuit in the first remaining region; integrating a second light emitting structure formed on a second substrate with the first plug vias on the backplane device, where the second light emitting structure includes a plurality of second layers formed on the second substrate; and patterning the second light emitting structure to form a plurality of second light emitting elements in a second region over the backplane device, the second region being in the first remaining region, where each of the second light emitting elements is operable to emit light with a second color different from the first color and conductively coupled to a respective pixel circuit in the second region through a respective first plug via in the second region to thereby form a plurality of second light emitting pixels.

In some implementations, integrating the first light emitting structure formed on the first substrate with the backplane device includes: using low temperature bonding to bond a first top layer of the first light emitting structure on a second top layer of the backplane device through an intermediate conductive layer. The intermediate conductive layer can include an iridium-tin-oxide (ITO) film. The method can include simultaneously patterning the first light emitting structure and the intermediate conductive layer, and each of the first light emitting elements is self-aligned with a respective patterned intermediate conductive layer.

In some implementations, the plurality of first layers includes a contact electrode layer as the first top layer. Each of the pixel circuits can include a non-volatile memory conductively coupled to a corresponding driver electrode in the second top layer, and each of the first light emitting element can be conductively coupled to a respective non-volatile memory through a corresponding patterned contact electrode layer, a corresponding patterned intermediate conductive layer, and the corresponding driver electrode to thereby form a respective first light-emitting pixel.

In some implementations, integrating the first light emitting structure formed on the first substrate with the backplane device includes: aligning the first light emitting structure formed on the first substrate with a first area of the backplane device; bonding the first light emitting structure with the first area of the backplane device; scanning, by using a laser, a first particular shape area on the first light emitting structure such that the first light emitting structure in the first particular shape area is separated from the first substrate and remains bonded on the backplane device; and removing the first substrate together with other non-scanned areas on the first light emitting structure from the first area of the backplane device. The method can further include: aligning another first light emitting structure on another first substrate with a second area of the backplane device; bonding the another first light emitting structure with the second area of the backplane device; scanning, by using the laser, a second particular shape area on the another light emitting structure such that the another light emitting structure in the second particular shape area is separated from the another first substrate and remains bonded on the backplane device; and removing the another first substrate together with other non-scanned areas on the another light emitting structure from the second area of the backplane device, where the another light emitting structure on the another first substrate is aligned with the second area of the backplane device, such that the another light emitting structure in the second particular shape area is adjacent to the first light emitting structure in the first particular shape area on the backplane device.

The first light emitting structure can include one or more quantum well layers as an active medium between a first contact electrode as a top layer and a second contact electrode as a bottom layer. The first light emitting structure can include a buffer layer between the second contact electrode and the first substrate. The method can further include: polishing the first light emitting structure to remove the buffer layer to expose the second contact electrode.

Each of the pixel circuits can be coupled to a respective driver electrode in a top layer of the backplane device. The method can further include: before patterning the first light emitting structure, aligning a protective mask with the respective driver electrodes in the first region, such that the plurality of first light emitting elements is formed on the respective driver electrodes in the first region. The method can also include: before forming the plurality of first plug vias, aligning a protective mask with the respective driver electrodes in the first remaining region, such that each of the first plug vias is arranged on a respective driver electrode in the first remaining region.

In some implementations, the method includes: after patterning the first light emitting structure, filling in an isolation material between gaps of the first light emitting elements; and forming the plurality of first plug vias through the isolation material in the first remaining region over the backplane device. Forming the plurality of first plug vias can include: etching to form a plurality of trenches through the isolation material in the first remaining region; and filling a conductive material inside the trenches to form the first plug vias. The filled conductive material can include transparent ITO metal material. Forming the plurality of first plug vias can include: before filling the conductive material, depositing a barrier metallic layer on inner surfaces of the trenches. In some cases, etching to form the plurality of trenches includes: etching through the isolation material into a portion of the top layer such that each of the formed trenches extends into a corresponding driver electrode in the first remaining region, such that each of the formed first plug vias is anchored in the corresponding driver electrode.

The method can further include: polishing the first light emitting elements, the first plug vias, and the isolation material to form a flat surface across the first plug vias and contact electrodes of the first light emitting elements. The method can also include: depositing a first transparent conductive layer on the flat surface to connect the contact electrodes of the first light emitting elements. Integrating the second light emitting structure formed on the second substrate with the first plug vias on the backplane device can include: using low temperature bonding to bond a top layer of the second light emitting structure on the first transparent conductive layer. The first transparent conductive layer can include an iridium-tin-oxide (ITO) film. Patterning the second light emitting structure can include selectively etching the second light emitting structure to form the plurality of second light emitting elements in the second region.

The method can further include: selectively etching the first transparent conductive layer to form one or more conductive lines on the contact electrodes of the first light emitting elements and respective patterned first transparent conductive layers under the second light emitting elements. The conductive lines can conductively connect the contact electrodes of the first light emitting elements to form one or more common electrodes, and each of the second light emitting elements can be conductively coupled to the respective pixel circuit in the second region through the respective patterned first transparent conductive layer and the respective first plug via in the second region.

The method can further include: after patterning the second light emitting structure to form the plurality of second light emitting elements, filling in an isolation material between gaps of the second light emitting elements and on top of the first light emitting elements. The method can also include: polishing the second light emitting elements and the isolation material to form a flat surface across contact electrodes of the second light emitting elements; and depositing a second transparent conductive layer on the flat surface to connect the contact electrodes of the second light emitting elements.

In some implementations, the method further includes: forming a plurality of second plug vias in a second remaining region of the backplane device, the second remaining region being in the first remaining region and non-overlapping with the second region, where each of the second plug vias is conductively coupled to a respective pixel circuit in the second remaining region through a respective first plug via in the second remaining region; integrating a third light emitting structure formed on a third substrate with the second plug vias on the backplane device, where the third light emitting structure includes a plurality of third layers formed on the third substrate; and patterning the third light emitting structure to form a plurality of third light emitting elements in a third region over the backplane device, the third region being in the second remaining region, where each of the third light emitting elements is operable to emit light with a third color different from the first color and the second color, and where each of the third light emitting elements is conductively coupled to a respective pixel circuit in the third region through a respective first plug via and a respective second plug via in the third region to thereby form a plurality of third light emitting pixels.

The plurality of first light emitting pixels, the plurality of second light emitting pixels, and the plurality of third light emitting pixels can form an array of multi-color light emitting pixels. The first, second, and third colors can include blue, green, and red. Each of the multi-color light emitting pixels can include at least one first light emitting element, at least one second light emitting element, and at least one third light emitting element and respective pixel circuits coupled to the first, second, third light emitting elements, and the first, second, and third light emitting elements in the multi-color light emitting pixel can be adjacent to each other.

The method can further include: after patterning the second light emitting structure to form the plurality of second light emitting elements, filling in an isolation material between gaps of the second light emitting elements and on top of the first light emitting elements. Forming the plurality of second plug vias in the second remaining region of the backplane device can include: etching to form a plurality of trenches through the isolation material in the second remaining region; and filling a conductive material inside the trenches to form the second plug vias. In some cases, etching to form the plurality of trenches includes: etching through the isolation material into the first plug vias in the second remaining region such that each of the formed trenches extends into a corresponding first plug via in the second remaining region, such that each of the formed second plug vias is anchored in the corresponding first plug via.

The method can further include: polishing the second light emitting elements, the second plug vias, and the isolation material to form a flat surface across the second plug vias and contact electrodes of the second light emitting elements; and depositing a second transparent conductive layer on the flat surface to connect the contact electrodes of the second light emitting elements.

Integrating the third light emitting structure formed on the third substrate with the second plug vias on the backplane device can include: using low temperature bonding to bond a top layer of the third light emitting structure on the second transparent conductive layer. The second transparent conductive layer can include an iridium-tin-oxide (ITO) film.

Patterning the third light emitting structure can include selectively etching the third light emitting structure to form the plurality of third light emitting elements in the third region. The method can further include: selectively etching the second transparent conductive layer to form one or more conductive lines on the contact electrodes of the second light emitting elements and respective patterned second transparent conductive layers under the third light emitting elements. The conductive lines can conductively connect the contact electrodes of the second light emitting elements to form common electrodes, and each of the third light emitting elements can be conductively coupled to the respective pixel circuit in the third region through the respective patterned second transparent conductive layer and the respective first plug via and second plug via in the third region.

After patterning the third light emitting structure to form the plurality of third light emitting elements, the method can further include: filling in an isolation material between gaps of the third light emitting elements and on top of the second light emitting elements and the first light emitting elements. The method can also include: polishing the third light emitting elements and the isolation material to form a flat surface across contact electrodes of the third light emitting elements; and depositing a third transparent conductive layer on the flat surface to connect the contact electrodes of the third light emitting elements. The third transparent conductive layer can include an iridium-tin-oxide (ITO) film. In some cases, the method further include: selectively etching the third transparent conductive layer to form one or more conductive lines on the contact electrodes of the third light emitting elements, where the conductive lines conductively connect the contact electrodes of the third light emitting elements to form common electrodes; depositing a transparent isolation layer on the common electrodes and the flat surface; and polishing the transparent isolation layer to form a second flat surface.

The method can further include: forming a transparent protective layer on top of the array of multi-color light emitting pixels. The formed transparent protective layer can include a transparent touch-sensitive protective layer, and the transparent touch-sensitive protective layer can be configured to form, together with common electrodes of the light emitting elements, a capacitive touch screen position sensor. The method can further include: forming a polarizer film between the transparent protective layer and the array of multi-color light emitting pixels.

Each of the first light emitting elements can include a first light emitting diode (LED), and each of the second light emitting elements can include a second light emitting diode (LED).

The at least one backplane can be formed on a backplane substrate. The backplane substrate can include a flexible film on a carrier substrate. The method can include: removing the carrier substrate such that the integrated device fabricated on the flexible film becomes flexible. The at least one backplane can include a low temperature polysilicon (LTPS) thin-film transistors (TFT) array control backplane.

Another aspect of the present disclosure features a method of fabricating an integrated active-matrix multi-color light emitting diode (LED) pixel array based display by bonding. The method includes the following steps: integrating one or more first color LED structures with a backplane device, where the backplane device includes at least one backplane having a plurality of pixel circuits, and each of the first color LED structures includes a plurality of first semiconductor layers epitaxially grown on a first semiconductor substrate, the first semiconductor layers including one or more first quantum well layers having Group III-V compounds; patterning the first color LED structures to form a plurality of first color LEDs in a first region over the backplane device, where each of the first color LED is operable to emit light with a first color and conductively coupled to a respective pixel circuit in the first region to thereby form a plurality of active-matrix first color LED sub-pixels; depositing an isolation material in gaps of the first color LEDs; forming a plurality of first plug vias through the isolation material in a first remaining region of the backplane device, the first remaining region being non-overlapping with the first region, where each of the first plug vias is conductively coupled to a respective pixel circuit in the first remaining region; polishing the first color LEDs, the first plug vias, and the isolation material to form a first flat surface across the first plug vias and first contact electrodes of the first color LEDs; depositing a first transparent conductive layer on the first flat surface; integrating one or more second color LED structures with the first plug vias through the first transparent conductive layer, where each of the second color LED structures includes a plurality of second semiconductor layers epitaxially grown on a second semiconductor substrate, the second semiconductor layers including one or more second quantum well layers having Group III-V compounds; patterning the second color LED structure to form a plurality of second color LEDs in a second region over the backplane device, the second region being in the first remaining region, where each of the second color LEDs is operable to emit light with a second color different from the first color and conductively coupled to a respective pixel circuit in the second region through a respective first plug via in the second region to thereby form a plurality of active-matrix second color light emitting sub-pixels; selectively etching the first transparent conductive layer to form one or more first common electrodes on the first contact electrodes of the first color LEDs and respective patterned first transparent conductive layer under the second color LEDs; depositing a second isolation material in gaps of the second color LEDs and on the first color LEDs; forming a plurality of second plug vias through the second isolation material on respective first plug vias in a second remaining region over the backplane device, the second remaining region being in the first remaining region and non-overlapping with the second region, where each of the second plug vias is conductively coupled to a respective pixel circuit in the second remaining region through a respective first plug via in the second remaining region; polishing the second color LEDs, the second plug vias, and the second isolation material to form a second flat surface across the second plug vias and second contact electrodes of the second color LEDs; depositing a second transparent conductive layer on the second flat surface; integrating one or more third color LED structures with the second plug vias over the backplane device through the second transparent conductive layer, where each of the third color LED structures includes a plurality of third semiconductor layers epitaxially grown on a third semiconductor substrate, the third semiconductor layers including one or more third quantum well layers having Group III-V compounds; patterning the third color LED structures to form a plurality of third color LEDs in a third region of the backplane device, the third region being in the second remaining region, where each of the third color LEDs is operable to emit light with a third color different from the first color and the second color, where each of the third LEDs is conductively coupled to a respective pixel circuit in the third region through a respective first plug via and a respective second plug via in the third region to thereby form a plurality of active-matrix third color LED sub-pixels, and where the plurality of first color LED sub-pixels, the plurality of second color LED sub-pixels, and the plurality of third color LED sub-pixels form an array of active-matrix multi-color LED pixels; selectively etching the second transparent conductive layer to form one or more second common electrodes on the second contact electrodes of the second color LEDs and respective patterned second transparent conductive layers under the third color LEDs; depositing a third isolation material between gaps of the third color LEDs and on top of the second color LEDs and the first color LEDs; polishing the third color LEDs and the third isolation material to form a third flat surface across third contact electrodes of the third color LEDs; depositing a third transparent conductive layer on the third flat surface to connect the third contact electrodes of the third color LEDs; forming a polarizer film on the array of active-matrix multi-color LED pixels; and forming a transparent protective layer on the polarizer film.

In some implementations, integrating the one or more first color LED structures with the backplane device includes: depositing an intermediate conductive layer on a top layer of the backplane device; and sequentially using low temperature bonding to bond each of the first color LED structures on the top layer of the backplane device through the intermediate conductive layer. Bonding each of the first color LED structures on the top layer of the backplane device can include: aligning the first color LED structure formed on the first semiconductor substrate with a first area of the backplane device; using low temperature bonding to bond the first color LED structure with the top layer in the first area of the backplane device through the intermediate conductive layer; scanning, by using a laser, a particular shape area on the first color LED structure such that the first color LED structure in the particular shape area is separated from the first semiconductor substrate and remains bonded on the backplane device; and peeling off the first semiconductor substrate together with other non-scanned areas on the first color LED structure from the first area of the backplane device. The first color LED structures remaining bonded on the backplane device can be arranged adjacent to each other on the backplane device.

Each of the first color LED structure can include a buffer layer, a first contact electrode layer, the one or more first quantum well layers, and a second electrode layer sequentially formed on the first semiconductor substrate. The second electrode layer can be bonded onto the top layer of the backplane device through the intermediate conductive layer. The method can include: polishing the first color LED structures bonded on the backplane device to expose the first contact electrode layers of the first color LED structures.

Each of the pixel circuits can be coupled to a respective driver electrode in a top layer of the backplane device. Forming the plurality of first plug vias can include: etching through the isolation material into a portion of the top layer to form a plurality of first trenches extending into corresponding driver electrodes in the first remaining region; and filling a conductive material in the first trenches such that each of the formed first plug vias is anchored in the corresponding driver electrode, such that the first color LEDs are fixed to the backplane device at least partially by the anchored first plug vias and the isolation material between the first color LEDs and the anchored first plug vias.

In some implementations, forming the plurality of second plug vias includes: etching through the isolation material into the first plug vias in the second remaining region to form a plurality of second trenches extending into corresponding first plug vias; and filling a conductive material in the second trenches such that each of the formed second plug vias is anchored in the corresponding first plug via, such that the second color LEDs are fixed to the backplane device at least partially by the anchored second plug vias and the second isolation material between the second color LEDs and the anchored second plug vias. The third color LEDs can be fixed to the backplane device at least partially by the third transparent conductive layer and the third isolation material adjacent to the third color LEDs.

The at least one backplane can include a low temperature polysilicon (LTPS) thin-film transistors (TFT) array control backplane formed on a flexible film on a carrier substrate, and the method can further include: removing the carrier substrate such that the fabricated display on the flexible film becomes flexible.

The first, second, and third colors can include red, blue, and green. The first, second, and third isolation materials can include transparent dielectric material. Each of the first, second, and third transparent conductive layers can include an iridium-tin-oxide (ITO) film. The first plug vias and the second plug vias can be made of transparent ITO metal material.

A third aspect of the present disclosure features an integrated device including: a backplane device including at least one backplane having a plurality of pixel circuits; a first planar layer on the backplane device, the first planar layer including: a plurality of first light emitting elements in a first region over the backplane device, where each of the first light emitting elements is operable to emit light with a first color and conductively coupled to a respective pixel circuit in the first region to thereby form a plurality of first light emitting sub-pixels, and a plurality of first plug vias in a remaining region over the backplane device, the remaining region being non-overlapping with the first region, where each of the first plug vias is conductively coupled to a respective pixel circuit in the remaining region; and a second planar layer on the first planar layer, the second planar layer including a plurality of second light emitting elements on respective first plug vias in a second region over the backplane device, the second region being in the remaining region, where each of the second light emitting elements is operable to emit light with a second color different from the first color and conductively coupled to a respective pixel circuit in the second region through a respective first plug via on the second region to thereby form a plurality of second light emitting sub-pixels.

In some implementations, the second planar layer further includes: a plurality of second plug vias on respective first plug vias in a third region of the backplane device, the third region being in the remaining region and non-overlapping with the second region, where each of the second plug vias is conductively coupled to a respective pixel circuit in the third region through a respective first plug vias. The integrated device further includes a third planar layer on the second planar layer, the third planar layer including a plurality of third light emitting elements in the third region, where each of the third light emitting elements is operable to emit light with a third color different from the first color and the second color, and where each of the third light emitting elements is conductively coupled to a respective pixel circuit in the third region through a respective first plug via and a respective second plug via in the third region to thereby form a plurality of third light emitting sub-pixels.

The plurality of first light emitting sub-pixels, the plurality of second light emitting sub-pixels, and the plurality of third light emitting sub-pixels can form an array of multi-color light emitting pixels. The first, second, and third colors can include red, blue, and green. Each of the multi-color light emitting pixels can include at least one first light emitting element, at least one second light emitting element, and at least one third light emitting element and respective pixel circuits coupled to the first, second, third light emitting elements. The first, second, and third light emitting elements in the multi-color light emitting pixel can be adjacent to each other.

Each of the pixel circuits can be coupled to a respective driver electrode in a top layer of the backplane device. Each of the first plug vias can extend into a respective driver electrode in the remaining region, such that the first plug via is anchored in the respective driver electrode. Each of the second plug vias can extend into a respective first plug vias in the third region, such that the second plug via is anchored in the respective first plug via.

Each of the first light emitting elements can include one or more first quantum well layers between a first top contact electrode and a first bottom contact electrode. The first top contact electrodes of the first light emitting elements can be conductively connected by one or more first conductive lines as one or more first common electrodes, and the first bottom contact electrode of each of the first light emitting elements can be bonded to a respective driver electrode through a respective first intermediate conductive layer, and each of the first light-emitting elements has a size same as the respective first intermediate conductive layer and is self-aligned with the respective first intermediate conductive layer.

Each of the second light emitting elements can include one or more second quantum well layers between a second top contact electrode and a second bottom contact electrode. The second top contact electrodes of the second light emitting elements can be conductively connected by one or more second conductive lines as one or more second common electrodes. The second bottom contact electrode of each of the second light emitting elements can be bonded to a respective first plug via through a respective second intermediate conductive layer, and each of the second light-emitting elements can have a size same as the respective second intermediate conductive layer and be self-aligned with the respective second intermediate conductive layer. Each of the first intermediate conductive layers, the second intermediate conductive layers, the first conductive lines, and the second conductive lines can be made of transparent ITO metal material.

Each of the pixel circuits can be coupled to a respective driver electrode in a top layer of the backplane device. Each of the first plug vias can be on a respective driver electrode in the remaining region and conductively coupled to the respective driver electrode, and each of the first plug vias can have a size on a top surface no larger than a size of a respective second light-emitting elements and a size a bottom surface no larger than the respective driver electrode in the second region.

In some implementations, the integrated device further includes: isolation material between adjacent first light emitting elements, between adjacent first plug vias, between adjacent first emitting elements and first plug vias, and between adjacent second light emitting elements. Each of the pixel circuits can include a non-volatile memory conductively coupled to a corresponding driver electrode in a top layer of the backplane. The backplane can include scanning drivers and data drivers, and each of the non-volatile memories can be coupled to one of the scanning drivers through at least one word line and to one of the data drivers through at least one bit line. Each of the first light emitting elements can be conductively coupled to a respective non-volatile memory in the first region through a corresponding driver electrode in the first region, and each of the second light emitting elements can be conductively coupled to a respective non-volatile memory in the second region through a respective first plug via and a corresponding driver electrode in the second region, the respective first plug via being in touch with the corresponding driver electrode and conductively coupled to the corresponding driver electrode.

The integrated device can further include: a polarizer film on the array of multi-color light-emitting pixels; and a transparent protective layer on the polarizer film. The transparent protective layer can be touch-sensitive, and configured to form, together with one or more first common electrodes of the first light-emitting elements and one or more second common electrodes of the second light-emitting elements, a capacitive touch screen position sensor.

The backplane can include a low temperature polysilicon (LTPS) thin-film transistors (TFT) array control backplane. Each of the pixels can include at least one of: a size less than 10 µm, a respond time faster than 1.0 µs, or an emitting light flux higher than 10 cd/mm^2. The integrated device can include at least one of: a thickness less than 1.0 mm, or a device area larger than 100 mm×100 mm. The device can be flexible, rollable, and foldable. The backplane can be operable to drive the array of multi-color light emitting pixels by pulse-width-modulation (PWM).

Each of the multi-color light-emitting pixels can include at least one first sub-pixel and at least one second sub-pixel having respective first and second light brilliances to emit the first color and the second color. The backplane can be configured to drive the first and second sub-pixels with respective first and second currents, and a current ratio between the first and second currents is based on a ratio between the first and second light brilliances.

A fourth aspect of the present disclosure features an integrated device including: a backplane device including at least one backplane having a plurality of pixel circuits; a first light emitting device arranged in a first planar layer on the backplane device, the first light emitting device including a plurality of first light emitting elements each conductively coupled to respective pixel circuits in the backplane device to form an array of first light emitting pixels, each of the first light emitting elements being operable to emit light with a first wavelength; and a second light emitting device arranged in a second planar layer higher than the first planar layer relative to the backplane device, the second light emitting device including a plurality of second light emitting elements each conductively coupled to respective pixel circuits in the backplane device to form an array of second light emitting pixels, each of the second light emitting element being operable to emit light with a second wavelength different from the first wavelength.

In some implementations, the integrated device further includes: a third light emitting device arranged in a third planar layer higher than the second planar layer relative to the backplane device, the third light emitting device including a plurality of third light emitting elements each conductively coupled to respective pixel circuits in the backplane device to form an array of third light emitting pixels, each of the third light emitting element being operable to emit light with a third wavelength different from the first wavelength and the second wavelength. The array of first light emitting pixels, the array of second light emitting pixels, and the array of third light emitting pixels can form an array of multi-color light emitting pixels.

The second light emitting elements can be vertically higher than the first light emitting elements, such that there is substantially no cross-talk at least in a horizontal direction between the light emitted from the second light emitting elements and the light emitted from the first light emitting elements. The integrated device can be configured to be a three-dimensional (3D) light emitting device with light emitting elements with different wavelengths in planar layers at different heights from the backplane device.

In some implementations, the integrated device further includes: a plurality of plug vias formed in the first planar layer and separated from the first light emitting elements. Each of the plug vias can be arranged between a respective second light emitting element and a respective pixel circuit for the respective second light emitting element and conductively couple the respective second light emitting element to the respective pixel circuit. Each of the plug vias can extend through the first planar layer into the respective pixel circuit in the backplane device and be anchored into the respective pixel circuit, such that the first planar layer is fixed together with the backplane device by the plug vias.

In some implementations, the integrated device further includes: a plurality of plug vias formed in the second planar layer and separated from the second light emitting elements. Each of the plug vias can extend through the second planar layer into the first planar layer and be anchored into the first planar layer, such that the second planar layer is fixed together with the first planar layer by the plug vias, and the plug vias can be anchored into an area of the first planar layer that non-overlaps with an area including the first light emitting elements. In some cases, each of the plug vias extends through the second planar layer and the first planar layer into the backplane device and is anchored into the backplane device, such that the second planar layer and the first planar layer are fixed together with the backplane device by the plug vias.

A fifth aspect of the present disclosure features an integrated device including: a backplane device including at least one backplane having a plurality of pixel circuits; a light emitting device arranged in a planar layer on the backplane device, the light emitting device including a plurality of light emitting elements each conductively coupled to respective pixel circuits in the backplane device to form an array of light emitting pixels; and a plurality of plug vias penetrating through the planar layer into the backplane device such that the plug vias are anchored in the backplane device, such that the light emitting device is fixed onto the backplane device.

A sixth aspect of the present disclosure features a method of fixing thin films, including: arranging a first thin film on top of a second thin film; and forming one or more plug vias across an interface of the first and second thin films, such that the first and second thin films are fixed together through the plug vias.

Forming the plug vias can include: etching to form one or more trenches through the first thin film across the interface into the second thin film; and filling a particular material into the trenches to form the plug vias. Each of the plug vias can have a larger cross-section in the first thin film than in the second thin film. The first and second thin films can be fixed together through the plug vias at a room temperature.

In some cases, arranging the first thin film on top of the second thin film is by low temperature bonding through a glue or intermediate layer. In some cases, arranging the first thin film on top of the second thin film is by surface adhesion without a glue or intermediate layer.

Particular embodiments of the subject matter described in this specification can be implemented so as to realize one or more of the following advantages. A first color light-emitting structure (e.g., an LED structure including multiple epitaxial layers) formed on a first semiconductor substrate (e.g., silicon or sapphire) is first integrated in a first region over a backplane device, e.g., by low temperature bonding. The backplane device includes at least one backplane (e.g., a TFT array control backplane) formed on a second substrate (e.g., polymer and/or glass). The first semiconductor substrate can be peeled off by laser scanning during the integration. After the integration, the first color light-emitting structure is patterned to form an array of first color light-emitting elements (e.g., LEDs) each conductively coupled to respective pixel circuits in the first region to thereby form an array of active-matrix first color light emitting sub-pixels (e.g., LED sub-pixels). A plurality of first plug vias is formed in a remaining region over the backplane device. The remaining region is non-overlapping with the first region. A second color light emitting structure formed on a second semiconductor substrate is integrated in a second region of the backplane device. The second region is in the remaining region. Then the second color light emitting structure is patterned to form an array of second color light-emitting elements each conductively coupled to respective pixel circuits in the second region through respective first plug vias in the second region to thereby form an array of active-matrix second color light emitting sub-pixels. Accordingly, a third color light emitting structure can be formed in a third region over the backplane device and patterned to form an array of third color light-emitting elements each conductively coupled to respective pixel circuits in the third region through respective first and second plug vias in the third region to thereby form an array of active-matrix third color light emitting sub-pixels. The array of active-matrix first, second and third color light emitting sub-pixels form an array of active-matrix multi-color light emitting pixels The first, second, and third colors can include red, blue, and green. A touch-sensitive protective film can be formed on surfaces of the array of active-matrix multi-color LED pixels to form a capacitance sensitive screen.

Before the integration, the different color light-emitting structures, e.g., LEDs can be formed by high-quality deposition at high temperatures, e.g., by Metal-Organic Chemical Vapor Deposition (MOCVD), molecular beam epitaxy (MBE), atomic layer deposition (ALD), physical vapor deposition (PVD), Chemical Vapor Deposition (CVD), or any other deposition methods in a vacuum chamber. The technology can use one or more quantum well layers of Group III-V compounds (e.g., GaN) as light emissive layers, which makes the array of LEDs more energy efficient and more stable than OLED (organic LED) based arrays. The different color LED structures can be formed by standard LED manufacturing technologies, e.g., by including different quantum well layers as active media to emit different color light. For example, by controlling the quantum well layers such as InGaN/GaN, red color LED structure, blue color LED structure, and green color LED structure can be formed individually. Compared to generating different secondary color light by exciting phosphor or quantum dots (QDs) material with primary color LEDs, the different color light directly from the different color LEDs can be more reliable, more stable, more uniform, and more brilliant.

The technology integrates non-volatile memories, e.g., SRAM (static random-access memory), in the TFT backplane device with the LEDs to form active-matrix LED pixels, enabling higher efficiency and faster response time than passive-matrix LED pixels. Moreover, the technology allows integrating non-volatile memories and drivers in the TFT backplane, which greatly simplifies processing, achieves seamless integration and reduces cost. The TFT backplane device can be fabricated by existing TFT technologies, e.g., by an Original Equipment Manufacturer (OEM), which can greatly simplify the manufacture process. A TFT backplane device can include one or more TFT backplanes in a substrate. The TFT backplanes can be low-temperature polysilicon (LTPS) active-matrix (AM) TFT control backplanes. The substrate can be a flexible substrate, e.g., a polyimide (PI) film, or a rigid substrate, e.g., a carrier glass. The TFT backplane device can have a large size, which can be used to form a large display. For example, multiple LED structures formed on multiple wafers can be aligned and bonded to TFT backplanes formed on a polyimide film that is formed on a carrier glass. The wafers for the LED structures can be first removed, e.g., by laser lift-off. Then the LED structures can be patterned to form individual LED arrays to thereby form active-matrix LED sub-pixel arrays. After the integrated multi-color LED pixel arrays are formed, the carrier glass can be removed, e.g., by laser lift-off, to form a flexible device.

In some implementations, TFT backplanes based display systems can have a pixel size less than 10 µm, a respond time faster than 1.0 µs, and/or an emitting light flux higher than 10 cd/mm^2. The display systems can have a thickness less than 1.0 mm, and/or a display area larger than 100 mm×100 mm. The display systems can be flexible, rollable, and foldable. Particularly, the response time of the integrated LED systems can be three orders of magnitude faster than that of OLED systems, and can eliminate flickering issues existing in OLED displays, when pulse-width-modulation (PWM) technology is adopted.

Additionally, before each integration, only a multi-layered light-emitting structure is fabricated, where the multiple layers are continuous films spanning over a top surface of a semiconductor substrate. And the individual light-emitting elements (e.g., LEDs) are formed after the integration by patterning such as etching with a protective mask. Thus, this technology enables alignment of the light-emitting structure and the backplane device, e.g., at a wafer-to-wafer level accuracy. This alignment has a much lower precision requirement than a chip-level alignment or device-level alignment, e.g., for chip-level CMOS/TFT backplane and LEDs bonding (or packaging) where both a CMOS/TFT backplane and LEDs are completely fabricated and functional before bonding. In comparison, this technology does not need the chip-level alignment as only the TFT backplane is completely fabricated and the LEDs are not fully manufactured (or patterned) before the integration. In a particular example, chip-level CMOS/TFT and LEDs bonding requires sub-micron precision wafer alignment, while the wafer-level TFT backplane and LED structure bonding in this technology requires only sub-millimeter precision wafer alignments, at least three orders of magnitudes lower in precision requirement or manufacturing difficulties.

After the integration and before patterning a multi-layered LED structure to form the array of LEDs, a protective mask can be formed to be directly aligned with driver electrodes in the respective pixel circuits of the TFT backplane or indirectly aligned with the driver electrodes through respective plug vias formed on the driver electrodes. As the driver electrodes in the TFT backplane are also formed with a predetermined mask during the TFT backplane manufacturing process, the protective mask for the patterning can be determined based on information of the predetermined mask for the driver electrodes, thus enabling a high alignment accuracy.

The technology can use low temperature bonding a multi-layered LED structure on a backplane device then pattern the LED structure to form an array of LEDs, as described in a U.S. patent application Ser. No. 15/937,735, entitled "INTEGRATED LIGHT-EMITTING PIXEL ARRAYS BASED DEVICES BY BONDING" and filed on Mar. 27, 2018, whose content is hereby incorporated by reference in its entirety. Each multi-layered LED structure can be integrated to a respective area of the backplane device by low temperature bonding through an intermediate conductive layer, e.g., a transparent ITO metal film. The bonding temperature can be no more than 300° C. The intermediate conductive layer formed on a top of an array of LEDs can form a common electrode for the LEDs. The intermediate conductive layer formed on a bottom of an array of LEDs can respectively conductively couple contact electrodes of the LEDs to respective pixel circuits in the backplane device. The intermediate conductive layer can be transparent such that light can be emitted from the LEDs without obstruction.

The technology uses sequentially formed metal plug vias to arrange different color LED arrays on different height planar layers and conductively couple the different color LED arrays to respective pixel circuits in the backplane device. In such a way, the pre-fabricated different color LED structures can be sequentially bonded to the backplane device. Transparent metal material, e.g., ITO, can be filled in the plug vias for interconnects, such that images on a display based on the technology can be viewed from both sides (or directions) of the display.

The metal plug vias can be also over-etched into the backplane device or into a lower level plug vias to form a nailing structure to fix upper-level LED arrays to lower-level LED arrays or to the backplane device. Isolation material formed between the LEDs and the metal plug vias can also help fix the LEDs onto the backplane device.

The technology enables formation of a three-dimensional (3D) LED structure having LEDs with different colors (or wavelengths) in different height planar layers. The different color LEDs in different planar layers are laterally offset from each other such that light emitted from lower LEDs is not obstructed by upper LEDs. As noted above, LEDs in an upper planar layer can be coupled to the backplane through metal plug vias formed in a lower planar layer. In a particular example, an array of red color LEDs is in a first planar layer in a first region over the backplane device, an array of blue color LEDs is in a second planar layer on the first planar layer and in a second region over the backplane device, and an array of green color LEDs in a third planar layer on the second planar layer and in a third region over the backplane device. The first, second, and third region do not overlap with each other. The first, second, and third planar layers are stacked together and have different heights from the backplane device. In such a way, there can be substantially no cross-talk (and/or interference) between the red color light, the blue color light, and the green color light when emitted from the red color LEDs, the blue color LEDs, and the green color LEDs in different planar layers, respectively.

These integrated multi-color LED pixel arrays based devices or systems can be widely used in many applications, including portable electronic and communication devices, such as wearable devices (e.g., eyeglasses, watches, clothes, bracelets, rings), mobile devices, virtual reality (VR)/augmented reality (AR) displays, monitors, televisions (TVs), or any lighting or display applications.

Implementations of the present disclosure also provide a technique for physically bonding thin films without glue or intermediate layers. Traditional bonding is carried out at temperatures higher than 400° C. to allow glue or intermediate layers to chemically reaction in an interface. Here, by forming over-etched plug vias across a bonding interface of two thin films, the two thin films can be mechanically or physically bonded reliably at room temperatures. The two thin films can be made of different materials. The two thin films can be initially arranged together. In some cases, the thin films can be arranged together by low temperature bonding through a glue or intermediate layer. In some cases, a first thin film can be arranged vertically on top of a second thin film by surface adhesion without a glue or intermediate layer, as the surface adhesion can generate a large vertical force. Then trenches can be first formed by etching through the upper first thin film across the bonding interface into the lower second thin film and then a particular material, e.g., metallic or dielectric material, can be filled into the trenches to form the over-etched plug vias. In this way, the over-etched plug vias are anchored in the lower second thin film, like a nailing structure, to fix or integrate the upper first thin film and the lower second thin film together.

The details of one or more disclosed implementations of the subject matter described in this specification are set forth in the accompanying drawings and the description below. Other features, aspects, and advantages will become apparent from the description, the drawings and the claims.

BRIEF DESCRIPTION OF THE DRAWINGS

FIGS. 4A-1 and 4A-2 are perspective views of a multi-layered blue color LED structure formed on a substrate.

FIGS. 4A-3 and 4A-4 are schematic diagrams of example multi-layered blue color LED structures on a sapphire substrate (FIG. 4A-3) and on a silicon substrate (FIG. 4A-4), respectively.

FIG. 4B is a schematic diagram of an example multi-layered green color LED structure on a semiconductor substrate.

FIG. 4C is a schematic diagram of an example multi-layered red color LED structure on a GaP or GaAs substrate.

FIGS. 4D-1 to 4D-3 show schematic diagrams of an example TFT backplane device formed on a polyimide film on a carrier glass.

FIGS. 4E-1 and 4E-2 are perspective view and cross-sectional view of an intermediate metal layer formed on the TFT backplane device of FIGS. 4D-1 and 4D-2.

FIGS. 4F-1 and 4F-2 show schematic diagrams of bonding a red color LED wafer to the TFT backplane device of FIGS. 4D-1 and 4D-2.

FIGS. 4F-3 shows a cross-sectional diagram of a bonded device including a rectangular shape red color LED structure on the TFT backplane device.

FIGS. 4H-1 and 4H-2 are a perspective view and a cross-sectional view of the first bonded device after polishing the multiple red color LED structures to expose contact electrode layers.

FIGS. 4I-1 and 4I-2 are a perspective view and a cross-sectional view of the first bonded device after patterning the multiple red color LED structures to form an array of red color LEDs in a first region over the TFT backplane device.

FIGS. 4J-1 and 4J-2 are a perspective view and a cross-sectional view of the first bonded device after forming multiple first plug vias in a remaining region over the TFT backplane device.

FIGS. 4K-1 and 4K-2 are a perspective view and a cross-sectional view of bonding blue color LED structures onto the first bonded device to form a second bonded device.

FIGS. 4L-1 and 4L-2 are a perspective view and a cross-sectional view of the second bonded device after patterning the blue color LED structures to form an array of blue color LEDs on the first plug vias in a second region over the TFT backplane device.

FIGS. 4M-1 and 4M-2 are a perspective view and a cross-sectional view of the second bonded device after selectively etching a transparent conductive layer to form a common electrode for the red color LEDs.

FIGS. 4N-1 and 4N-2 are a perspective view and a cross-sectional view of the second bonded device after forming multiple second plug vias in a third region over the TFT backplane device.

FIGS. 4O-1 and 4O-2 are a perspective view and a cross-sectional view of bonding green color LED structures onto the second bonded device to form a third bonded device.

FIGS. 4P-1 and 4P-2 are a perspective view and a cross-sectional view of the third bonded device after patterning the green color LED structures to form an array of green color LEDs on the second plug vias in the third region over the TFT backplane device.

FIGS. 4Q-1 and 4Q-2 are a perspective view and a cross-sectional view of the third bonded device after selectively etching a transparent conductive layer to form a common electrode for the blue color LEDs and dielectric planarization.

FIGS. 4R-1 and 4R-2 are a perspective view and a cross-sectional view of the third bonded device after forming a transparent conductive layer.

FIGS. 4S-1 and 4S-2 are a perspective view and a cross-sectional view of the third bonded device after selectively etching the transparent conductive layer to form a common electrode for the green color LEDs.

FIGS. 4T-1 and 4T-2 are a perspective view and a cross-sectional view of the third bonded device after forming a polarizer film and a protective layer to form an integrated device.

FIGS. 4U-1 and 4U-2 are a perspective view and a cross-sectional view of the integrated device after removing a carrier glass substrate of the TFT backplane device.

DETAILED DESCRIPTIONS

The following descriptions are example display devices or systems that include integrated multi-color light-emitting diode (LED) arrays on a backplane device. However, the disclosed implementations can be adopted to any suitable system that needs integration of two separate components, e.g., light-emitting devices including light-emitting elements and backplanes including integrated circuits, e.g., non-volatile memories and/or drivers. For example, the substrates can be made of any suitable material, e.g., rigid substrates such as silicon, silicon oxide, silicon carbide, gallium nitride, sapphire, glass, or spinel, or flexible substrates such as a polyimide film or a thin stainless steel. The light-emitting elements can include any suitable light sources, e.g., semiconductor based LEDs, OLEDs, laser diodes, or lasers such as vertical-cavity surface-emitting laser (VCSELs). The backplane can be a CMOS backplane or a TFT array control backplane.

Figure 1:
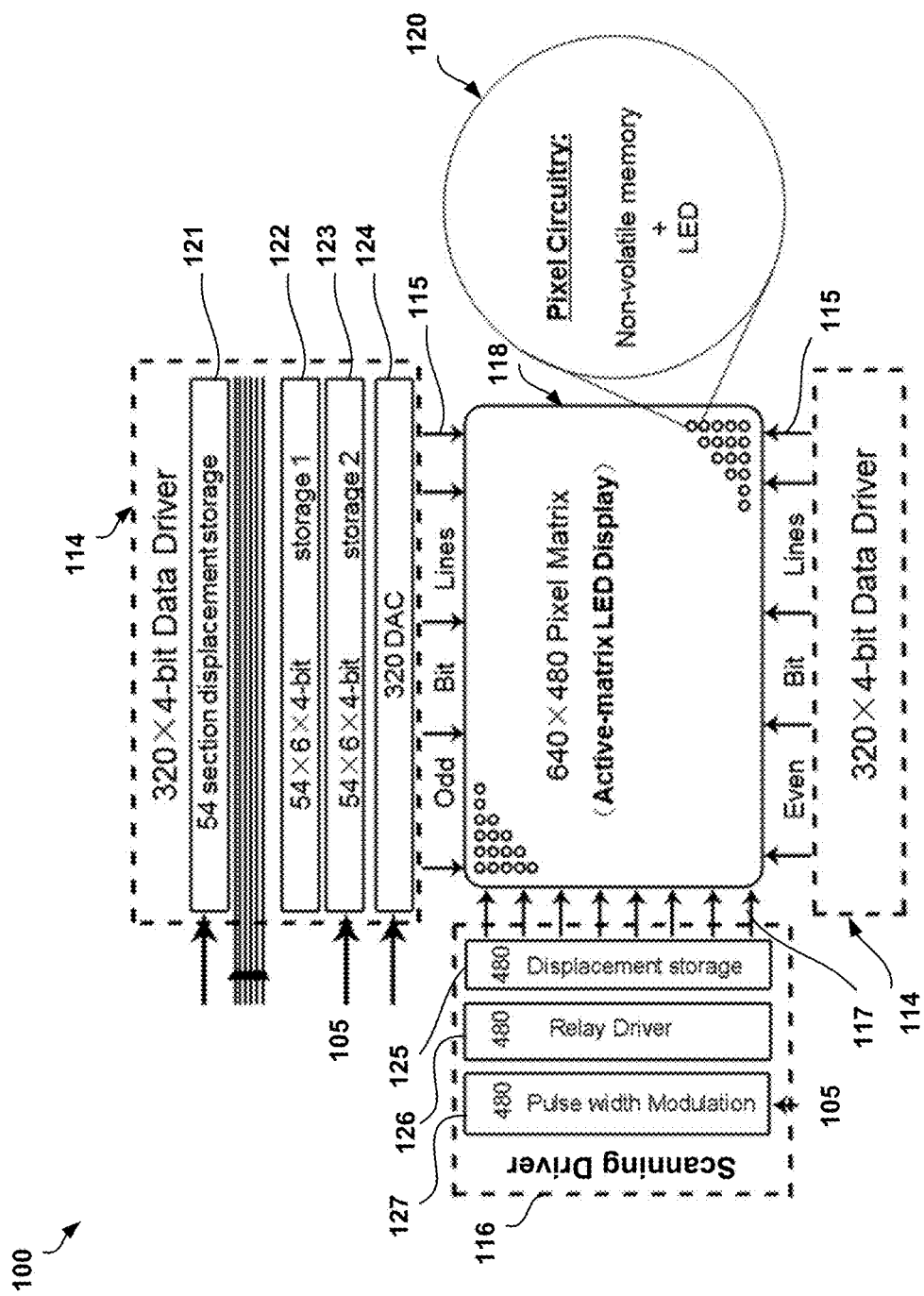
FIG. 1 is a schematic diagram of an example integrated LED pixel array based display system, according to one or more implementations of the present disclosure.
Figure 2B:
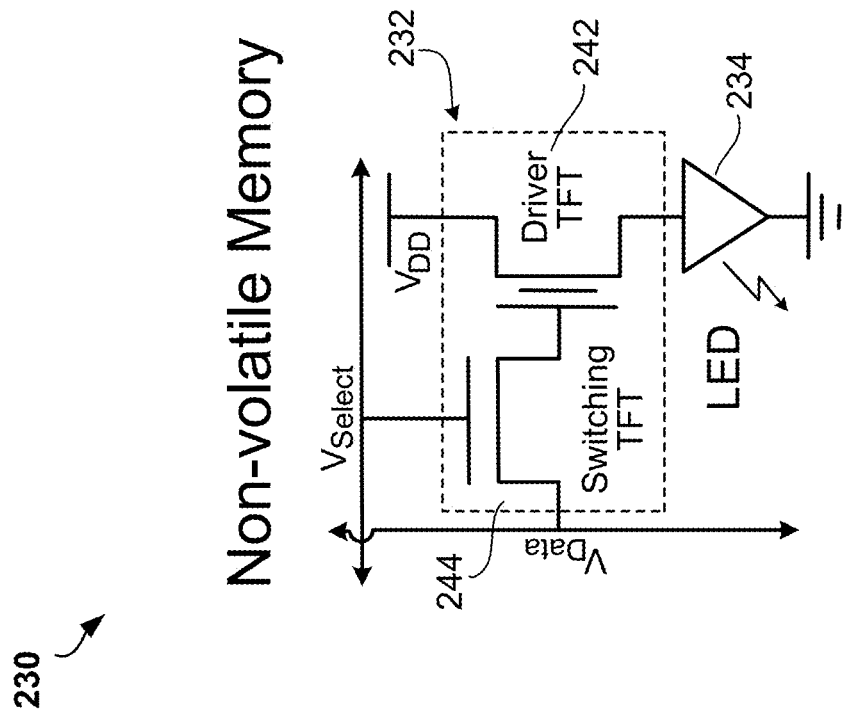
FIGS. 2A-2B are schematic diagrams of example active-matrix LED pixels, according to one or more implementations of the present disclosure.
Figure 2A:
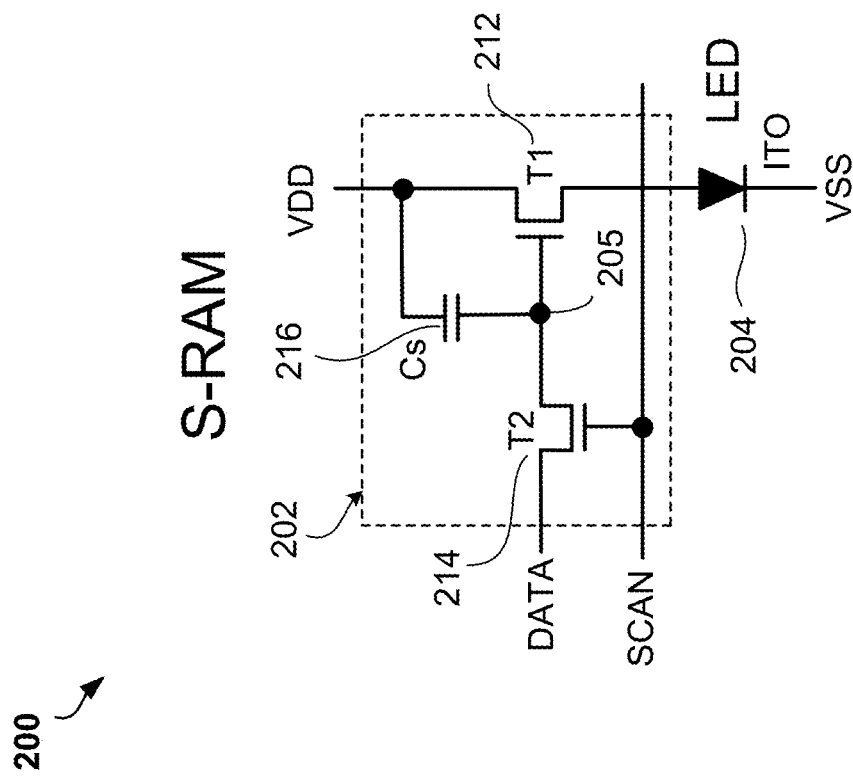

For illustration, in the following, FIG. 1 shows an example integrated LED pixel array based display system; FIGS. 2A-2B show example active-matrix LED pixels; FIGS. 3A-3D show example integrated display systems including different LED arrays in multiple planar layers on a TFT backplane device; FIGS. 4A-1 to 4U-2 show steps of fabricating the display systems of FIGS. 3A-3D; and FIG. 5 shows an example process of fabricating an integrated active-matrix multi-color light emitting pixel display system.

Example Display System

FIG. 1 is a schematic diagram of an example integrated LED pixel array based display system 100, according to one or more implementations of the present disclosure. The display system 100 can be a display module including LED pixel arrays and display drivers such as scanning drivers and data drivers. The display system 100 can be coupled to a control system, e.g., via a wired or wireless connection. The control system can control the display system 100 to operate to display images/videos.

In some implementations, the control system includes one or more processors and/or controllers, e.g., a central processing unit (CPU), a microcontroller unit (MCU), and/or integrated circuits (ICs), e.g., sensors, analog/digital converters (ADCs), digital/analog converters (DACs), amplifiers, drivers, and/or timers. The control system can also include a memory, e.g., a read-only memory (ROM) and/or a random-access memory (RAM). The processors and/or controllers can be coupled to the memory via connections, e.g., internal bus, conductive electrodes, wired connections, or wireless connections. The processors and/or controllers are configured to read data from or store data into the memory. For example, the processors and/or controllers can receive image or video data to be displayed, e.g., from external network or devices, process the image or video data, and/or store the processed image or video data in the memory. The memory can also store instructions to cause the processors and/or controllers to execute operations. Components of the control system can be monolithically manufactured on a semiconductor substrate.

In some implementations, the control system includes one or more digital signal processors including: a digital signal analyzer, a digital processor, an image processor, a volatile memory, a non-volatile memory, and/or a touch screen processor. The control system can also include one or more analog signal processors including a light signal sensor, an electrical signal sensor, a sound signal sensor, a sound signal processor, an analog signal amplifier, an ADC, a DAC, a touch screen signal processor, and/or any other associated electronic components. The analog signal processors are connected to and communicate with the digital signal processors through an ADC and/or a DAC. In operation, the analog signal processors can receive and process image or video signals from external devices or network or from the internal memory. The image or video signals may be analog signals which can be processed and converted into digital signals by an ADC. The digital signals are further processed and analyzed by the digital signal processors. Then the processed digital data can be further transmitted from the digital signal processors to particular data drivers and scanning drivers which then select particular LEDs and control the selected LEDs for display.

The display system 100 includes an active-matrix LED pixel array 118, a data driver 114 and a scanning driver 116. As illustrated in FIG. 1, the LED pixel array 118 is composed of 640 (columns)×480 (rows) pixel matrix arranged in columns and rows, respectively. Each pixel 120 is an active-matrix LED pixel. As illustrated in FIGS. 2A-2B below, an active-matrix LED pixel includes at least one LED and at least one non-volatile memory coupled to the at least one LED. Upon receiving the data instructions from the scanning driver 116 and/or the data driver 114, the non-voltage memory can enable each pixel to operate continuously and independently without waiting for the next instruction coming after a full scan.

The number of LEDs in the LED pixel array 118 is equal to n times of the number of pixels, where n is an integer. If each pixel includes one LED, n is 1; if each pixel includes two LEDs, n is 2; if each pixel includes three LEDs, n is 3; if each pixel includes four LEDs, n is 4.

In some examples, an LED pixel includes a plurality of LEDs, e.g., blue, red, and green LEDs, and a plurality of corresponding non-volatile memories. Each LED is coupled to a respective non-volatile memory. In some examples, the LED pixel includes a white LED. In some examples, the LED pixel includes four LEDs including three LEDs emitting basic light such as red, blue, and green, and a white LED emitting white light. In some examples, one non-volatile memory is coupled to one LED. In some example, one non-volatile memory is coupled to two or more LEDs emitting the same color, and the two or more LEDs can be in two or more different pixels.

In some implementations, the scanning driver 116 includes 480 displacement storages 125, 480 relay drivers 126, and 480 pulse width modulators 127. Each row of LED pixels is coupled to a respective displacement storage 125, a respective relay driver 126, and a respective pulse width modulator 127 through a respective word line (or scanning line) 117. The scanning driver 116 can receive instructions from the control system, e.g., the processors/controllers, and select one or more particular LED pixels based on those instructions.

In some implementations, the data driver 114 is divided into two sub-drivers positioned on top and bottom of the array 118 of LED pixels, respectively. Each sub-driver can be a 320×4-bit data driver and include 54 section displacement storage 121, 54×6×4-bit storages 122 and 123, and/or 320 digital-to-analog converters (DACs) 124. Each sub-driver is coupled to 320 columns of LED pixels through respective column bit lines. Particularly, the top sub-driver is coupled to 320 columns of LED pixels through odd column bit lines, and the bottom sub-driver is coupled to another 320 columns of LED pixels through even column bit lines. An intersection of an individual bit line 115 and an individual word line 117 is coupled to a respective LED pixel. That is, selecting the individual bit line 115 and the individual word line 117 can uniquely select the respective LED pixel. The sub-data drivers can receive instructions and/or data from the control system, e.g., the processors/controllers, and select one or more particular LED pixels with the scanning driver 116 based on the instructions and/or data and transmit data to the selected particular LED pixels through respective bit lines 115.

Figure 3A:
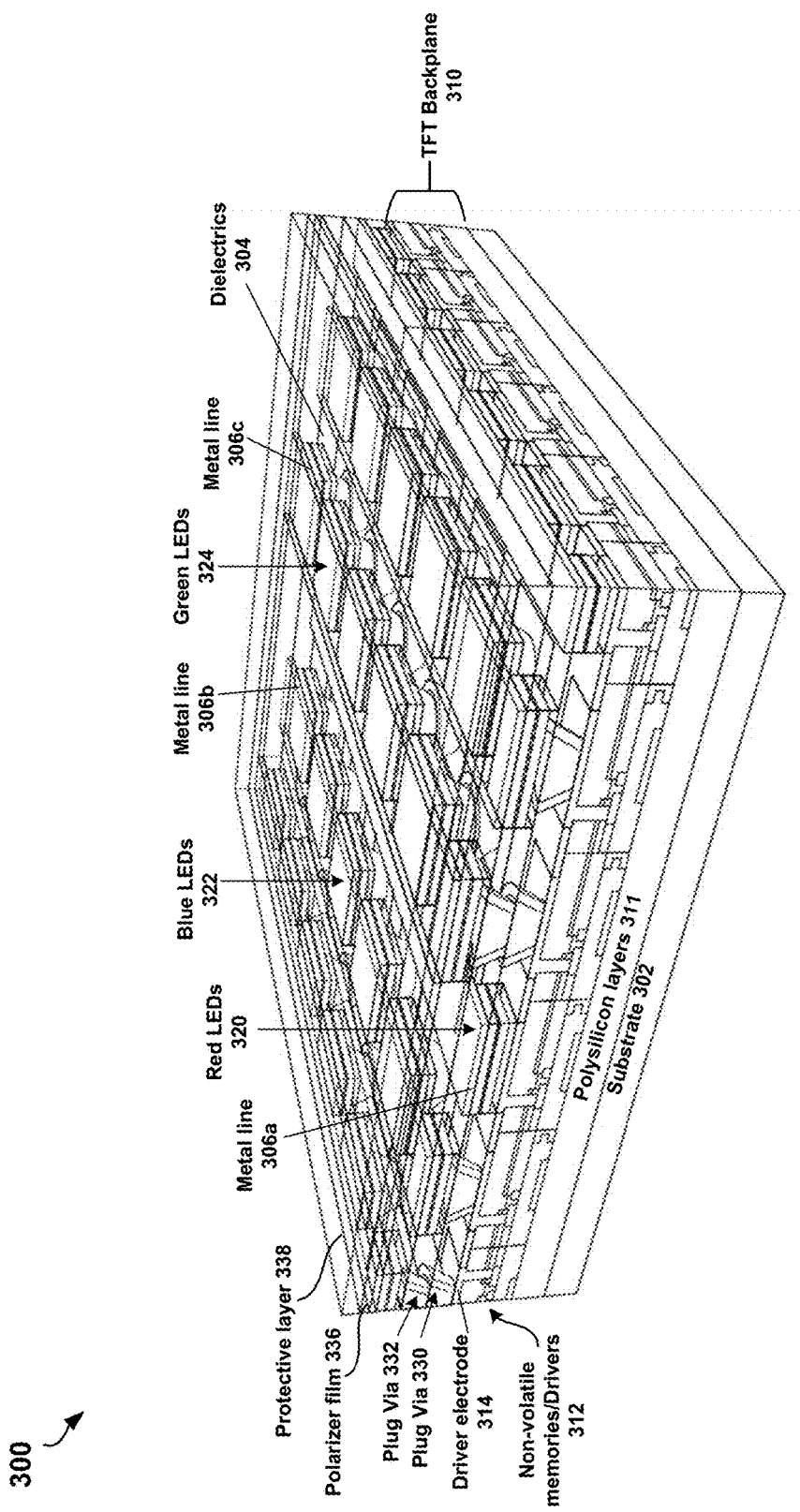
FIG. 3A is a perspective view of an example integrated display system with multi-color LED pixel arrays fabricated on a TFT array control backplane device through metal plug vias, according to one or more implementations of the present disclosure.
Figure 3B:
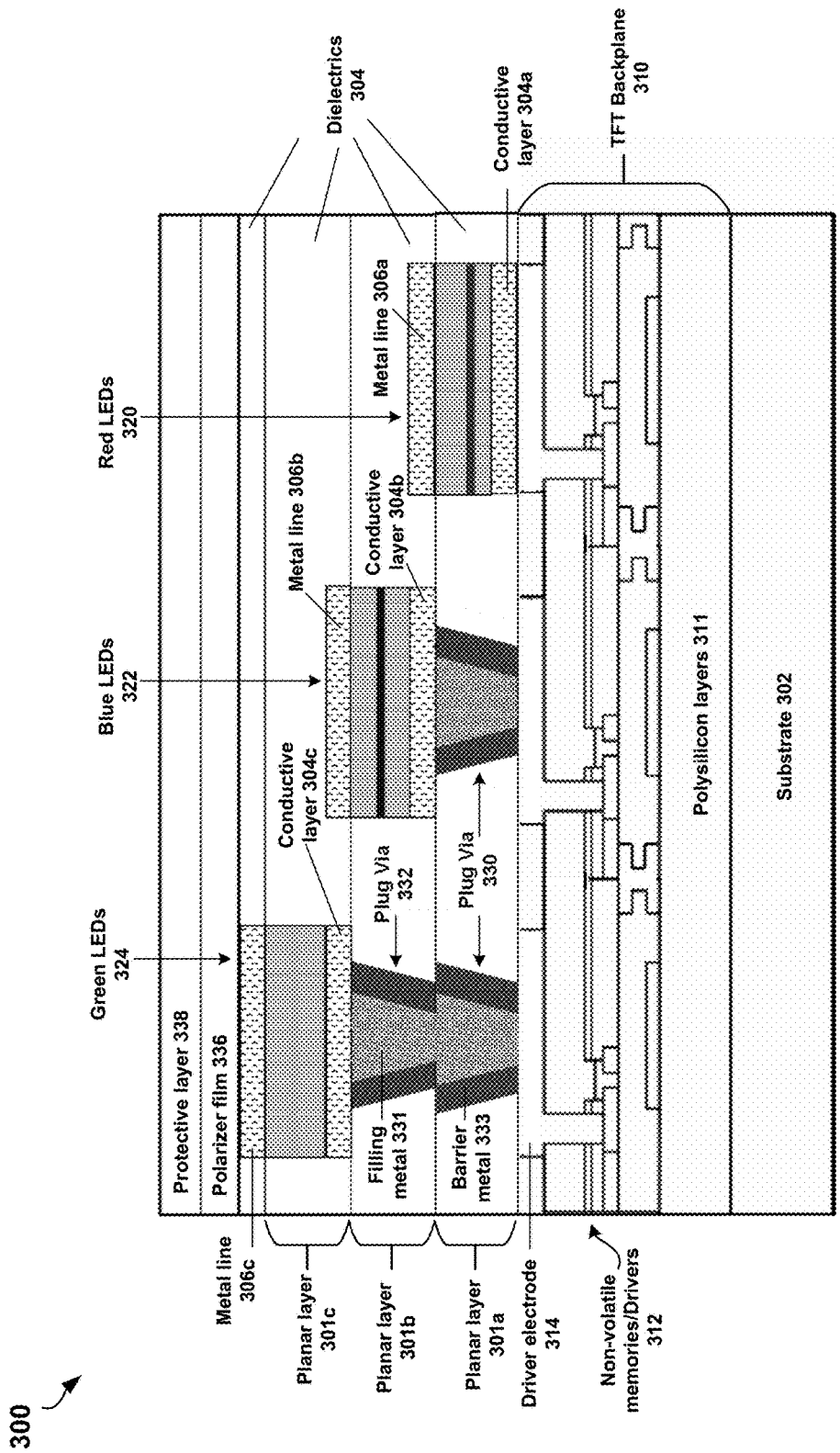
FIG. 3B is a cross-sectional view of the integrated display system of FIG. 3A.
Figures 3, 4, 4A:
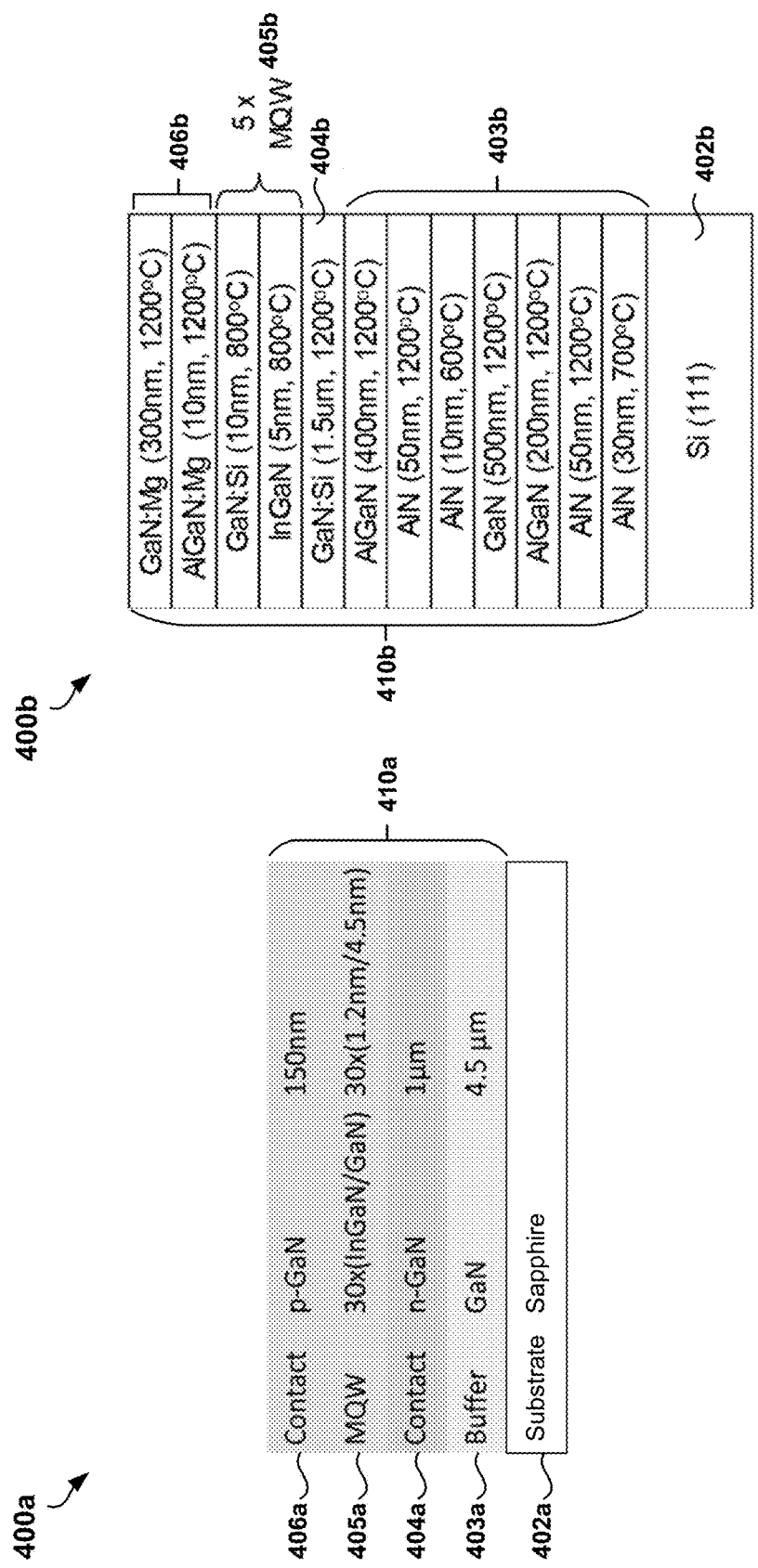

In some implementations, the active-matrix LED pixel array 118 is covered by a protective layer, as illustrated in FIGS. 3A and 3B below. The protective layer can be transparent. In some examples, the protective layer is made of glass coated with a conductive material, such as indium tin oxide (ITO). The protective layer defines an array of spots corresponding to the array of LEDs. Each spot covers an LED underneath and is coupled to a corresponding non-volatile memory coupled to the LED. The spot and the surface of the LED may form a capacitor, and/or one or more additional capacitors may be formed between the spot and the LED. When the spot is touched, e.g., by a fingertip on top of the spot or moving towards the spot, a capacitance of the capacitors can change. The capacitance change can be detected by a touch screen detector/processor in the control system through the non-volatile memory and a corresponding data driver 114/scanning driver 116 coupled to the non-volatile memory. Thus, the protective layer, the LED array, and the corresponding non-volatile memories can form a touch screen position sensor, which, together with the touch screen detector/processor in the control system, enables the LED pixel display system 100 to function as a touch screen display. Additional implementations of the touch screen sensor on the LEDs are also possible, e.g., using other technologies like resistive sensing, surface acoustic wave, infrared grid, infrared acrylic projection acoustic pulse recognition, or dispersive signal technology.

As discussed with further details below, the display system 100 can be formed by integrating a multi-layered LED structure formed on a semiconductor substrate and a backplane device and then processing the integrated LED and backplane device. The data drivers, the scanning drivers, the non-volatile memories, and the connection lines including the bit lines and the word lines can be integrated in the backplane device. An LED array can be formed by patterning the multi-layered LED structure, and the LED array can be conductively coupled to the non-volatile memories in the backplane device to form an array of active-matrix LED pixels. Different color LED structures can be sequentially integrated in different height planar layers in different regions over the backplane device to form different color LED arrays at different heights. Upper-level LEDs can be conductively coupled to the non-volatile memories through plug vias formed in planar layers between the LEDs and the backplane device. Thus, different color LED arrays can be coupled to respective non-volatile memories to form different color LED sub-pixel arrays to thereby form an array of active-matrix multi-color LED pixels. The backplane device can be configured to drive, e.g., transmit display data to, the active-matrix multi-color display pixel array by pulse-width-modulation (PWM) technology. Due to fast response time (e.g., nanoseconds) of the LEDs, flickering issues can be eliminated and the display system 100 can be flicker free.

Example Active Matrix LED Pixels

FIG. 2A shows an example active-matrix LED pixel 200 with non-volatile memory. The LED pixel 200 includes an S-RAM (static-random access memory) 202 and an LED 204. The S-RAM 202 includes a driver transistor (T1) 212, a switching transistor (T2) 214, and a storage capacitor (Cs) 216. During display operation, a word line (scanning line or select line) can be pulled high to allow a voltage on a bit line to propagate through the switching transistor 214 to a storage node 205, charging the storage capacitor 216 and setting a high voltage on a gate of the driver transistor 212. This allows a current to pass through the driver transistor 212 and the LED 204 is consequently lighted.

FIG. 2B shows another example active-matrix LED pixel 230 with non-volatile memory 232 and an LED 234. The non-volatile memory 232 includes a driver transistor 242 and a switching transistor 244, that can be thin-film transistors (TFTs). In some implementations, different from the LED pixel 200 in FIG. 2A, the brightness of the LED 234 is not controlled by varying $V_{Data}$ applied to a gate of the driver transistor 242 through the switching transistor 244. Instead, a constant $V_{Data}$ is applied to the gate of the driver transistor 242. The current through the driver transistor that causes the LED 234 to illuminate is controlled by changing a threshold voltage $V_T$ of the driver transistor 242, e.g., through programming. If low brightness is desired, the driver transistor 242 can be set to a high threshold voltage by programming with a large positive gate pulse. If high brightness is desired, the driver transistor 242 can be set to a low threshold voltage by programming with a small positive gate pulse, or not programming at all, the leaving it with the initial threshold voltage. Thus, an image or video can be displayed by controlling the brightness or on/off status of the LEDs of an array.

Figure 2C:
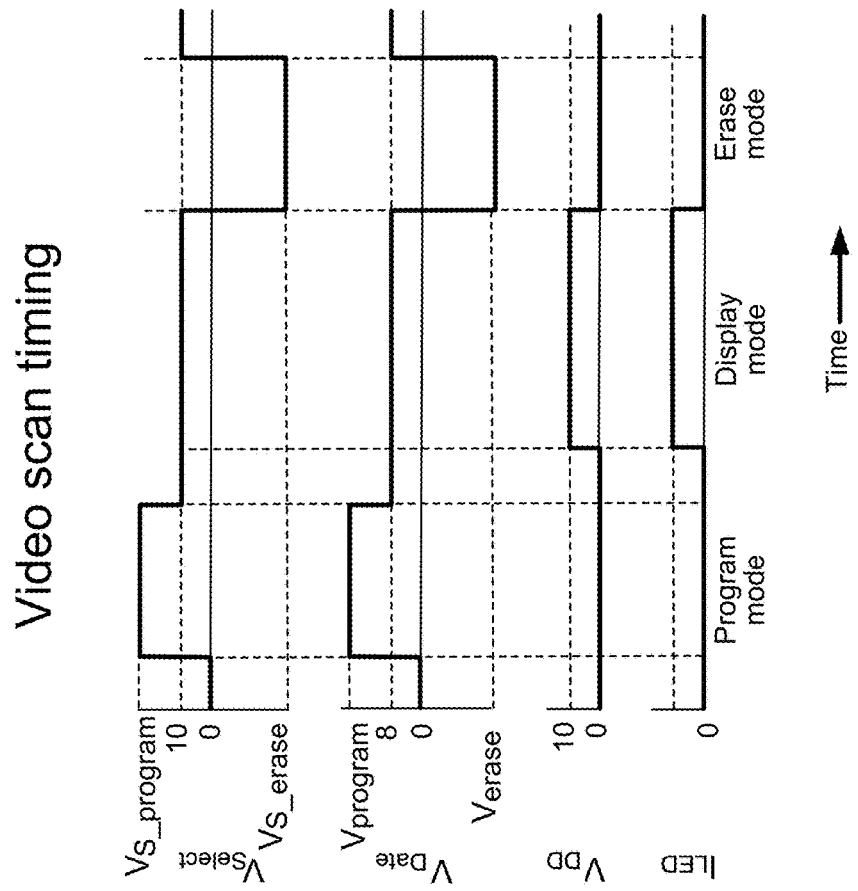
FIG. 2C shows an example timing diagram using active-matrix LED pixels for a video display, according to one or more implementations of the present disclosure.

FIG. 2C shows an example video scan timing 250 of a display using the active-matrix LED pixel 230 of FIG. 2B. After programming (i.e., programming mode), the display is activated by setting a supply voltage $V_{DD}$ to 10 V, $V_{Data}$ to 8 V on all the bit lines, and $V_{Select}$ to 10 V on all the word lines (select lines). The LED current and therefore brightness of the pixel 230 is determined by the programmed threshold voltage of the driver transistor 242. Both $V_{Data}$ and $V_{Select}$ are DC voltages in the display mode because a pixel refresh is not necessary to maintain a static image. The image information remains stored in the threshold voltage of the driver transistor 242 even if the power is turned off. To change the programmed image, the pixels can be first erased and then reprogrammed. Erase mode in FIG. 2C is identical to the program operation. The only difference is that the applied voltage pulse has a larger negative amplitude, instead of a positive one. This negative voltage forces the trapped electrons in the driver transistor 242 to tunnel back out, causing the threshold voltage to shift towards its original un-programmed value. For example, to erase a single pixel in the active matrix (instead of an entire column), all other select lines can be held at −30 V to prevent the erase pulse from propagating to the undesired pixel drivers.

Example Systems and Fabricating Processes

Figure 3C:
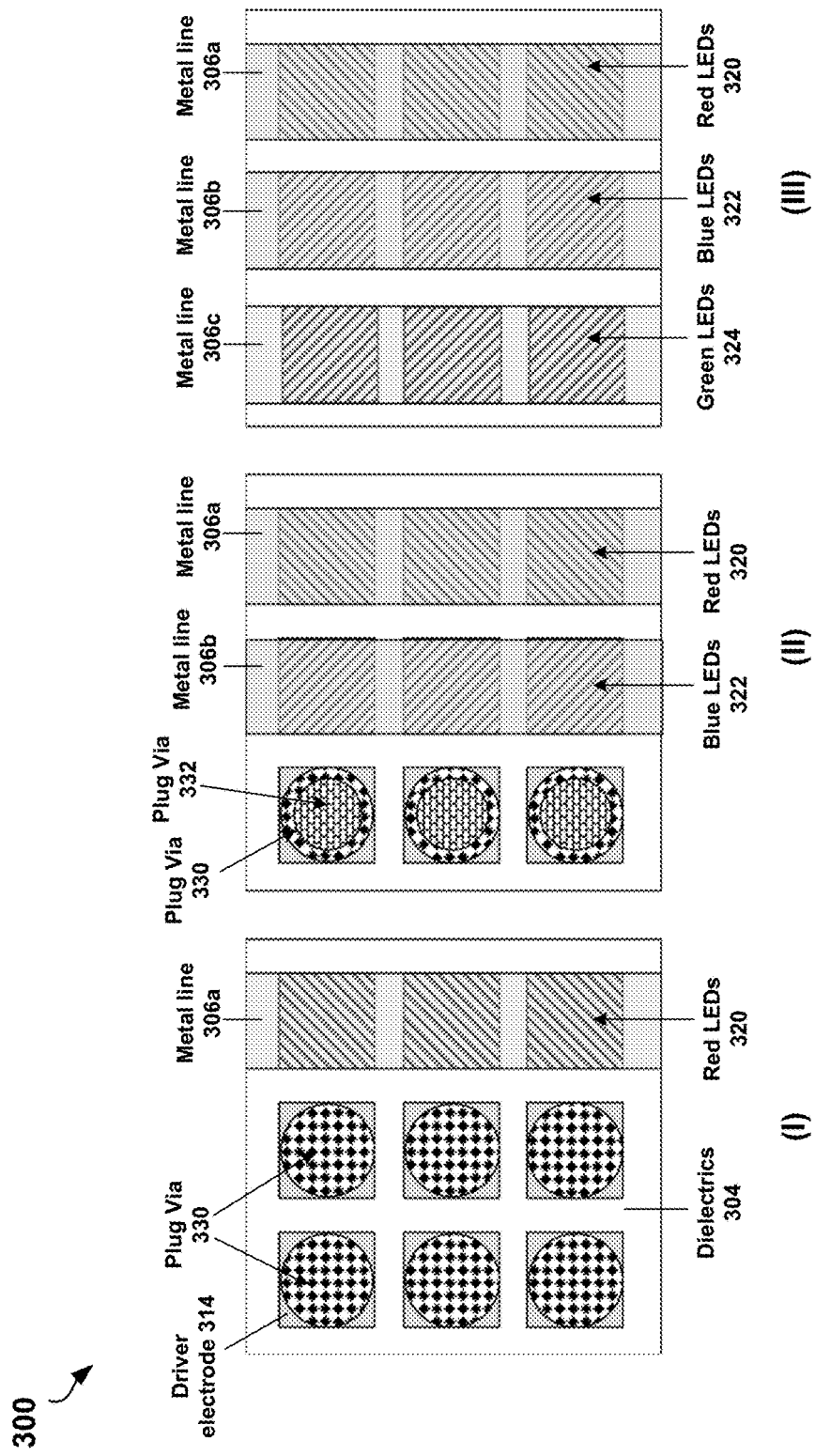
FIG. 3C is another cross-sectional view of the integrated display system of FIG. 3A.

FIGS. 3A-3C show an example integrated display system 300. The integrated display system 300 can be the display system 100 of FIG. 1. This integrated display system 300 can be formed according to steps described with further details in FIGS. 4A-1 to 4U-2.

As illustrated in FIGS. 3A-3B, the integrated display system 300 includes a TFT backplane 310 on a substrate 302. The substrate 302 can be a rigid substrate (e.g., a carrier glass or a semiconductor substrate) or a flexible substrate (e.g., a polyimide film or a stainless steel). The TFT backplane 310 can be formed in a TFT backplane device. The TFT backplane device can include one or more TFT backplanes and can be manufactured by existing TFT manufacturing technologies, e.g., by OEMs. Note that, the integrated display system 300 can have a large substrate 302, e.g., 100 mm×100 mm, to accommodate a number of TFT backplanes which can be conductively interconnected, e.g., through metal lines.

The TFT backplane 310 can be formed based on a silicon substrate, e.g., amorphous silicon (a-Si) or polysilicon such as low temperature polysilicon (LTPS). For example, the TFT backplane 310 can be a low temperature polysilicon (LTPS) active-matrix (AM) thin-film transistors (TFT) array control backplane. The LTPS substrate can be achieved by ultraviolet (UV) excimer laser annealing of a-Si to form LTPS. The TFT backplane 310 can be fabricated by depositing polysilicon layers on a substrate and forming integrated circuits (e.g., non-volatile memories and/or drivers) on the polysilicon layers.

The TFT backplane 310 includes integrated circuits having non-volatile memories and/or display drivers 312 formed on one or more polysilicon layers 311. In some implementations, the TFT backplane 310 includes a number of pixel circuits. Each pixel circuit includes a non-volatile memory that has at least one transistor conductively coupled to a corresponding driver electrode 314 in a top layer of the TFT backplane 310. The display drivers include scanning drivers and data drivers and each of the non-volatile memories is coupled to one of the scanning drivers through at least one word line and to one of the data drivers through at least one bit line.

The integrated display system 300 can be a three-dimensional (3D) LED structure having LEDs with different colors (or wavelengths) in different height planar layers. The different color LEDs in different planar layers are laterally offset with each other such that light emitted from lower LEDs is not obstructed by upper LEDs. LEDs in an upper-level planar layer can be coupled to the backplane through conductive plug vias formed in a lower-level planar layer. In such a way, there can be substantially no cross-talk (and/or interference), at least in a horizontal direction, among the different color light emitted from the different color LEDs in different height planar layers. Different colors LEDs in different planar layers can be in a different order.

Each LED includes a number of epitaxially grown semiconductor layers having multiple quantum well (MQW) semiconductor layers as an active medium between two contact electrodes. The MQW layers can include group III-V nitrides (e.g., GaN) and each of the LEDs is operable to emit light with a particular color, e.g., blue, green, or red. The emitted wavelength of the LEDs is dependent on the MQW materials' band gap and can be controlled by a thickness of InGaN layer (e.g., in a range of 2-3 nm) and GaN/InN ratio, from near ultraviolet for 0.02In/0.98Ga through 390 nm for 0.1In/0.9Ga, violet-blue 420 nm for 0.2In/0.8Ga, blue 440 nm for 0.3In/0.7Ga, green 532 nm for 0.5In/0.5Ga, to red for higher ratios In/Ga. The LEDs can also be ultraviolet (UV) or deep UV LEDs with an emitted wavelength within a range from 100 nm to 450 nm. The MQW material can also include AlGaN, InAlGaN, or AlN.

For illustration purposes, the integrated display system 300 includes red LEDs 320, blue LEDs 322, and green LEDs 324 in sequential planar layers on the TFT backplane 310. As illustrated in FIGS. 3A-3B, arrays of red LEDs 320 are arranged in a first planar layer 301a, with each red LED 320 positioned in a first region over the TFT backplane 310. Each red LED 320 is conductively coupled to a respective non-volatile memory in the TFT backplane 310 through a respective driver electrode 314 in the first region over the TFT backplane 310. Each red LED 320 can have a same area size as the respective driver electrode 314. Note that the term "region" herein can represent one or more vertical volumes over a backplane. The region can be provided by a collection of individual non-contiguous volumes.

Figures 1, 4D:
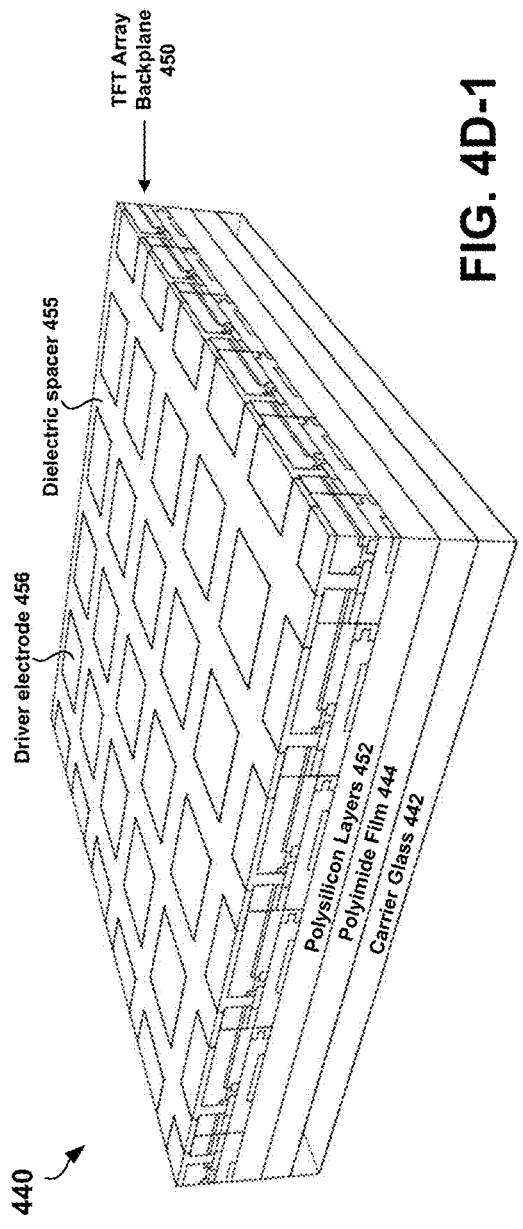
Figures 2, 4D:
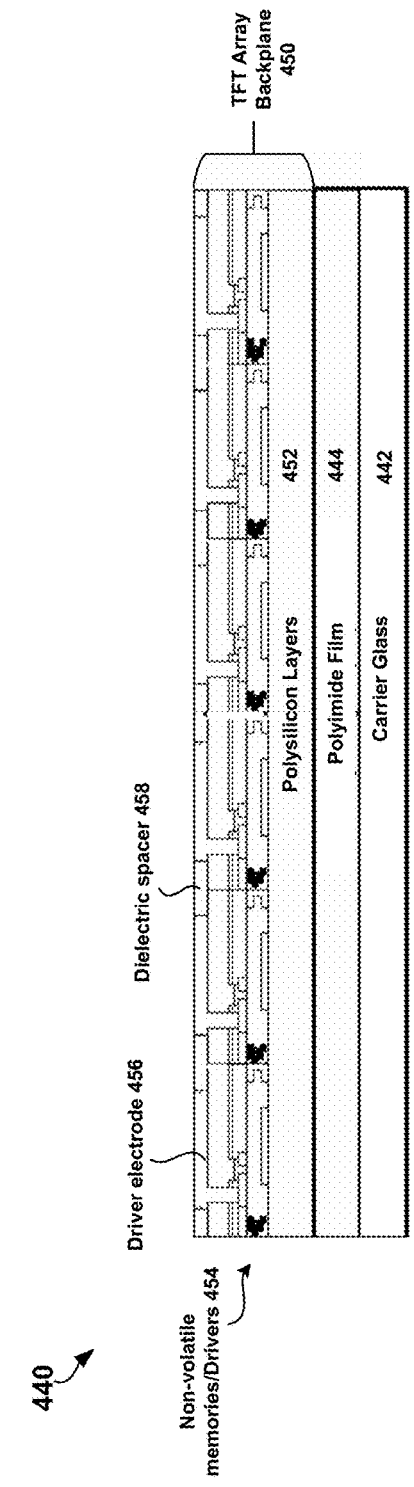
Figures 3, 4D:
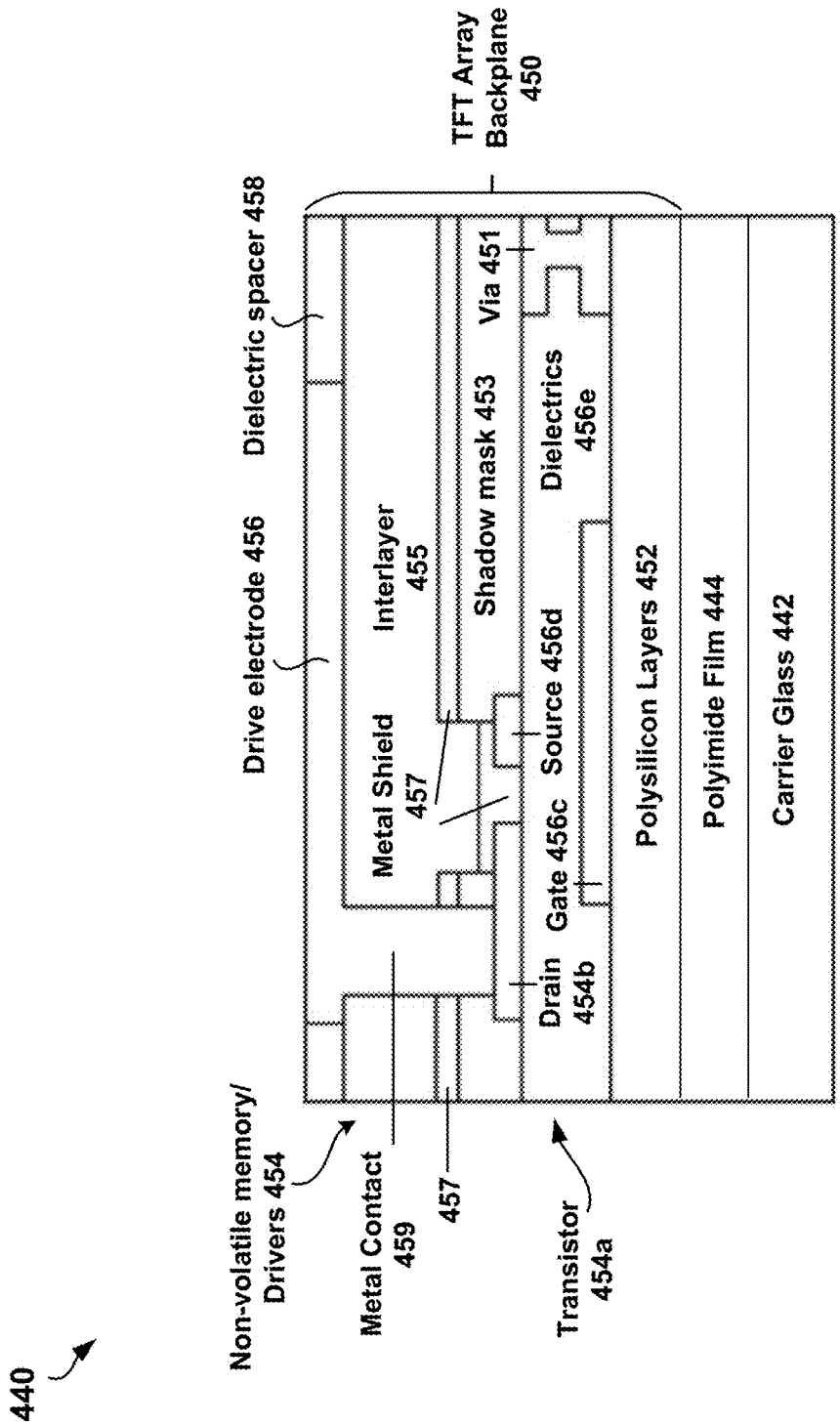
Figures 1, 4E:
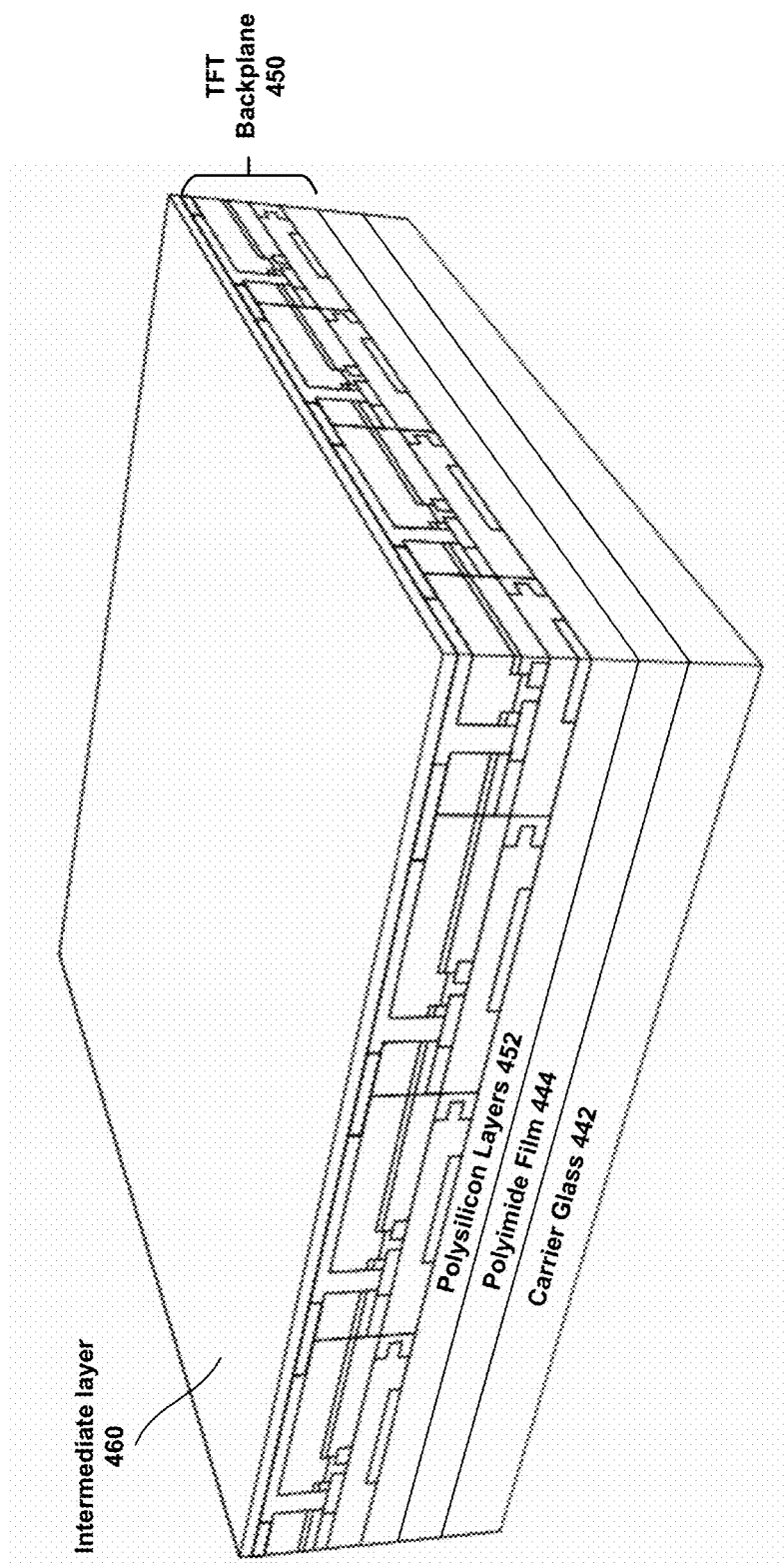
Figures 2, 4E:
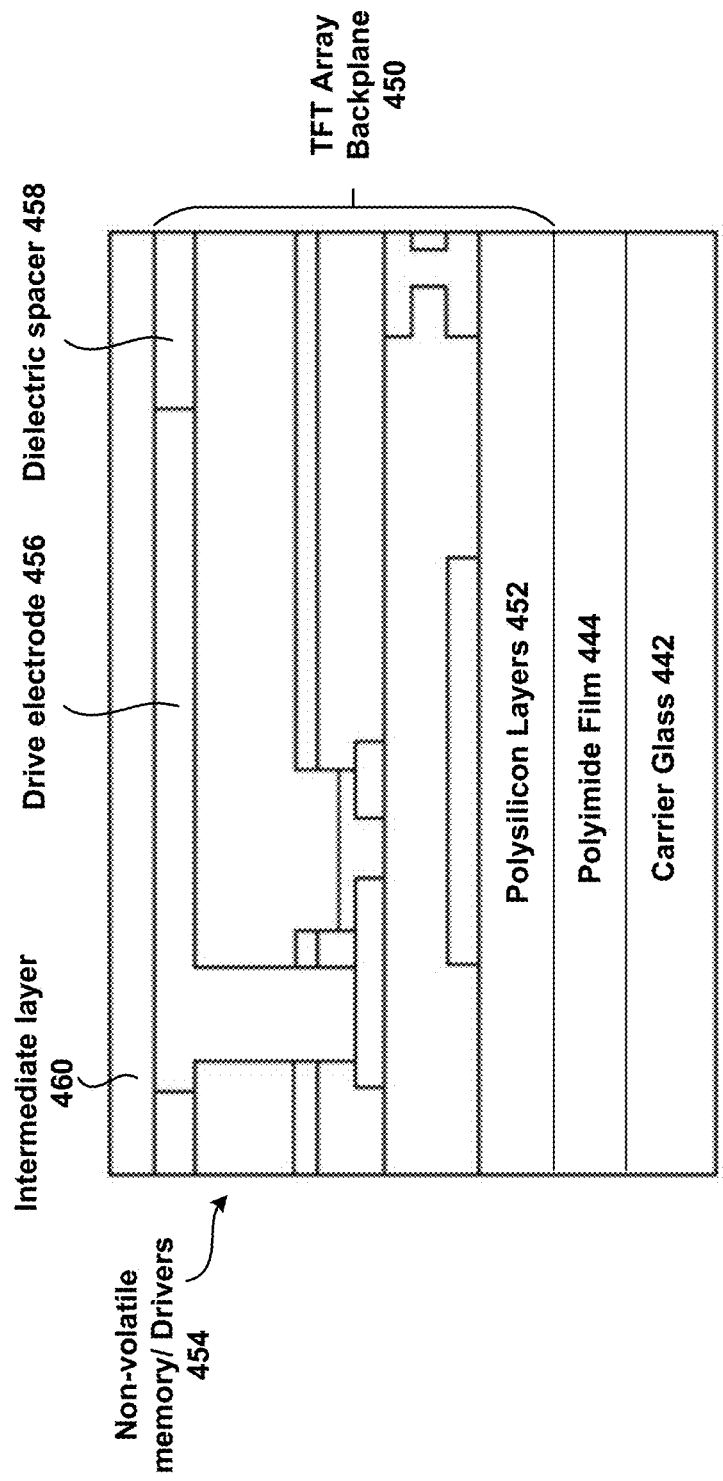
Figures 3, 4F:
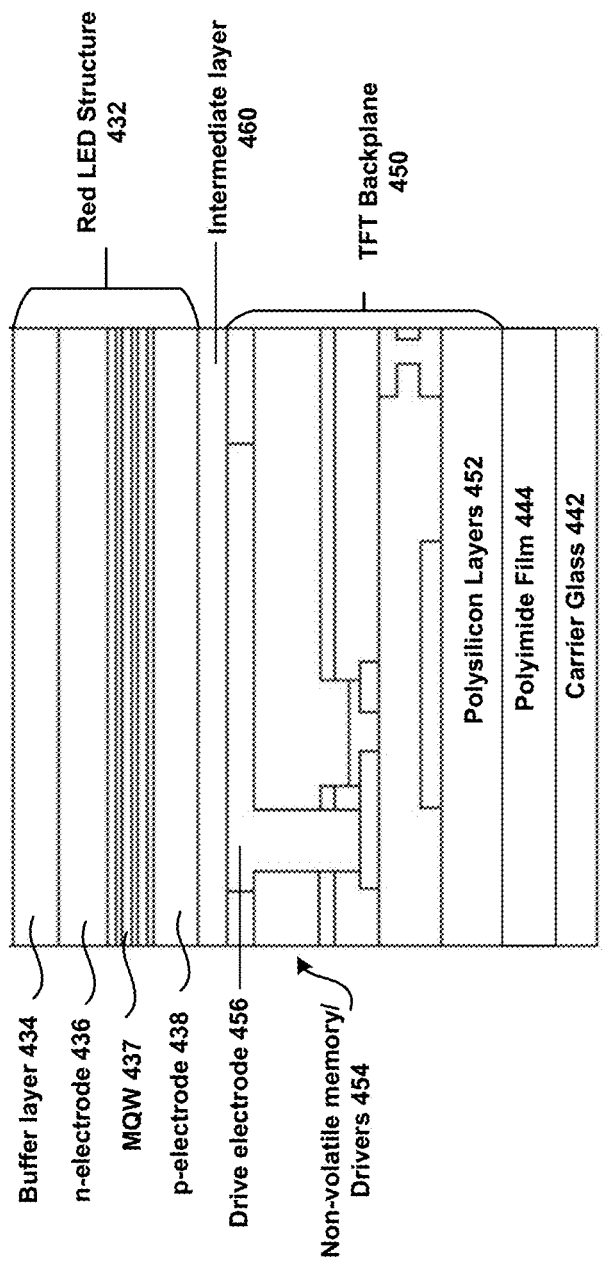
Figure 4G:
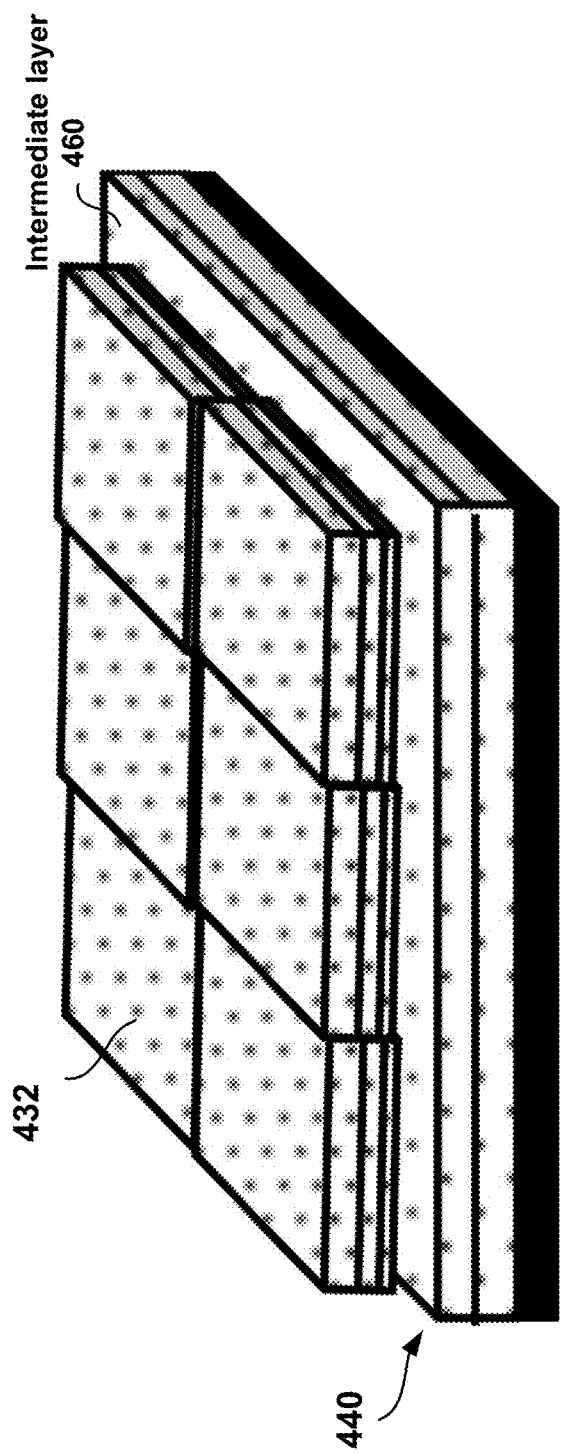
FIG. 4G shows a schematic diagram of bonding multiple red color LED wafers on the TFT backplane device to form a first bonded device including multiple adjacent rectangular shape red color LED structures on the TFT backplane device.
Figures 1, 4H:
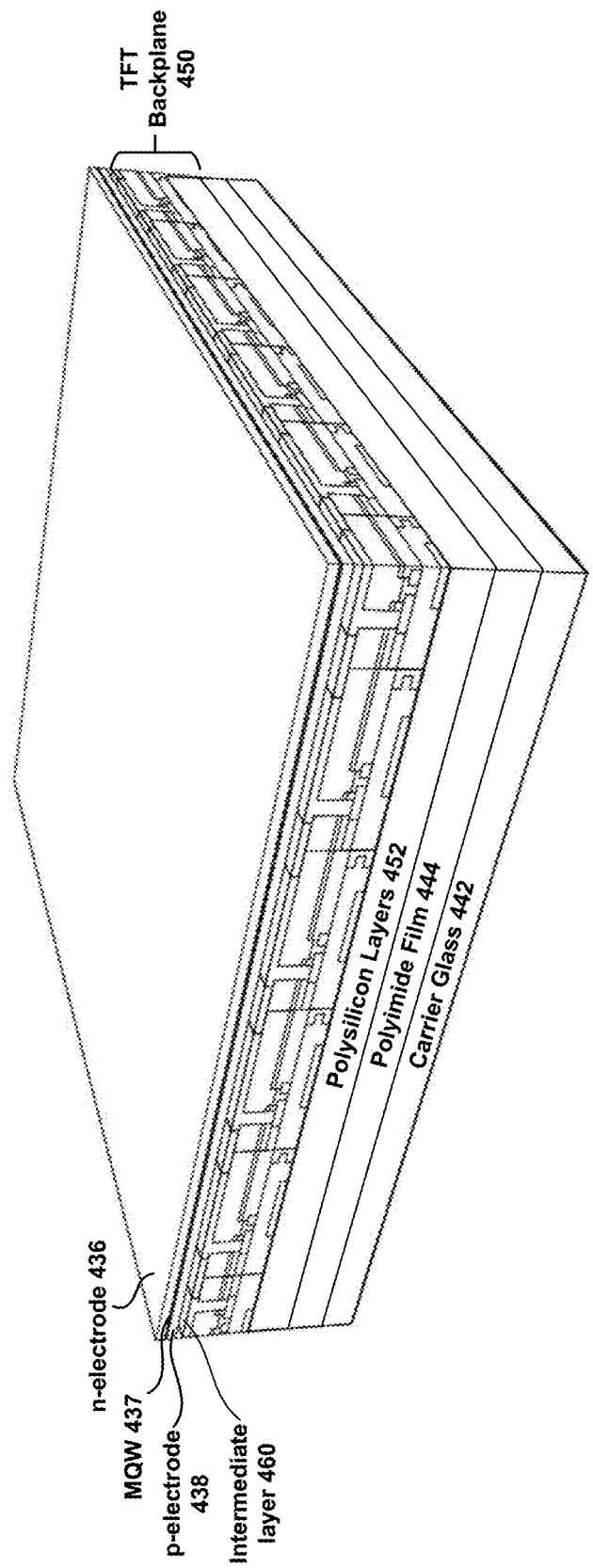
Figures 2, 4H:
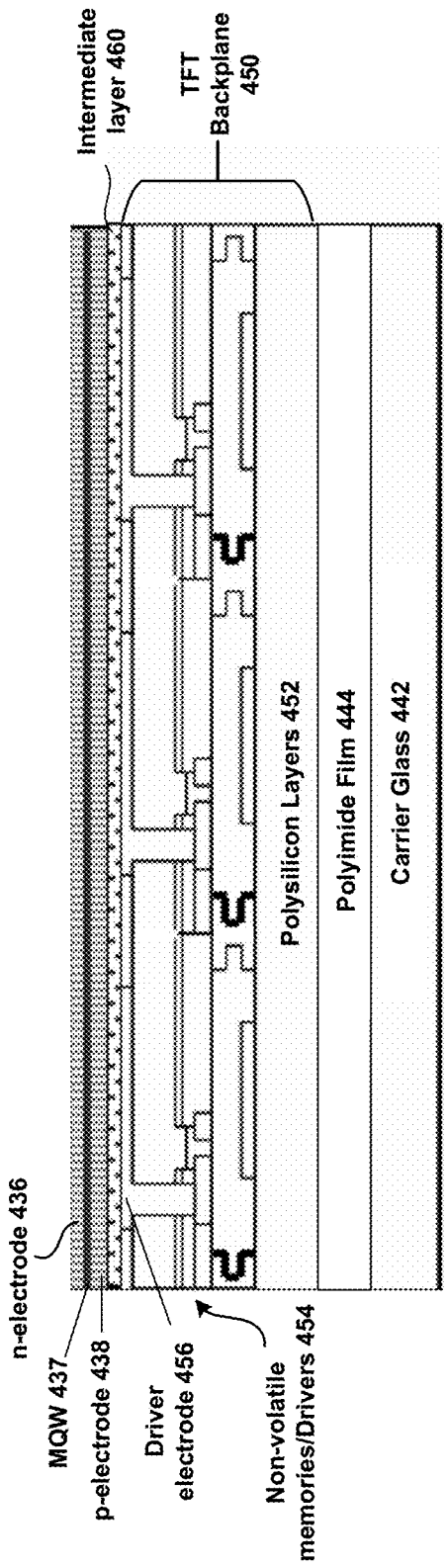
Figures 1, 4I:
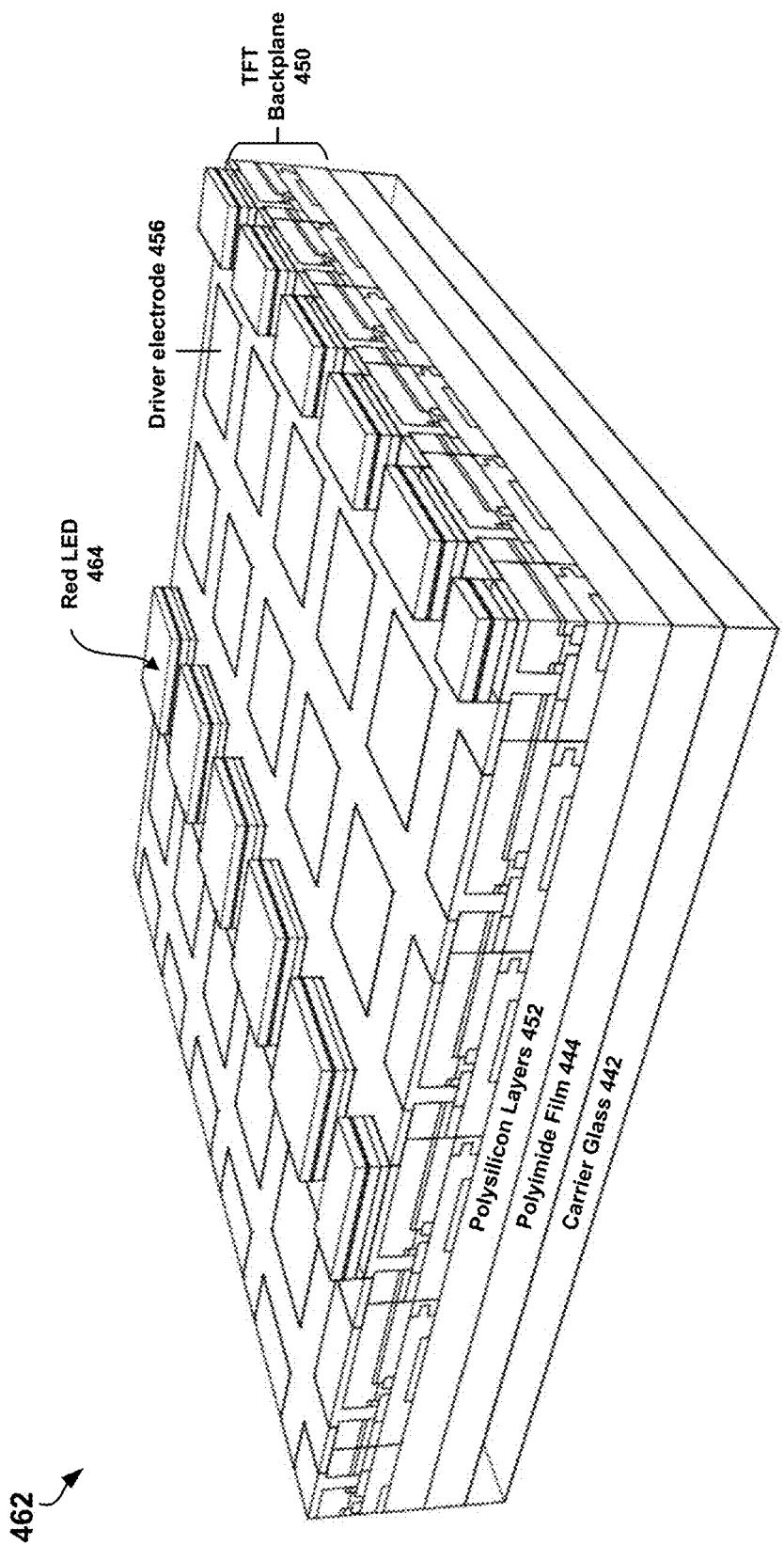
Figures 2, 4I:
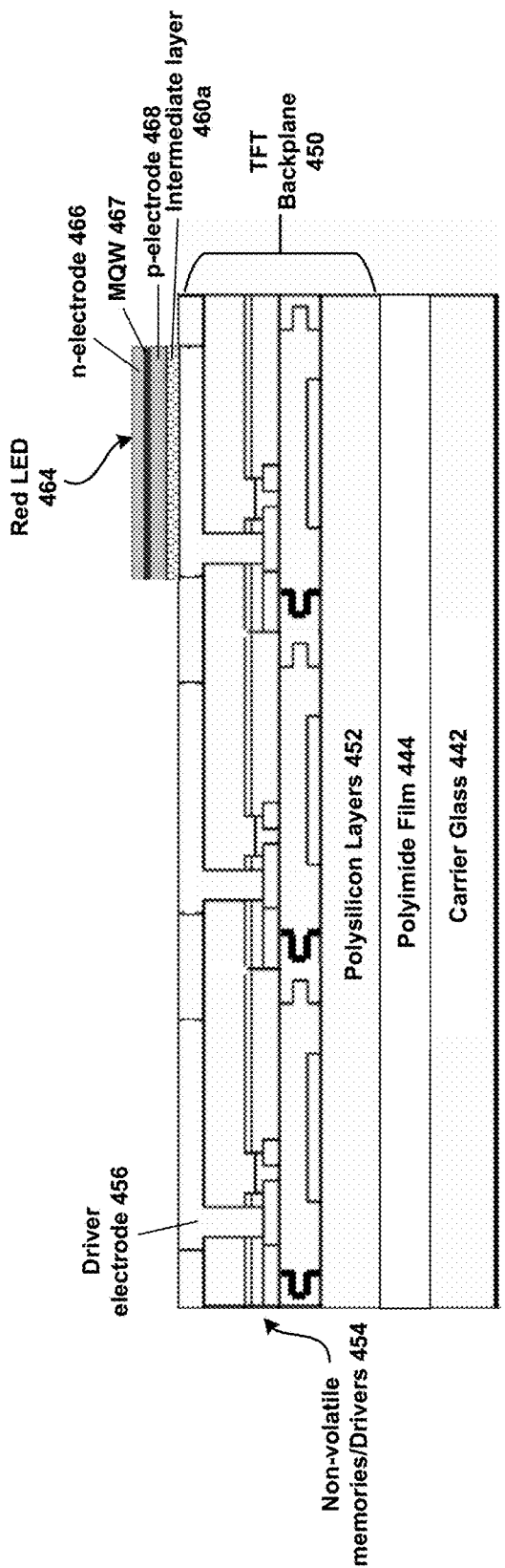
Figure 5:
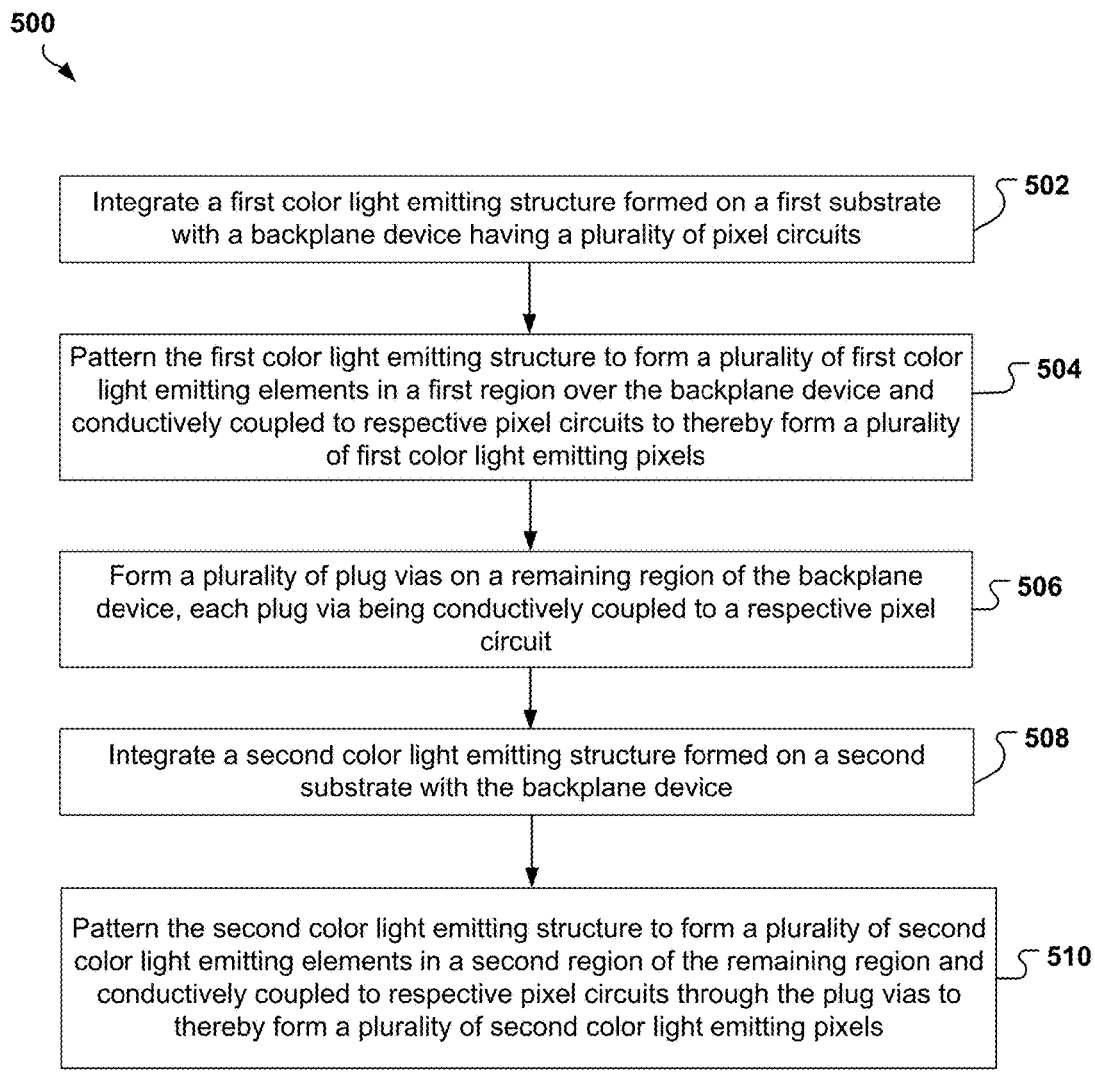
FIG. 5 is a flow diagram of an example process of forming an integrated active-matrix multi-color light-emitting pixel display system by bonding.

As shown in FIGS. 4C and 4I-2 below, each red LED 320 can include a first contact electrode p-electrode 438, e.g., p-InGaP, a second contact electrode n-electrode 436, e.g., n-InGaP, and multiple quantum well (MQW) semiconductor layers 437 between the p-electrode 438 and the n-electrode 436. The MQW layers can include group III-V compounds and each of the red LEDs 320 is operable to emit light with a red color. The MQW layers can include multiple pairs of InN/GaN layers. Each red LEDs 320 can be bonded to the TFT backplane 310 by bonding the p-electrode onto the respective driver electrode 314 through an intermediate conductive layer 304a (see FIG. 3B), e.g., an ITO metal layer. One or more metal lines 306a form on top of the n-electrodes of the red LEDs 320 and conductively connect the n-electrodes together to form one or more common electrodes for the red LEDs 320.

Arrays of first plug vias 330 can be formed in the first planar layer 301a, with each first plug via 330 positioned in a remaining region over the TFT backplane 310. The remaining region is different from, i.e., non-overlapping with, the first region. Each first plug via 330 is on top of a respective driver electrode 314 in the remaining region and conductively coupled to the respective driver electrode 314. Each plug via 330 extends through isolation material (e.g., dielectrics 304) in the first planar layer onto the respective driver electrode 314. Each plug via 330 can be a trench filled with a conductive material such as filling metal 331. Barrier metal layer 333 can be deposited on inner surfaces of the trenches before filling the trenches with the filling metal 331. For example, the filling metal can be copper (Cu) or aluminum (Al) and the barrier metal layer 331 can be made of Platinum (Pt) or Tantalum (Ta). In some examples, the filling metal 331 is transparent, e.g., ITO. As ITO is not chemically active as Cu or Al, a plug via 330 can include no barrier metal layer like Pt or Ta film. The plug via 330 can have a cross section gradually decreasing from top to bottom.

Arrays of blue LEDs 322 are arranged in a second planar layer 301b, with each blue LED 322 positioned in a second region over the TFT backplane 310. The second region is in the remaining region and non-overlapping with the first region. The second region can be adjacent to the first region such that, from a top view, the red LEDs 320 are adjacent to the blue LEDs 322. The second planar layer 301b is on, e.g., directly contacting, the first planar layer 301a and vertically higher than the first planar layer 301a relative to the TFT backplane 310. Each blue LED 322 is formed on a respective first plug via 330.

Each blue LED 322 is conductively coupled to a respective non-volatile memory in the TFT backplane 310 through the respective first plug via 330 and a respective driver electrode 314 in the second region over the TFT backplane 310. Each blue LED 322 can have a same area size as the respective driver electrode 314. A maximum size of the respective first plug via 330 is no larger than the size of the blue LED 322; a minimum size of the respective first plug via 330 is no larger than the size of the respective driver electrode 314. The first plug via 330 can have the maximum size on the top and the minimum size on the bottom.

As shown in FIGS. 4A-3 and 4A-4 below, each blue LED 322 can include a first contact electrode p-electrode 406a or 406b, e.g., p-GaN, a second contact electrode n-electrode 404a or 404b, e.g., n-GaN, and multiple quantum well (MQW) semiconductor layers 405a or 405b between the p-electrode and the n-electrode. The MQW layers can include group III-V compounds and each of the blue LEDs 322 is operable to emit light with a blue color. The MQW layers can include multiple pairs of InGaN/GaN layers, e.g., In0.3Ga0.7N/GaN. Each blue LEDs 322 can be bonded to the first planar layer 301a by bonding the p-electrode onto the respective first plug via 330 through an intermediate conductive layer 304b. As illustrated in FIGS. 4M-1 and 4M-2 below, the intermediate conductive layers 304b and the metal lines 306a can be made of the same transparent conductive material, e.g., ITO, and can be formed in a same etching step. One or more metal lines 306b are formed on top of the n-electrodes of the blue LEDs 322 and conductively connect the n-electrodes together to form one or more common electrodes for the blue LEDs 322.

Arrays of second plug vias 332 can be formed in the second planar layer 301b, with each second plug via 332 positioned in a third region over the TFT backplane 310. The third region is in the remaining region and non-overlapping with the first and second portions. Each second plug via 332 is on top of a respective first plug via 330 on a respective driver electrode 314 in the third region and conductively coupled to the respective driver electrode 314 through the respective first plug via 330. Each second plug via 332 extends through isolation material (e.g., dielectrics 304) in the second planar layer to contact the respective first plug via 330. Similar to the first plug via 330, each second plug via 332 can be a trench filled with filling metal 331 and optionally lined with a barrier metal layer 333. In some examples, the second plug via 332 is made of transparent ITO without a barrier metal layer. The second plug via 332 can have a cross section that gradually decreases from top to bottom. The second plug via 332 can have a size at the bottom surface no larger than a size at the top surface of the first plug via 330.

Arrays of green LEDs 324 are arranged in a third planar layer 301c, with each green LED 324 positioned in the third region over the TFT backplane 310. The third region can be adjacent to the first region and/or the second region such that, from a top view, the green LEDs 324 are adjacent to the blue LEDs 322 and/or the red LEDs 320. The third planar layer 301c can be on the second planar layer 301b and vertically higher than the second planar layer 301b relative to the TFT backplane 310. Each green LED 324 is formed on a respective second plug via 332.

Each green LED 324 is conductively coupled to a respective non-volatile memory in the TFT backplane 310 through a respective second plug via 332, a respective first plug via 330 and a respective driver electrode 314 in the third region over the TFT backplane 310. Each green LED 324 can have a same area size as the respective driver electrode 314. A size of a top surface of the respective second plug via 332 is no larger than a size of a bottom surface of the green LED 324 and a size of a bottom surface of the respective second plug via 332 is no larger than a size of a top surface of the respective first plug via 330. The top surface size of the second plug via 332 can be no smaller than the bottom surface size of the second plug via 332.

Figures 1, 4J:
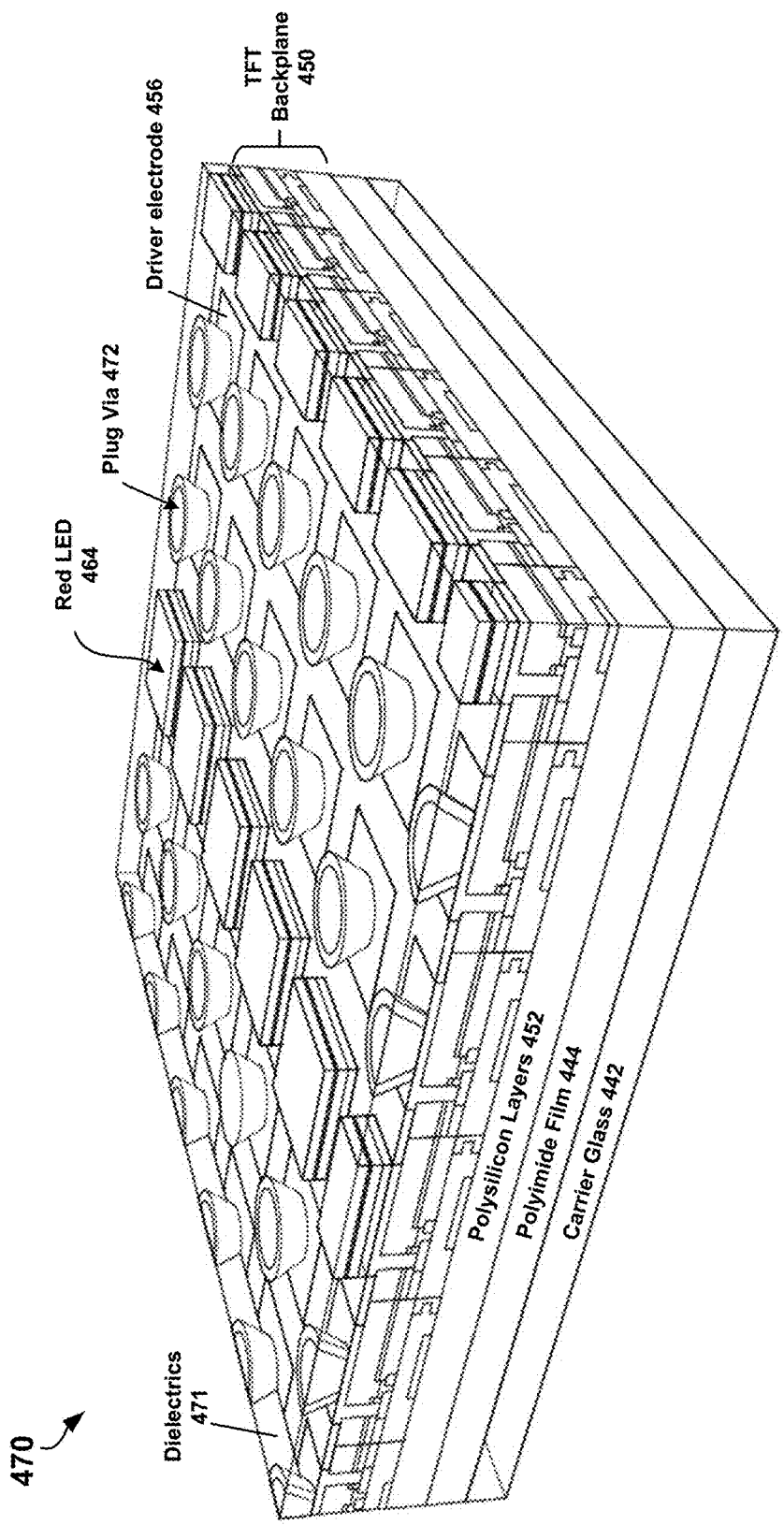
Figures 2, 4J:
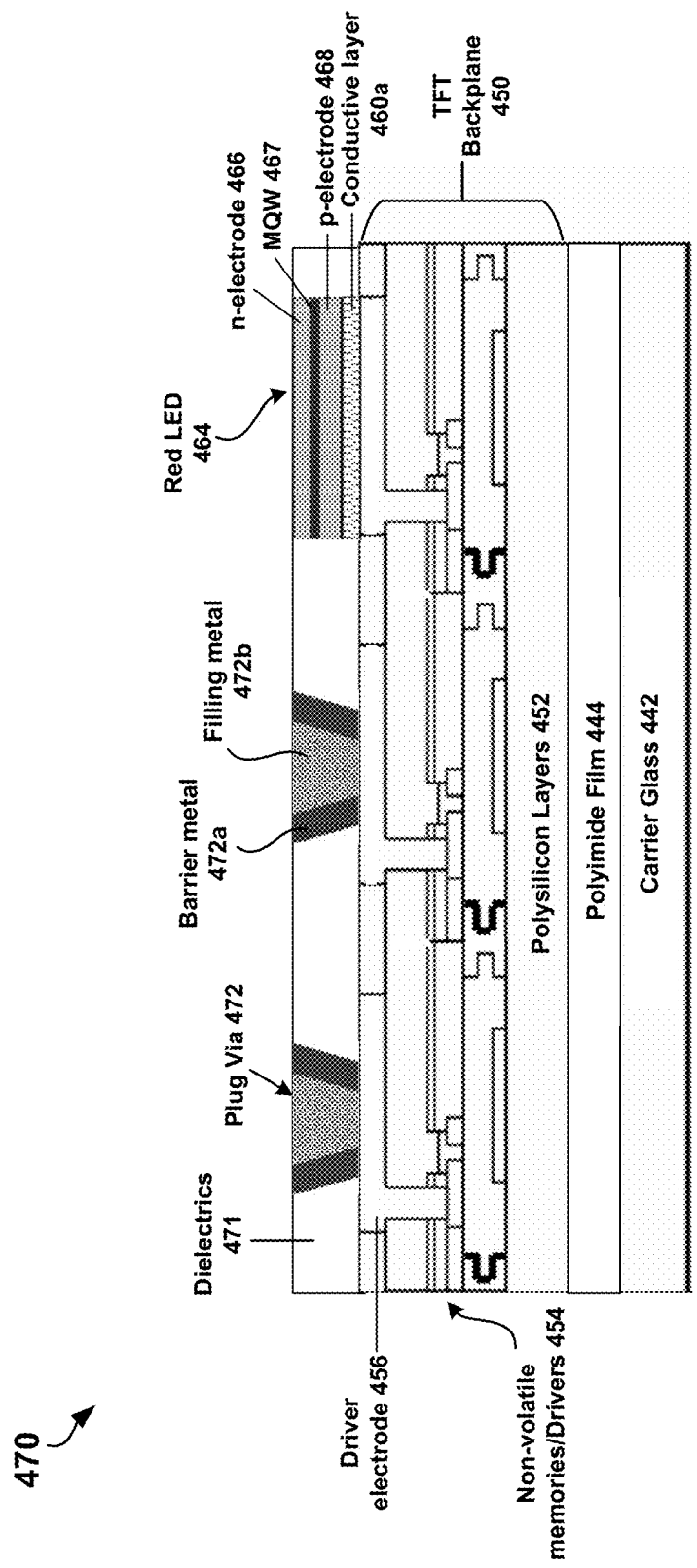
Figures 1, 4K:
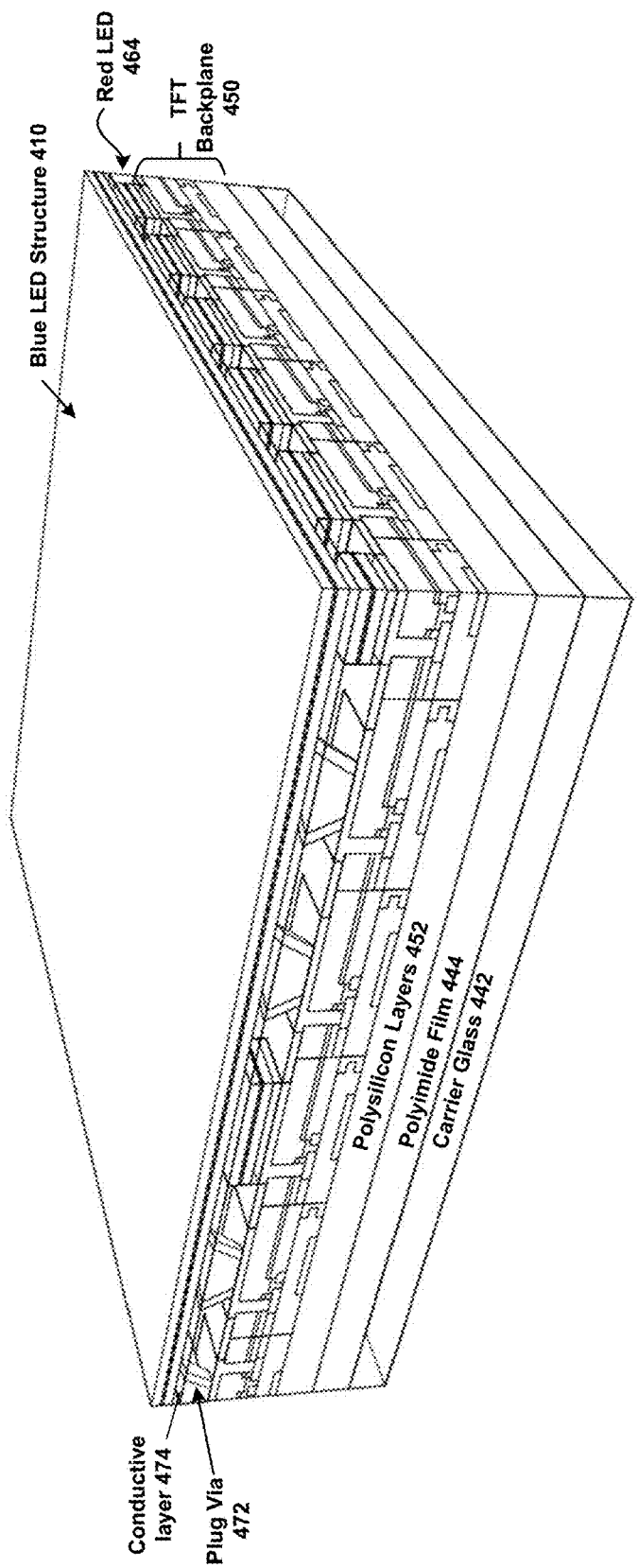
Figures 2, 4K:
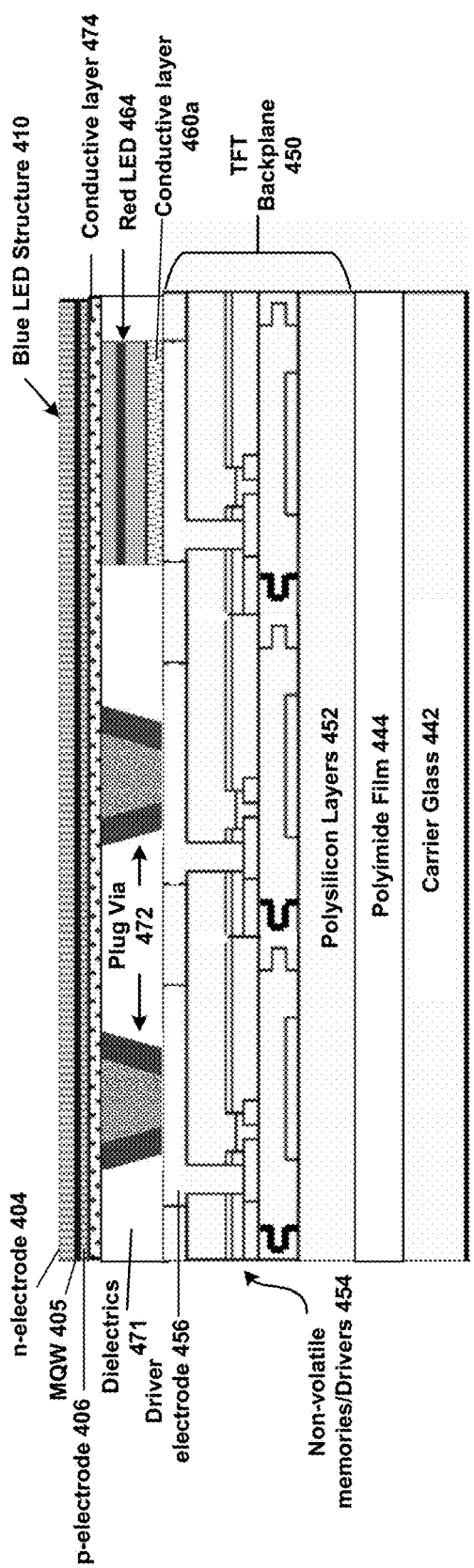
Figures 1, 4L:
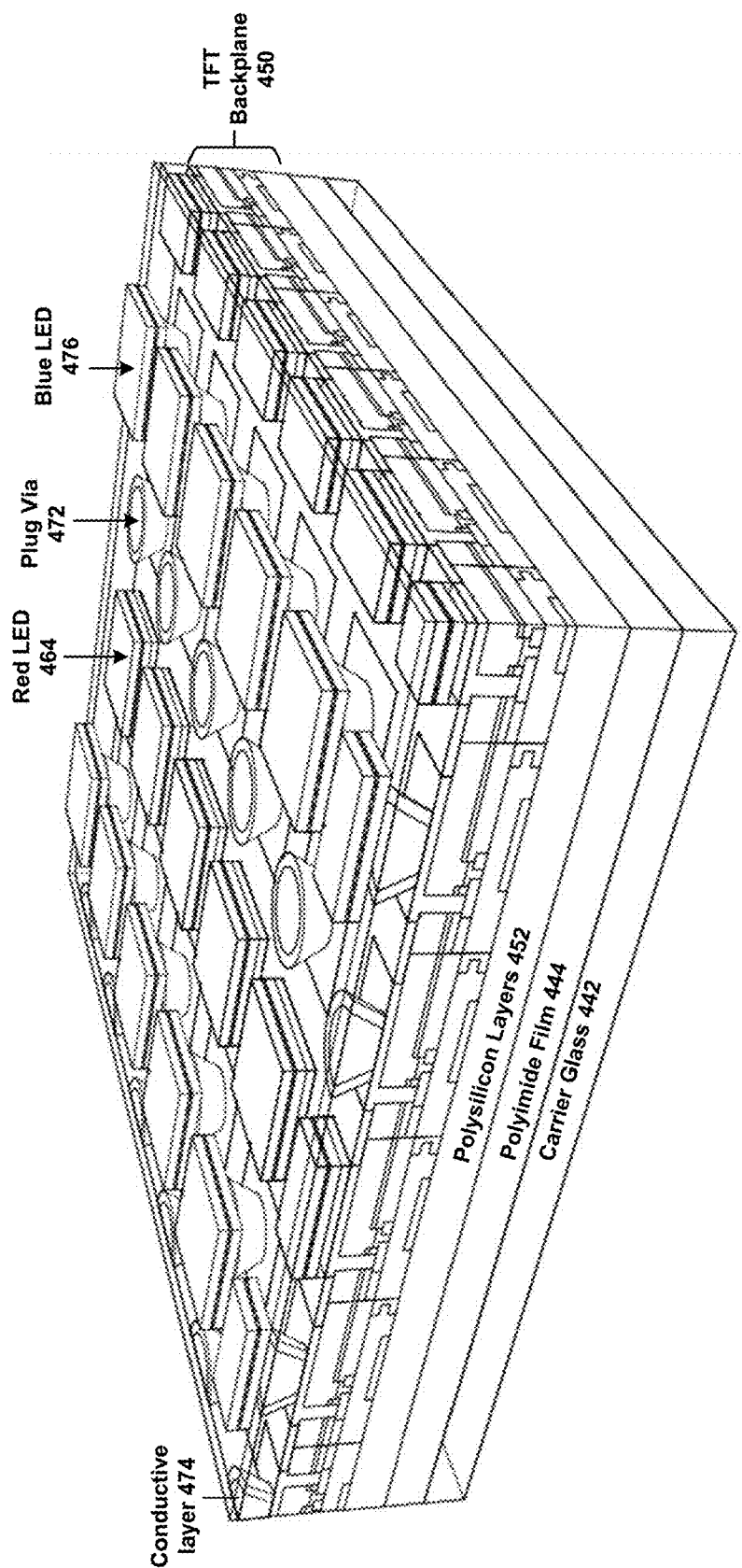
Figures 2, 4L:
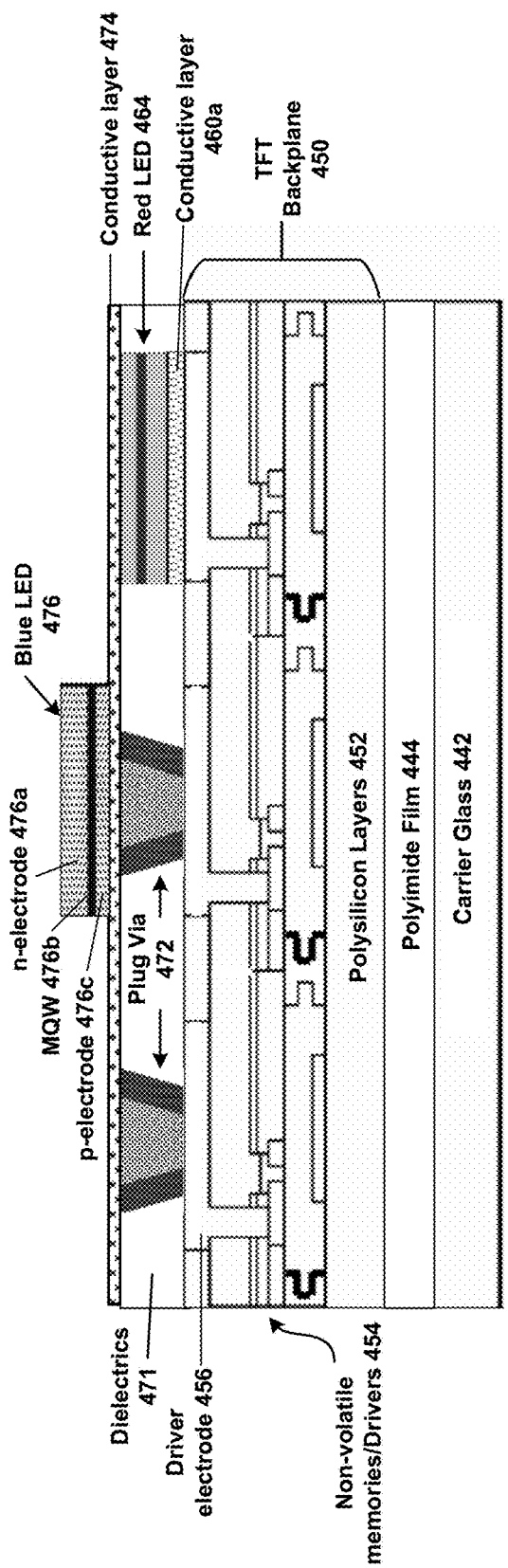
Figures 1, 4M:
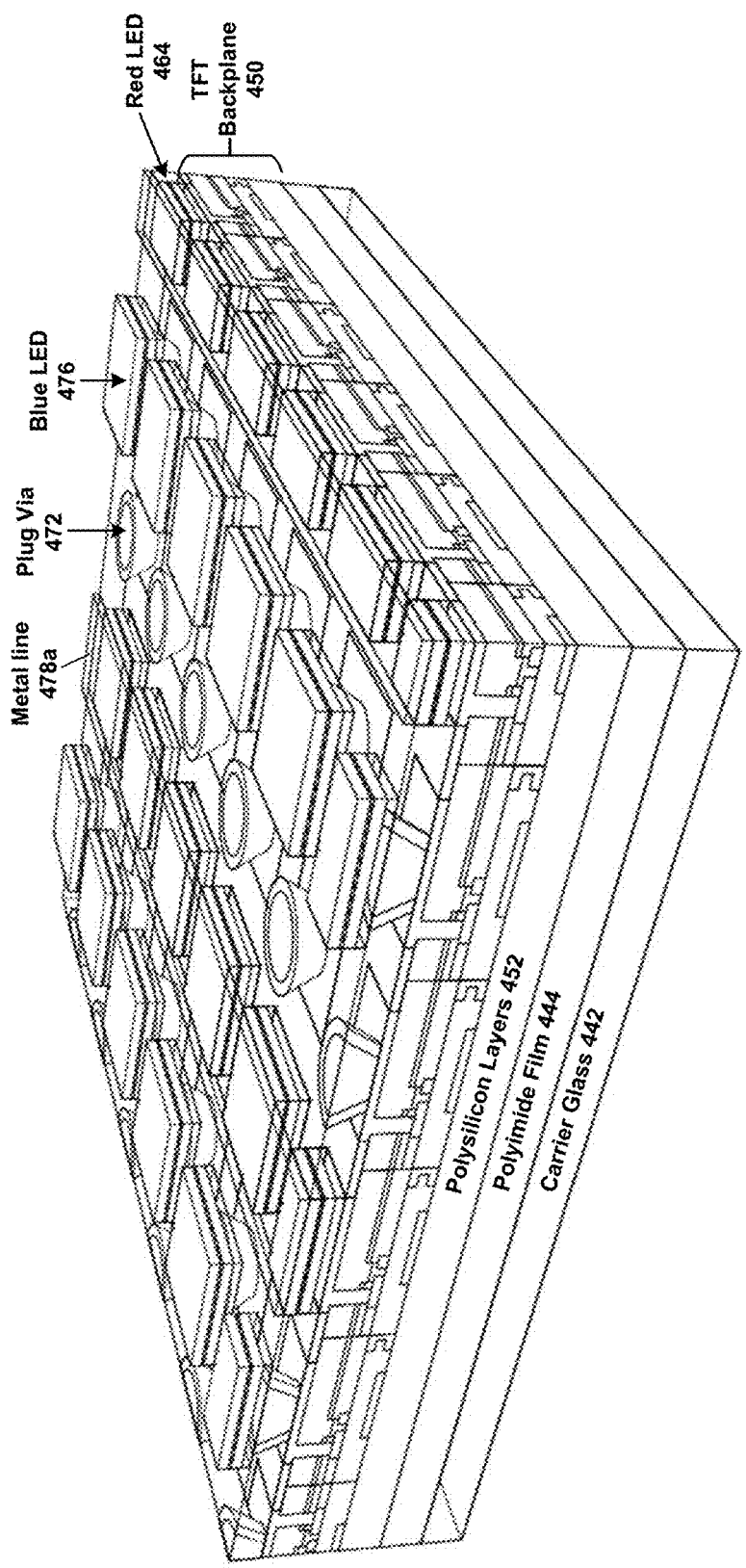
Figures 2, 4M:
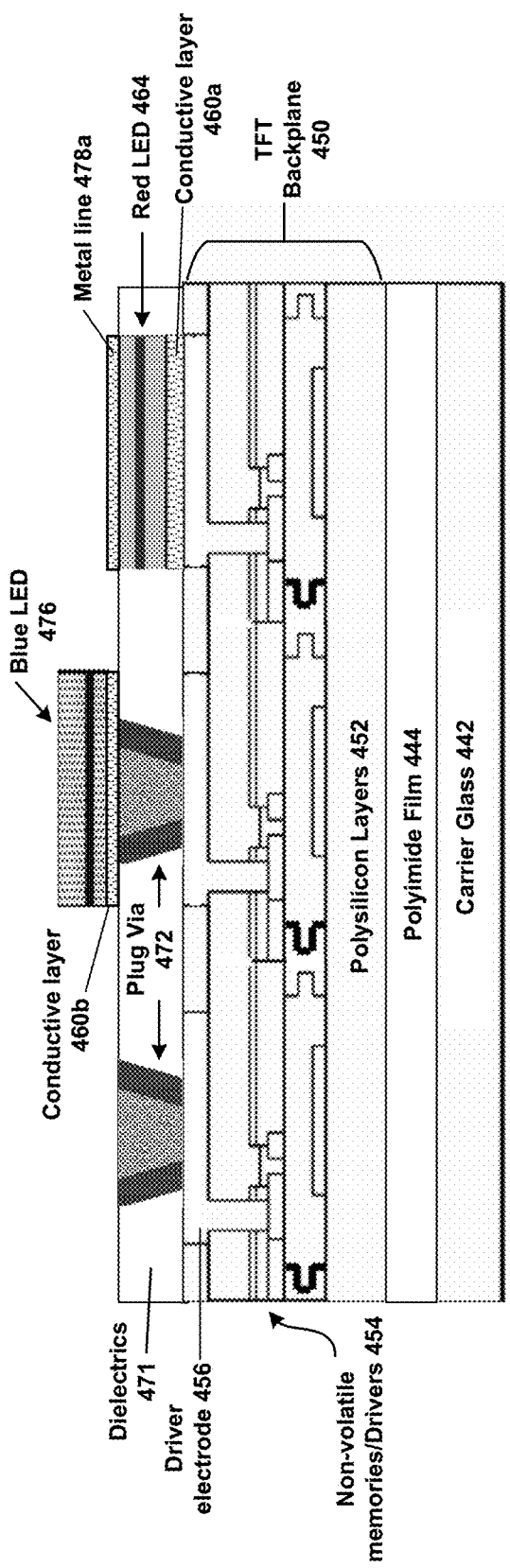
Figures 1, 4N:
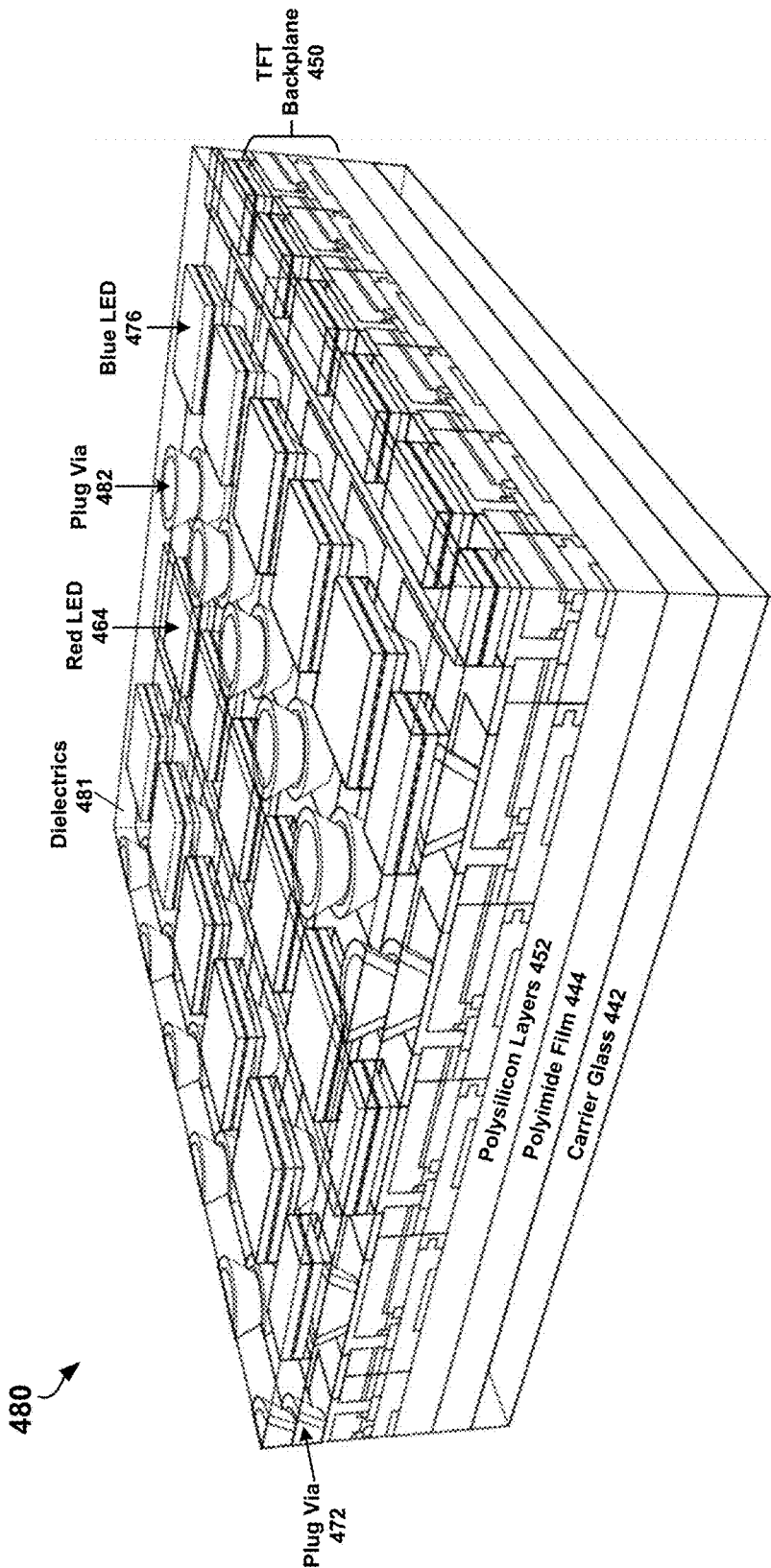
Figures 2, 4N:
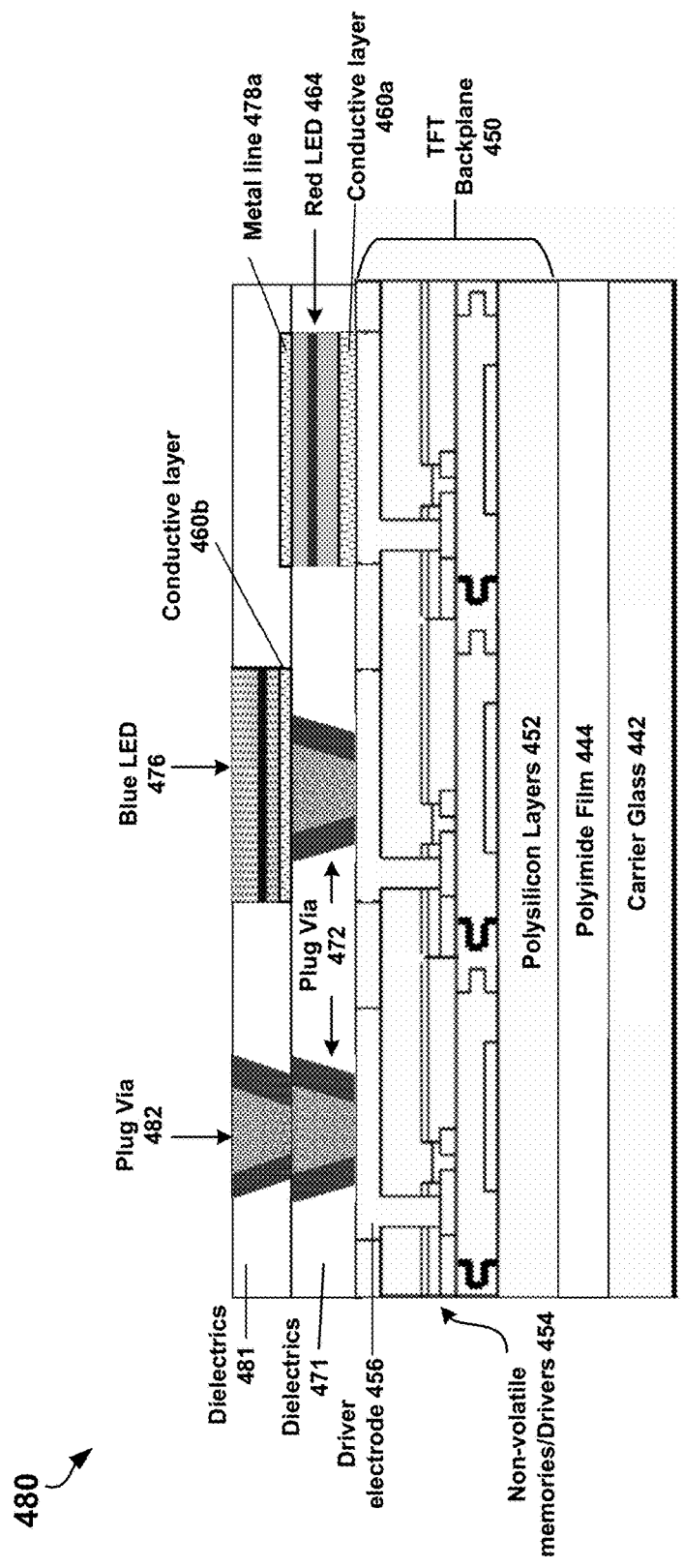
Figures 1, 40:
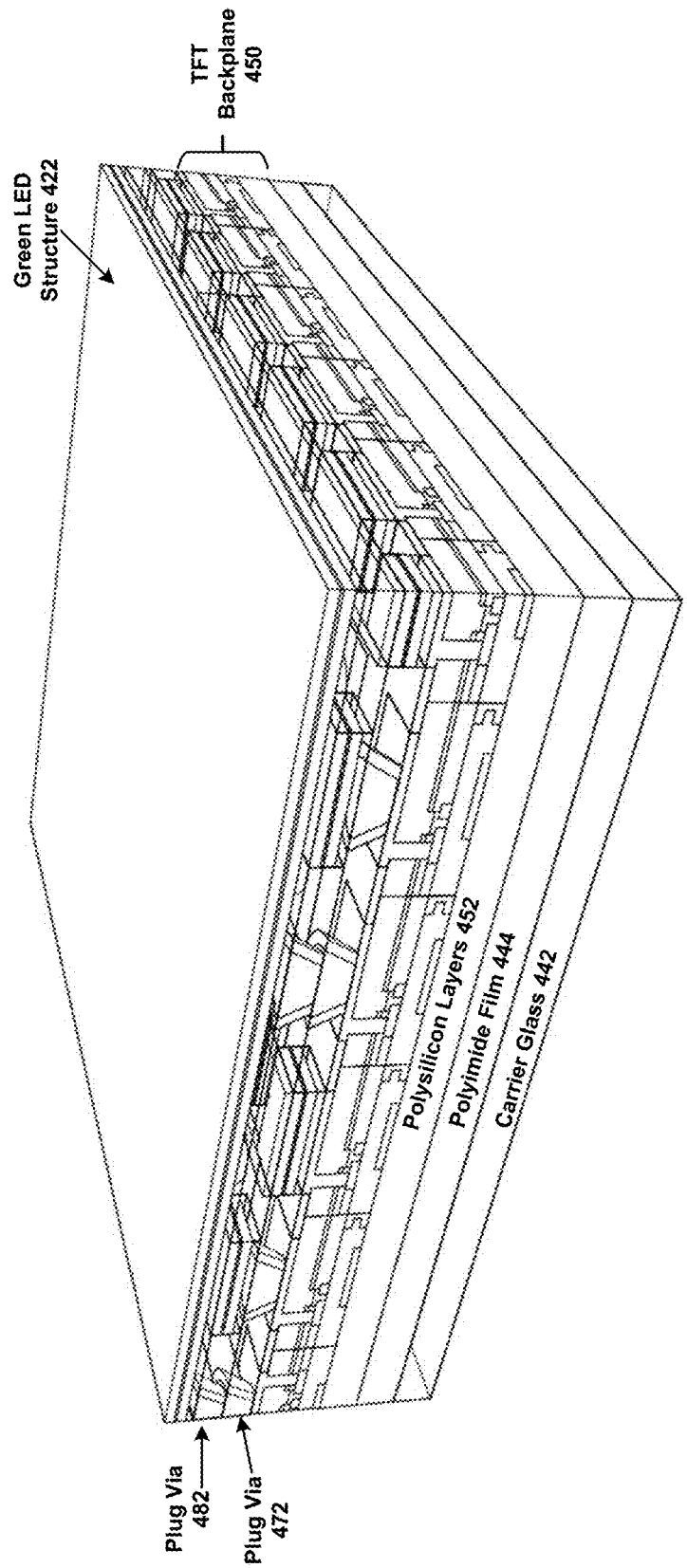
Figures 2, 40:
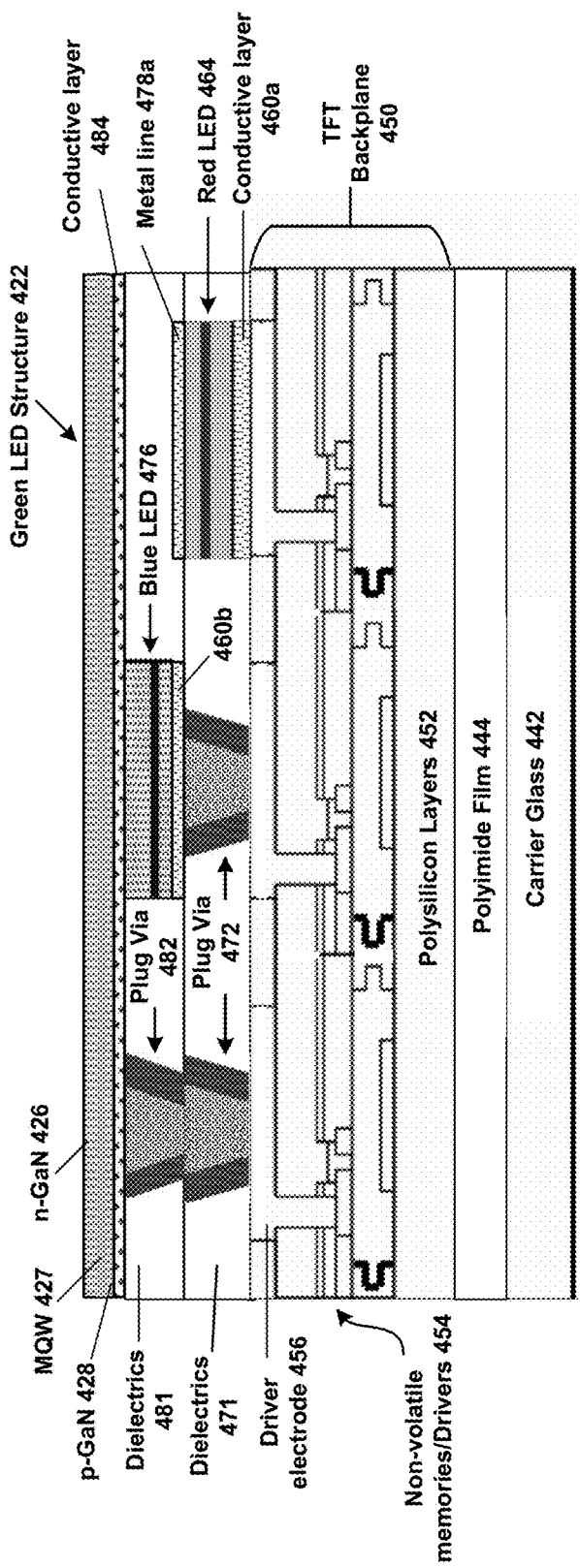
Figures 1, 4P:
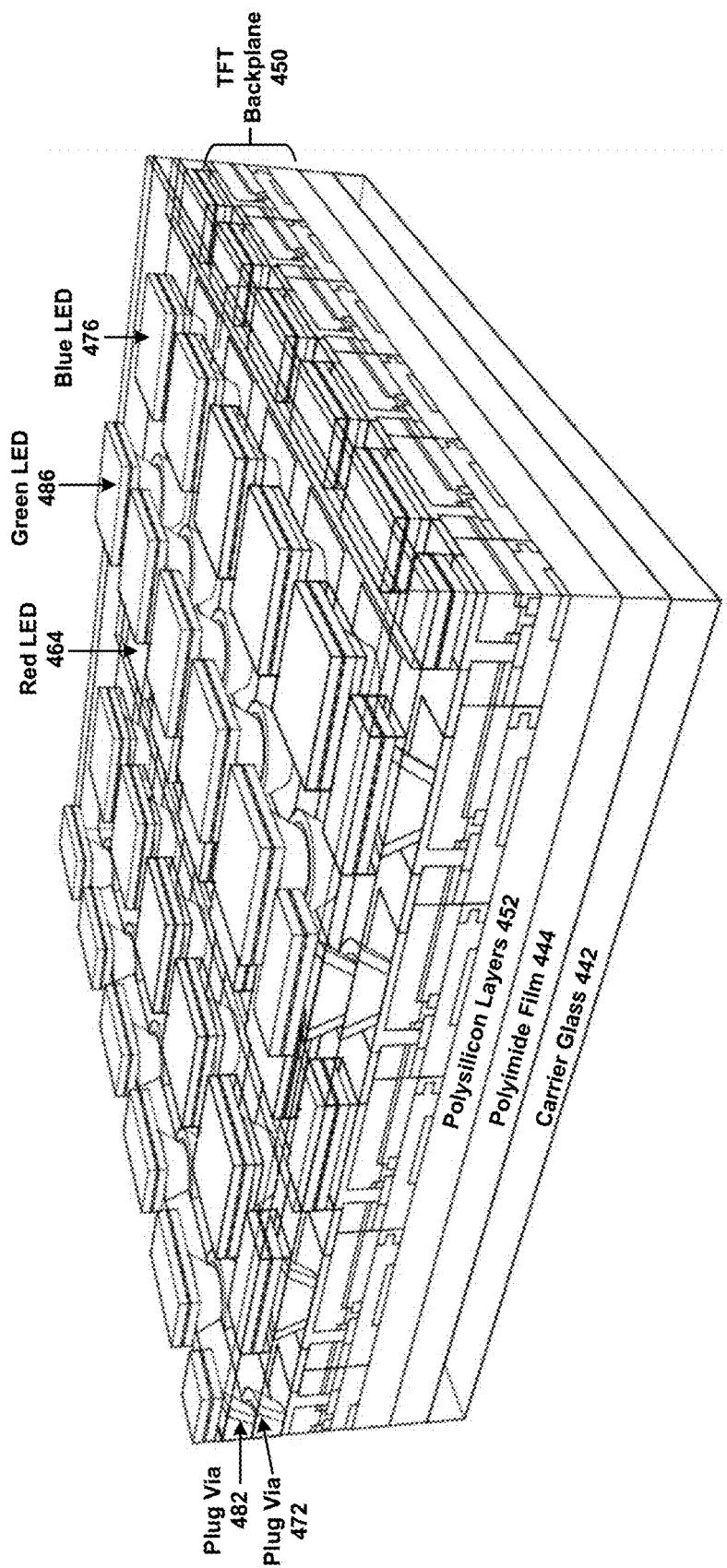
Figures 2, 4P:
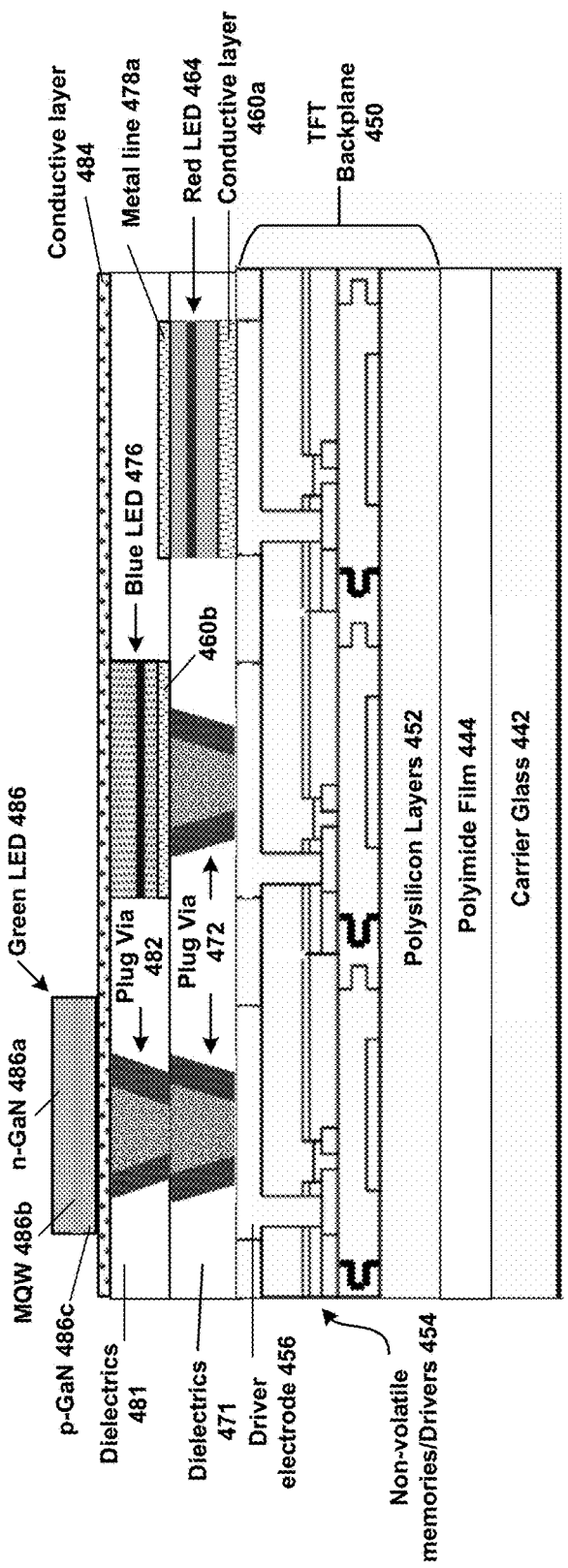
Figures 1, 4Q:
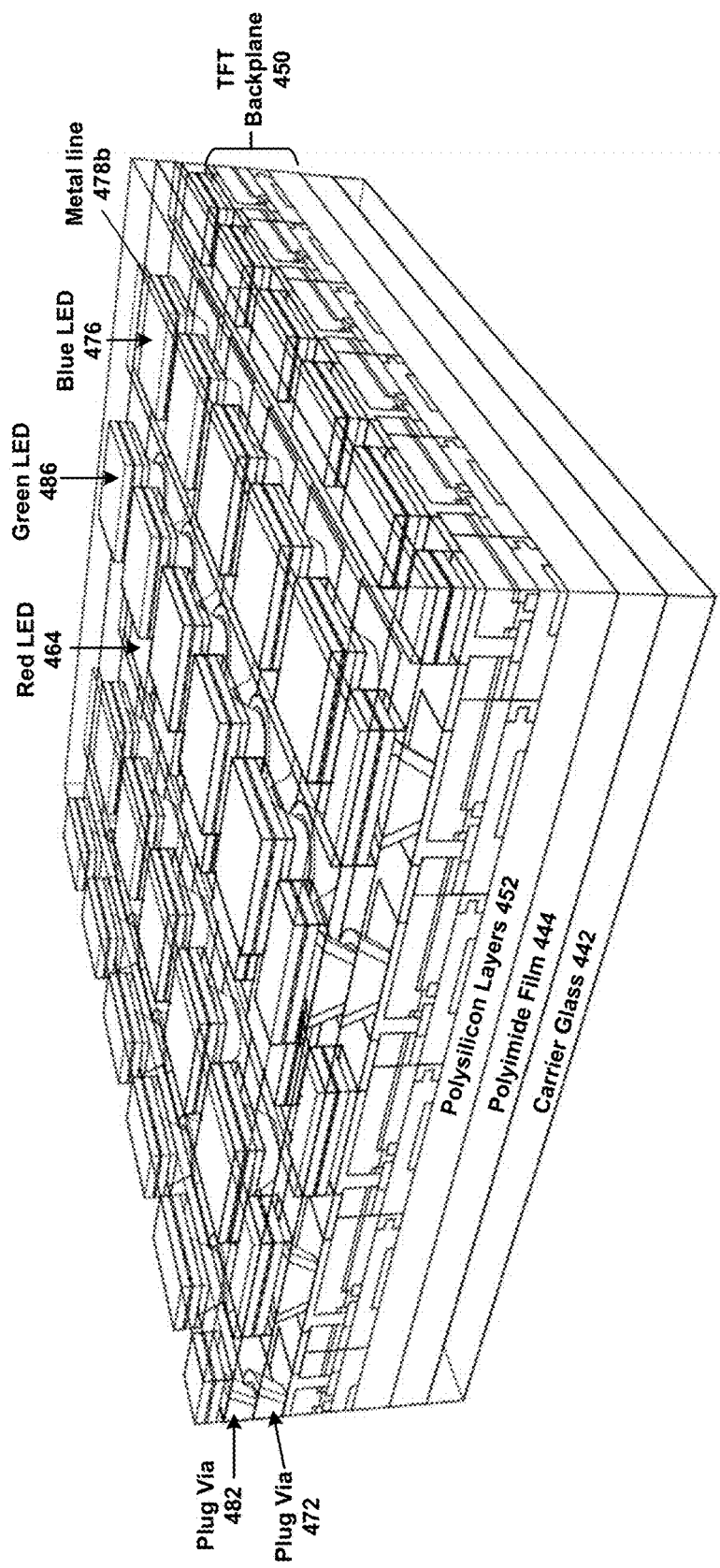
Figures 2, 4Q:
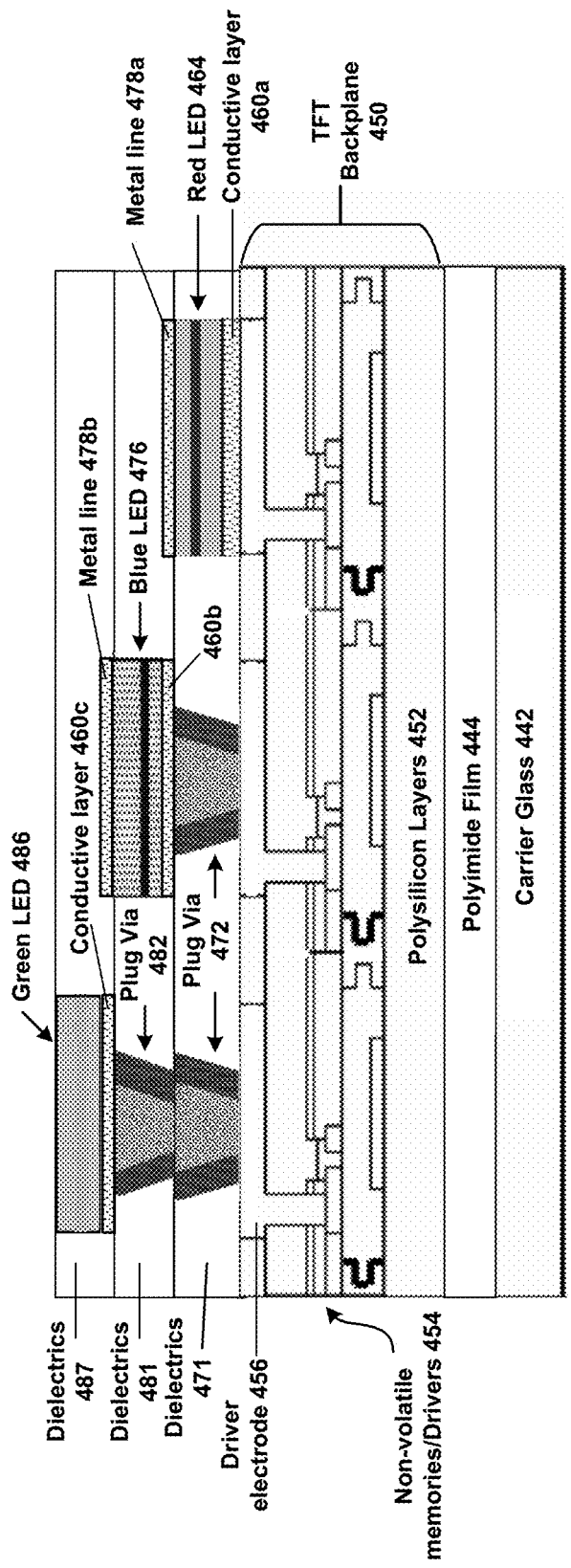

As shown in FIGS. 4B and 4P-2 below, each green LED 324 can include a first contact electrode p-electrode 428, e.g., p-GaN, a second contact electrode n-electrode 426, e.g., n-GaN, and multiple quantum well (MQW) semiconductor layers 427 between the p-electrode and the n-electrode. The MQW layers can include group III-V compounds and each of the green LEDs 324 is operable to emit light with a green color. The MQW layers can include multiple pairs of InGaN/GaN layers, e.g., In0.5Ga0.5N/GaN. Each green LEDs 324 can be bonded to the second planar layer 301b by bonding the p-electrode onto the respective second plug via 332 by an intermediate conductive layer 304c. As illustrated in FIGS. 4Q-1 and 4Q-2 below, the intermediate conductive layers 304c and the metal lines 306b can be made of same transparent conductive material, e.g., ITO, and can be formed in the same etching step. One or more metal lines 306c can be formed on top of the n-electrodes of the green LEDs 324 and conductively connect the n-electrodes together to form one or more common electrodes for the green LEDs 324.

Referring to FIG. 3C, diagram (I) shows a cross-sectional view from a top of the first planar layer 301a. Each first plug via 330 is on top of a respective driver electrode 314 in the remaining region. Each red LED 320 is on top of a respective driver electrode 314 in the first region and covered by metal line 306a to form a common electrode. Diagram (II) shows a cross-sectional view from a top of the second planar layer 301b. Each second plug via 332 is on top of a respective first plug via 330 on top of a respective driver electrode 314. A maximum size of the second plug via 332 is smaller than a maximum size of the first plug via 330. Each blue LED 322 is on top of a respective first plug via 330 on top of a respective driver electrode 314 and covered by metal line 306b to form a common electrode. Diagram (III) shows a cross-sectional view from a top of the third planar layer 301c. Each green LED 324 is on top of a respective second plug via 332 on a respective first plug via 330 and a respective driver electrode 314 and covered by metal line 306c to form a common electrode.

Returning to FIG. 3B, isolation material 304, such as one or more dielectrics, can be filled in between adjacent green LEDs 324, adjacent blue LEDs 322, and adjacent red LEDs 320. As the different color LEDs are in different planar layers and offset from each other over different regions of the TFT backplane 310, the dielectrics 304 are also deposited on top of the lower-level LEDs, e.g., blue LEDs 322 and red LEDs 320, between adjacent green LEDs 324, blue LEDs 322 and red LEDs 320, between adjacent first plug vias 330, between adjacent second plug vias 332, and between adjacent first plug vias 330 and red LEDs 320, and adjacent second plug vias 332 and blue LEDs 322. In some implementations, the dielectrics 304 are made of transparent material, e.g., SiOx. In some implementations, the dielectrics 304 on top of the LEDs including blue LEDs 322 and red LEDs 320 are made of transparent material, and the dielectrics 304 between adjacent LEDs, including adjacent red LEDs 320, adjacent blue LEDs 322, adjacent green LEDs 324, adjacent green LEDs 324 and blue LEDs 322, adjacent green LEDs 324 and red LEDs 320, and adjacent blue LEDs 322 and red LEDs 320, are made of opaque dielectric material, e.g., SiNx. The opaque dielectric material can help reduce cross-talk or interference between same color light from same color LEDs and/or different color light from different color LEDs.

As noted above, each red LED 320 is conductively coupled to a respective non-volatile memory in the TFT backplane 310 through the conductive layer 304a to thereby form an array of active-matrix red sub-pixels. Each blue LED 322 is conductively coupled to a respective non-volatile memory in the TFT backplane 310 through the conductive layer 304b and a respective first plug via 330 underneath to form an array of active-matrix blue sub-pixels. Each green LED 324 is conductively coupled to a respective non-volatile memory in the TFT backplane 310 through the conductive layer 304c, a respective first plug via 330, and a respective second plug via 332 to form an array of active-matrix green sub-pixels.

The array of active-matrix red sub-pixels, the array of active-matrix blue sub-pixels, and the array of active-matrix green sub-pixels form an array of active-matrix multi-color display pixels. Each active-matrix multi-color display pixel includes at least one red LED 320, at least one blue LED 322, at least one green LED 324 and respective non-volatile memories coupled to the LEDs. The red LED 320, the blue LED 322, and the green LED 324 are arranged adjacent to each other, e.g., along a horizontal direction perpendicular to the metal lines 306a, 306b, 306c. In some examples, each multi-color display pixel includes one red LED 320, one blue LED 322, and one green LED 324 along the horizontal direction and has a rectangular shape. In some examples, each multi-color display pixel includes three red LEDs 320, three blue LEDs 322, and three green LEDs 324 and has a square shape.

A polarizer film 336 can be deposited on surfaces of the array of active-matrix multi-color display pixels. The polarizer film 336 is configured to allow light from the display pixels to propagate through along a polarization direction to become a polarized light.

A protective layer 338 can be formed on the polarizer film 336. As noted above, the protective layer 338 can be a touch-sensitive transparent layer and can form, together with the transparent metal lines 306a, 306b, 306c (as the common electrodes), a capacitive touch screen position sensor.

In some implementations, the plug vias 330 and 332 are made of opaque metal material. The conductive layers 304a can be also made of opaque metal material. In some implementations, the plug vias 330 and 332 are made of transparent metal material such as ITO metal. The conductive layer 304a, the conductive layer 304b, and the conductive layer 304c are made of transparent metal material, such as ITO metal. The metal lines 306a, 306b, 306c are made of transparent metal material, such as ITO metal. In such a way, images/videos on the integrated display system 300 can be viewed from both sides (or directions) of the integrated display system 300.

In some implementations, differences between different light efficiencies (or light brilliances) among different color LEDs in each multi-color display pixel can be compensated by controlling pixel area ratios among the different LEDs in the display pixel, or controlling different drive currents for the different LEDs in the display pixel, or both. For example, the pixel areas ratios among the different LEDs can be designed for a larger compensation, and the drive currents for the different LEDs can be designed for a smaller compensation, e.g., for fine tuning.

Figure 3D:
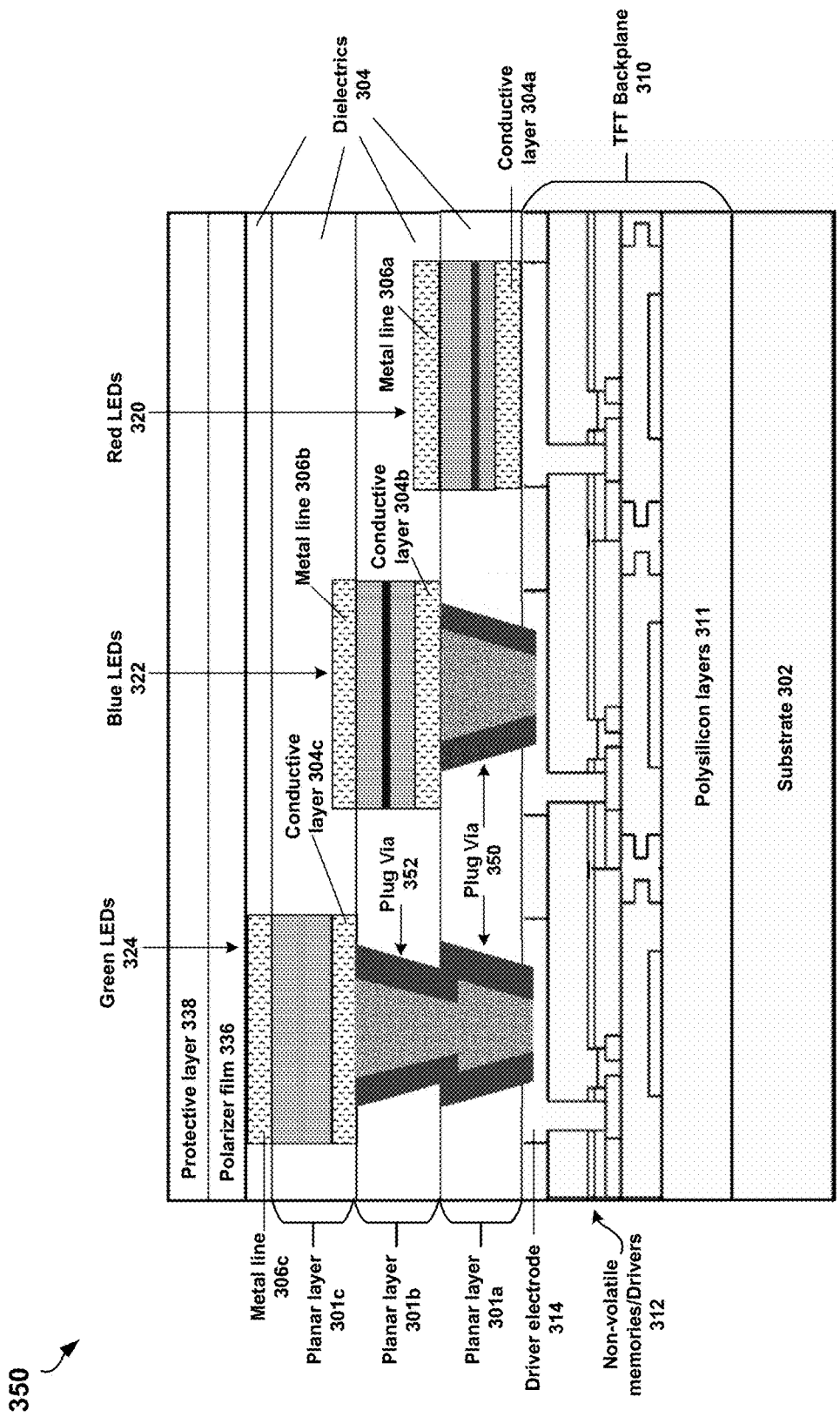
FIG. 3D is another example integrated display system fabricated using over-etched metal plug vias.

FIG. 3D is another example integrated display system 350 fabricated using over-etched metal plug vias 350 and 352. As illustrated in FIG. 3D, each plug via 350 extends through the first planar layer 301a into the TFT backplane 310, e.g., into a respective driver electrode 314, such that the plug via 350 is anchored in the respective driver electrode 314 (or in the TFT backplane 310) like a nailing structure. In such a way, the arrays of red LEDs 320 in the first planar layer 301a can be fixed or integrated with the TFT backplane 310 by the number of plug vias 350. Also the filled-in dielectrics 304 between the plug vias 350 and the red LEDs 320 also help fixing the red LEDs 320 on the TFT backplane 310. Thus, the plug vias 350 and/or the dielectrics 304 increase the integration between the first planar layer 301a (or the red LEDs 320) and the TFT backplane 310. This can also reduce a requirement on bonding the red LEDs 320 and the TFT backplane 310 through the conductive layers 304a. For example, the bonding can be performed under a low temperature, e.g., less than 400° C. or 300° C., that can be lower than a maximum allowable temperature of the TFT backplane 310.

Similarly, each second plug via 352 can extend through the second planar layer 301b into the first planar layer 301a, e.g., into a respective first plug via 350 underneath, such that the plug via 352 is anchored in the respective first plug via 350 (or in the first planar layer 301a) like a nailing structure. In such a way, the arrays of blue LEDs 322 in the second planar layer 301b can be fixed or integrated with the first backplane 301a by the number of second plug vias 352. Also the filled-in dielectrics 304 between the second plug vias 352 and the blue LEDs 322 also help fixing the blue LEDs 322 on the first planar layer 301a. Thus, the second plug vias 352 and/or the dielectrics 304 increase the integration between the second planar layer 301b (or the blue LEDs 322) and the first planar layer 301a. Accordingly, as the first planar layer 301a is fixed on the TFT backplane 310 through the first plug vias 350, the second planar layer 301b including the blue LEDs 322 can be fixed or integrated onto the TFT backplane 310 through the second plug vias 352 and the first plug vias 350.

The third planar layer 301c including the green LEDs 324 can be fixed onto the second planar layer 301b (accordingly the TFT backplane 310) by deposited top layers including metal lines 306c, the dielectrics 304, the polarizer film 336 and the protective layer 338. In some implementations, additional plug vias can be formed to help fix the third planar layer 301c onto the second planar layer 301b and thus the TFT backplane 310. For example, the additional plug vias can extend through the third planar layer 301c into the second planar layer 301b in regions without the LEDs 320, 322, and 324, e.g., in periphery regions. The additional plug vias can even extend through the third planar layer 301c, the second planar layer 301b, the first planar layer 301a, into the TFT backplane 310. The additional plug vias can function as a nailing structure and can be made of either conductive (e.g., metal) or isolation (or dielectric) material.

Referring now to FIGS. 4A-1 to 4U-2, steps of fabricating an integrated display system, e.g., the display system 300 of FIGS. 3A-3C or 350 of FIG. 3D, are illustrated.

FIGS. 4A-1 and 4A-2 show an LED device 400 (e.g., a blue LED wafer) having a multi-layered LED structure 410 formed on a substrate 402 (e.g., a wafer). The substrate 402 can be pre-treated, e.g., by cleaning a top surface of the substrate 402. Then the multi-layered LED structure 410 is formed by depositing multiple layers on the top surface of the substrate 402. The multiple layers can include a buffer layer, a first contact electrode, light-emitting layers, and a second contact electrode that are sequentially formed on the substrate 402. The multiple layers can be deposited by Metal-Organic Chemical Vapor Deposition (MOCVD), molecular beam epitaxy (MBE), atomic layer deposition (ALD), physical vapor deposition (PVD), Chemical Vapor Deposition (CVD), or any other suitable deposition methods in a vacuum chamber with a certain temperature. The light-emitting layers can include one or more quantum well layers of group III-V compounds for emitting light with a specified wavelength. For example, the III-V blue color LED structure 410 can be operable to emit light with a wavelength of about 460 nm.

For illustration purposes, FIGS. 4A-3 and 4A-4 show III-V blue light LED structures formed on different substrates. FIG. 4A-3 shows an example blue LED wafer 400a based on a sapphire substrate 402a, e.g., c-plane sapphire wafer. III-V blue color LED structure 410a is formed on the sapphire substrate 402a. The III-V blue color LED structure 410a can be formed by sequentially growing epitaxial layers including a buffer layer 403a, e.g., 4.5 μm-GaN layer, a n-type contact electrode 404a, e.g., 1 μm n doped GaN layer, MQW 405a, e.g., 30 pairs of 1.2 nm-InGaN/4.5 nm-GaN layers, and a p-type contact electrode, e.g., 150-nm p doped GaN layer on the sapphire substrate 402a.

FIG. 4A-4 shows another example blue LED wafer 400b fabricated on a silicon substrate 402b. The silicon substrate 402b can be a silicon (111) substrate, where a surface of the silicon (111) substrate is parallel to a (111) crystalline plane. III-V blue color LED structure 410b is formed on the silicon (111) substrate 402b by using alternating pairs of InGaN layer and GaN:Si layer as the quantum well (MQW) layers 405b. The blue LED wafer 400b can include one or more buffer layers 403b deposited on the silicon (111) substrate, one or more lower Group III-V compound layers 404b as a first contact electrode on the buffer layers 403b, one or more MQW layers 405b on the lower Group III-V compound layers 404b, and one or more upper Group III-V compound layers 406b as a second contact electrode. In a particular example, the blue color LED structure 410b is formed by sequentially epitaxially growing with MOCVD (or MBE or ALD): 30 nm-AlN layer under 700° C., 50 nm-AlN layer under 1200° C., 200 nm-AlGaN layer under 1200° C., 500 nm-GaN layer under 1200° C., 10 nm-AlN layer under 600° C., 50 nm-AlN layer under 1200° C., 400 nm-AlGaN layer under 1200° C., 1.5 μm-GaN:Si layer under 1200° C., 5 pairs of 5-nm InGaN layer and 10 nm-GaN:Si layer under 800° C., 10 nm-AlGaN:Mg layer under 1200° C., and 300 nm-GaN:Mg layer under 1200° C.

FIG. 4B shows an example green LED device 420 fabricated on a substrate 421. The substrate 421 can be c-plane sapphire wafer or m-plane GaN wafer. A III-V green color LED structure 422 is formed on the substrate 421. Similar to the blue color LED structure 410, the III-V green color LED structure 422 can be formed by sequentially growing epitaxial layers including a buffer layer 424, e.g., GaN layer, a n-type contact electrode 426, e.g., n doped GaN layer, MQW layers 427, e.g., InGaN/GaN layers, and a p-type contact electrode, e.g., p doped GaN layer, on the substrate 421. In a particular example, the green color LED structure 422 can be formed by 2 μm n-GaN layer, 50 nm n-GaN contact electrode layer, 5 pairs of 7 nm-In0.1Ga0.9N/5 nm-GaN layers, and 14 nm p-GaN contact electrode layer, on a c-plane sapphire wafer or a m-plane GaN wafer. The III-V green color LED structure 420 can be operable to emit light with a wavelength of about 520 nm.

FIG. 4C shows an example red LED device 430 fabricated on a substrate 431. The substrate 431 can be transparent GaP (or InGaP) wafer or opaque GaAs wafer. A III-V red color LED structure 432 is formed on the substrate 431. Similar to the blue color LED structure 410, the III-V red color LED structure 432 can be formed by sequentially growing epitaxial layers including a buffer layer 434 (or a sacrificial layer), a n-type contact electrode 436, e.g., n doped InGaP layer, MQW layers 437, e.g., InN/GaN layers, AlGaAs or InAlGaP layers, and a p-type contact electrode, e.g., p doped InGaP layer, on the substrate 431. The III-V red color LED structure 430 can be operable to emit light with a wavelength of about 650 nm.

FIGS. 4D-1 to 4D-3 show schematic diagrams of an example TFT array backplane device 440. The TFT array backplane device 440 can be fabricated on a polyimide film 444 on a carrier glass 442, using standard TFT manufacturing processes, e.g., by OEMs. The TFT backplane device 440 can include one or more TFT backplanes 450 on top of the polyimide film 444.

Each TFT backplane 450 can include one or more polysilicon layers 452 and integrated circuits (including a number of non-volatile memories and drivers 454) formed on the polysilicon layers 452. The drivers include scanning drivers, e.g., the scanning drivers 116 of FIG. 1, and data drivers, e.g., the data drivers 114 of FIG. 1. Each non-volatile memory is coupled to one of the scanning drivers through at least one word line, e.g., the word line 117 of FIG. 1, and to one of the data drivers through at least one bit line, e.g., the bit line 115 of FIG. 1. Each non-volatile memory includes at least one transistor coupled to a respective driver electrode 456 on top of the TFT backplane 450. Adjacent driver electrodes 456 are isolated from each other by dielectric spacers 458.

FIG. 4D-3 is an expanded cross-sectional view of the TFT backplane device 440. Each non-volatile memory includes at least one transistor 454a. The transistor 454a has drain 454b, gate 454c, and source 454d, which are separated by dielectrics 454e. The transistor 454a is coupled to a respective driver electrode 456 on top of the TFT backplane 450 through metal contact 459. Via 451 can be formed between adjacent transistors 454a. A shadow mask 453 is formed on top of the transistor 454a. Then a metal shield 457 is formed on the shadow mask 453. An interlayer 455 including dielectric material is formed between the metal shield 457 and the driver electrodes 456 for isolation.

To integrate an LED device, e.g., a red LED device 430, and the TFT backplane device 440 together, low-temperature bonding can be used. An intermediate layer 460, e.g., a metal layer, can be disposed between the two devices for bonding, as illustrated in FIG. 4E-1. A top surface of the LED device, e.g., a surface of p-electrode layer 438 as illustrated in FIG. 4C, can be a bonding surface of the red LED device 430; a top surface of the TFT array backplane device 440, e.g., a surface of the driver electrodes 456, can be a bonding surface of the TFT array backplane device 440.

To achieve good bonding, both bonding surfaces can be pre-treated to remove any contamination and/or oxide film that can hamper diffusion of intermediate metals diffusing into the bonding surfaces, e.g., p+ region of the p-electrode layer 438. The bonding surfaces can be pre-treated to be smooth and uniform. For example, a root mean square (rms) roughness of the p-electrode layer 438 of the red LED device 430 can be estimated to be around 1.5 nm, e.g., from an atomic force microscopy (AFM) scan.

In some implementations, the pre-treatment includes: I) treating the bonding surfaces by a 10 min piranha (H2O2:

H2SO4=1:3 by volume) solution pre-clean followed by deionized water rinse and spin-dry prior to metallization; II) treating the bonding surfaces with an ultraviolet (UV)-ozone pre-clean to remove the organic surface contamination; and III) before bonding, applying a low energy plasma activation of the bonding surface, e.g., the p+ surface, of the red LED device 430, to enhance diffusion of the intermediate metals.

As illustrated in FIGS. 4E-1 and 4E-2, the intermediate layer 460 can be first deposited onto the bonding surface of the TFT array backplane device 440. The intermediate layer 460 can be a continuous layer across the TFT array backplane device 440. As discussed with details below, the intermediate layer 460 can include one or more intermediate metallic layers. The metallic layers can include an iridium-tin-oxide (ITO) film and a titanium (Ti) film.

FIG. 4F-1 shows a schematic diagram of bonding the red LED device 430 to the TFT backplane device 440. Because the TFT backplane device 440 can have a larger area than the red LED device 430, multiple red LED devices 430 can be arranged on the TFT backplane device 440. Before bonding, the red LED device 430 can be aligned to a particular area on the TFT backplane device 440, e.g., in a vacuum chamber. Because the red LED structure 432 includes continuous layers across the red LED device 430, the red LED device 430 can be aligned with the particular area of the TFT backplane device 440 at a low alignment accuracy, e.g., at a sub-millimeter precision. As illustrated in FIG. 4F-1, the red LED device 430 is flipped over with the p-electrode layer 438 facing to the intermediate layer 460 and aligned with the particular area of the TFT backplane device 440. Then the aligned two wafers are clamped together on a bonding chuck, and a pressure is applied on both sides of the wafers when the wafers are in a full contact at a low temperature for a period of time. The bonded devices can be annealed to another low temperature for another period of time.

The following shows an example of low temperature bonding for bonding an LED device to a TFT backplane. The low temperature bonding of the red LED device 430 onto the TFT array backplane device 440 can use a transparent metal ITO film and a thin Ti film as the intermediate layers. The following is an example bonding process.

First, a 300 Angstroms of Ti adhesive layer, an optional diffusion barrier layer, and 1400 Angstroms of ITO are subsequently sputtered onto surfaces of the TFT array backplane devices in a vacuum chamber with pressures lower than 1×10^-6 Torr.

Second, both devices are placed in a vacuum chamber with pressures near 1×10^-3 Torr or in an atmosphere pressure nitrogen (N2) environments.

Third, the red LED device 430 is aligned to a particular area of the TFT backplane device 440 face-to-face and clamped together on a bonding chuck.

Fourth, a pressure of 30 psi is applied on both sides of the bonded devices when the devices are in a full contact at 200° C. for 1 hour.

Fifth, the bonded devices are annealed to a temperature near 300° C. for about 1 hour.

Referring back to FIG. 4F-1, the red LED structure 432 can be formed on a wafer substrate 431 having a circular shape, e.g., a GaP or GaAs wafer. To accommodate a number of red LED structures 432 on the same TFT array backplane device 440, different methods can be adopted.

In some implementations, e.g., as shown in FIG. 4F-2, the red LED device 430 on the wafer substrate 431 can be first cut into a rectangular shape and then bonded to the TFT array backplane device 440.

In some implementations, a step and scan lift-off method can be adopted. After one red LED device 430 is bonded to the TFT array backplane device 440, laser lift-off is performed on a rectangular area in the red LED device 430, so that the red LED structure (e.g., the LED multi-epitaxial layers) in the rectangular area scanned by the laser is separated from the wafer substrate 431 and remains bonded to the TFT array backplane device 440. The red LED structure in the non-scanned area of the red LED device 430 remains with the wafer substrate 431 and can be moved away from the TFT array backplane device 440. Thus, a rectangular shape red LED structure 432 is bonded on the TFT array backplane device 440, as illustrated in FIG. 4F-2. The wafer substrate 431 can be cleaned and reused.

FIG. 4F-3 shows a cross-sectional diagram of a bonded device including the rectangular shape red LED structure 432 and the TFT backplane device 440. The red LED structure 432 includes continuous layers having a buffer layer 434, an n-electrode layer 436, MQW layers 437, and a p-electrode layer 438. The substrate 431 was lifted off as noted above. The continuous p-electrode layer 438 is bonded with the driver electrodes 456 of the TFT backplane 450 through the continuous intermediate layer 460.

Using the same step and scan lift-off method, one or more rectangular shape red LED structures 432 can be bonded on the TFT backplane device 440 through the intermediate layer 460, as illustrated in FIG. 4G. The rectangular shaped red LED structures 432 can be arranged adjacent to each other in a regular array to form a large display. In some implementations, after a first rectangular shape red LED structure 432 is bonded on the TFT array backplane device 440, a second red LED device 430 is positioned on the TFT array backplane device 440. The second red LED device 430 is aligned with a particular area of the TFT array backplane device 440, such that a second rectangular shape red LED structure 432 to be obtained from the second red LED device 430 is adjacent to the first rectangular shape red LED structure 432. A periphery of the second red LED device 430 may be over a part of the first rectangular shape red LED structure 432. As the periphery is taken away from the TFT array backplane device 440 later, there is no or little effect on the first rectangular shape red LED structure 432. Note that a rectangular shape is used herein for illustration only, other suitable shapes can be also used, e.g., a hexagon shape.

In some implementations, the red color LED structure 432 is formed on a GaP substrate. As GaP is transparent, the GaP substrate can be delaminated by UV Excimer Laser (with a wavelength at 248 nm or 308 nm) lift-off. The epitaxial layer-selective delamination is achieved by photochemical decomposition of an intermediate opaque layer, e.g., the buffer layer 434, next to the transparent GaP substrate.

In some implementations, the red color LED structure 432 is formed on GaAs substrate. The GaAs substrate can be delaminated by Chemical Lift-Offs (CLO). Since GaAs is opaque, an intermediate sacrificial layer of AlAs or InAlP can be grown on the GaAs substrates before AlGaAs or InAlGaP multiple quantum wells. By selective etching AlAs intermediate sacrificial layers using HF, the GaAs substrate can be lifted off; and by selective etching InAlP intermediate sacrificial layers using HCl, the GaAs substrate can be lifted off. The GaAs substrate can be also delaminated by Nd:YAG Laser (with a wavelength of 1064 nm) lift-off. The epitaxial layer of InGaAsN can be used as an intermediate sacrificial layer for selective photodecomposition and substrates lift off. By tuning the composition of the InGaAsN layer such that its bandgap is lower than 1.165 eV (energy of a 1064 nm photon), the InGaAsN layer strongly absorbs 1064 nm laser light to which the GaAs substrate is effectively transparent. Upon absorption of the laser pulse, ablation occurs along the InGaAsN layer, separating the GaAs film from its GaAs growth substrate, producing a crack-free GaAs layer adhered to a flexible polymer substrate. In a particular example, a Q-switched Nd:YAG laser with a pulse duration (full width at half maximum—FWHM) of 8-9 ns, GaAs substrate wafer lift-off is achieved over a large range of average fluences from ~0.6 J/cm^2 to ~3.5 J/cm^2.

For further processing, the red LED structures 432 on the TFT array backplane device 440 can be polished, e.g., by a chemical-mechanical polishing (CMP) process, to remove the buffer layer 434. Polishing can be stopped when the n-electrode layer 436 (e.g., n-InGaP layer) is exposed, as illustrated in FIGS. 4H-1 and 4H-2. In some implementations, the n-electrode layer 436 is further thinned by polishing to remove a portion of the n-electrode layer 436.

The polished (and/or thinned) red LED structures 432 can be patterned to form an array of red LEDs. Before patterning, a protective mask can be aligned with the driver electrodes 456 in the top layer of the TFT backplane 450. The protective mask can be determined based on information fabricating the driver electrodes 456 in the TFT backplane 450. For example, the driver electrodes 456 are fabricated by forming a protective mask (e.g., photoresist or hard mask), depositing materials of the driver electrodes, and removing the protective mask layer. The protective mask for patterning the red LED structures 432 can be determined based on the protective mask for fabricating the driver electrodes 456. In this way, the protective mask for patterning the red LED structures 432 can be aligned with the driver electrodes 456 with high accuracy but low effort.

After the alignment, the patterning can be performed with the following steps: 1) patterning a hard mask layer, e.g., SiNx such as $Si_3N_4$, on top of the red LED structures 432, e.g., on the n-electrode layers 436 of the red LED structures 432; 2) etching through the layers of the red LED structures 432 and the intermediate layer 460; 3) removing the remaining hard mask layer. Particularly, as the intermediate layer 460 can include metal, etching the intermediate layer 460 can be separately performed from etching the epitaxial layers of the red LED structures 432.

FIGS. 4I-1 and 4I-2 show a perspective view and a cross-sectional view of a patterned device 462 after patterning the red LED structures 432 in a first region over the TFT backplane device 440. The polished/thinned red LED structures 432 are patterned to form arrays of red LEDs 464. The arrays of red LEDs 464 can be arranged on separate columns or rows. For example, as illustrated in FIG. 4I-1, adjacent columns of red LEDs 464 are separated by two columns left for blue LEDs and green LEDs, such that LED display pixels can be formed by adjacent different color LEDs including red LEDs, blue LEDs, and green LEDs. Each red LED 464 can have a size no smaller than (e.g., same as or larger than) a size of the respective driver electrode 456. The red LED 464 and the intermediate layer 460a are aligned with the respective driver electrode 456. The red LED 464 and the respective intermediate layer 460a can have the same size and be self-signed with each other due to simultaneous patterning.

Each red LED 464 includes n-electrode 466, MQW 467, and p-electrode 468. Each red LED 464 is conductively coupled to a respective non-volatile memory via the bonded p-electrode 468 and the driver electrode 456 by the intermediate layer 460a, such that an active-matrix red LED pixel is formed. Accordingly, arrays of active-matrix red LED pixels are formed after the patterning.

Then, as shown in FIGS. 4J-1 and 4J-2, an isolation material such as a dielectric material 471 is first filled into gaps between the red LEDs 464, e.g., in two dimensions along columns and rows. The dielectric material 471 can be a transparent material, e.g., SiOx, or an opaque material, e.g., SiNx. The dielectric material 471 can be deposited in the gaps by chemical vapor deposition (CVD). Topology planarization, e.g., polishing by chemical-mechanical polishing (CMP), is performed to form a flat surface across the arrays of red LEDs 464. The deposited dielectric material 471 can be polished to expose doped surfaces of the red LEDs 464, e.g., to the n-electrodes 466 of the red LEDs 464. That is, the flat surface can include surfaces of the n-electrodes 466 of the red LEDs 464.

Arrays of first plug vias 472 are then formed in a remaining region over the TFT array backplane 450. The remaining region is different and separate from the first region with the red LEDs 464. For example, the remaining region can be on columns or rows without the arrays of the red LEDs 464.

The first plug vias 472 can be formed by the following steps: 1) etching through the dielectric material 471 onto a top layer of the TFT backplane 450 (e.g., respective driver electrodes 456 in the remaining region) to form trenches; 2) depositing barrier metal layers 472a onto inner surfaces of the trenches; 3) filling conductive material such as metal 472b in the trenches. In some examples, the filling metal 472b is copper (Cu) or aluminum (Al) and the barrier metal layer 472a can be made of Platinum (Pt) or Tantalum (Ta). In some examples, the filling metal 331 is transparent ITO. As ITO is not chemically active as Cu or Al, there is no need to deposit the barrier metal layers 472a. The first plug via 472 can have a cross section gradually decreasing from top to bottom.

Each first plug via 472 is formed on a respective driver electrode 456 in the TFT backplane 450 and conductively coupled to the respective driver electrode 456. A bottom cross-section of the first plug via 472 can be smaller than a top surface of the driver electrode 456. Before etching to form the trenches, a protective mask can be aligned with the driver electrodes 456 in the remaining region over the TFT backplane 450. As discussed above, the protective mask can be determined based on information fabricating the driver electrodes 456 in the TFT backplane 450.

After forming the arrays of first plug vias 472, topology planarization can be performed to form a first integrated device 470 having a flat surface across the plug vias 472 and the red LEDs 464 to expose the metal 472b in the plug vias 472 and the n-electrodes 466 of the red LEDs 464.

As shown in FIGS. 4K-1 and 4K-2, a transparent conductive layer 474, e.g., an ITO layer, is first deposited on top of the flat surface. The transparent conductive layer 474 is configured to be an intermediate layer for bonding one or more blue LED structures 410 onto the first integrated device 470 (thus onto the TFT backplane device 440). The blue LED structures 410 can be integrated onto the first integrated device 470 using a method similar to the method of integrating the red LED structures 430 onto the TFT backplane device 440, as discussed above in FIGS. 4E-1 to 4H-2.

The substrate 402 of each blue LED structure 410 can be also removed by a scan and lifting-off process with a laser. In some examples, the substrate 402 is a sapphire substrate. Since sapphire is transparent and GaN (the material of the buffer layer 403) is opaque (which absorbs light), a GaN film can be lifted off from the sapphire substrate by a short pulse KrF UV excimer laser with a wavelength of 248 nm or 308 nm, e.g., in a power range of 0.4-0.8 J/cm². The short pulse laser is absorbed by the GaN film to generate a high temperature, e.g., more than 1000° C. Even a brief heating of an interface between the sapphire substrate and the GaN film to >1000° C. can result in decomposition of GaN into Ga, a low melting-point metal, and nitrogen which remains trapped at the interface. The sapphire substrate can be cleaned and reused.

For further processing, the blue LED structures 410 on the first integrated device 470 can be also polished, e.g., by a chemical-mechanical polishing (CMP) process, to remove the buffer layer (e.g., buffer layer 403a or 403b), and stopping at the n-electrode layer 404 (e.g., n-GaN layer 404a or 404b). In some implementations, the n-electrode layer 404 is further thinned by polishing to remove a portion of the n-electrode layer.

As shown in FIGS. 4L-1 and 4L-2, the polished (and/or thinned) blue LED structures 410 are patterned to form arrays of blue LEDs 476 in a second region over the TFT backplane device 440. Each blue LED 476 is on a respective plug via 472 on top of a respective driver electrode 456 in the second region. Before patterning, a protective mask can be aligned with the respective driver electrodes 456 in the second region over the TFT backplane device 440. The second region is in the remaining region. As illustrated in FIGS. 4L-1 and 4L-2, the second region can be columns or rows adjacent to the columns or rows of red LEDs 464 in the first region. The protective mask can be determined based on information fabricating the driver electrodes 456 in the TFT backplane 450. The protective mask for patterning the blue LED structures 410 can be aligned with the driver electrodes 456 in the second region.

After the alignment, the patterning can be performed with the following steps: 1) patterning a hard mask layer, e.g., SiNx such as $Si_3N_4$, on top of the blue LED structures 410, e.g., on the n-electrode layers 404 of the blue LED structures 410; 2) etching through the layers of the blue LED structures 410; 3) removing the remaining hard mask layer.

Each blue LED 476 can have a size (e.g., surface area) no smaller than (e.g., same as or larger than) a size (e.g., surface area) of the respective driver electrode 456 and a size (e.g., surface area) of the plug via 472. Each blue LED 476 includes n-electrode 476a, MQW 476b, and p-electrode 476c. Each blue LED 476 is conductively coupled to a respective non-volatile memory through the bonded p-electrode 476c and the first plug via 472 by the transparent conductive layer 474 and the respective driver electrode 456, such that an active-matrix blue LED pixel is formed. Accordingly, arrays of active-matrix blue LED pixels are formed in the second region after the patterning.

FIGS. 4M-1 and 4M-2 are perspective view and cross-sectional view after the transparent conductive layer 474 is selectively etched. The etched transparent conductive layer 474 forms metal lines 478a for the arrays of red LEDs 464 in the first region. A metal line 478a conductively connects the n-electrodes of the red LEDs 464 in one column or row to form a common electrode of the red LEDs 464. The etched transparent conductive layer 474 also forms conductive layers 460b for the blue LEDs 476. Each conductive layer 460b conductively couples a p-electrode of the blue LED 476 to a respective first plug via 472 which conductively connects to a respective driver electrode 456 in the second region over the TFT backplane 450. The blue LED 476 and the respective conductive layer 460b can have the same size and be self-signed with each other. The blue LED 476 and the conductive layer 460b are also aligned with the respective driver electrode 456.

Then, as shown in FIGS. 4N-1 and 4N-2, an isolation material 481, such as a dielectric material, is first filled into gaps between the blue LEDs 476, e.g., in two dimensions along columns and rows, and on top of the red LEDs 464 and first plug vias 472. The dielectric material 481 can be transparent material, e.g., SiOx. The dielectric material 481 can be deposited in the gaps by chemical vapor deposition (CVD). Topology planarization, e.g., polishing by chemical-mechanical polishing (CMP), is performed to form a flat surface across the arrays of blue LEDs 464.

Arrays of second plug vias 482 are then formed in a third region over the TFT array backplane device 440. Similar to the first plug vias 472, the second plug vias 482 can be made of transparent material, e.g., ITO, or an opaque metal material, e.g., Cu or Al, with a barrier metal material. The third region is in the remaining region and does not overlap with the second region. For example, the third region can be on columns or rows without the arrays of the red LEDs 464 and the blue LEDs 476 or on columns or rows between the adjacent arrays of red LEDs 464 and the blue LEDs 476. Each second plug via 482 is on top of a respective first plug via 472 that is on a respective driver electrode 456 in the third region. Each second plug via 482 is conductively coupled to the respective driver electrode 456 through the respective first plug via 472.

Before etching to form trenches for the second plug vias 482, a protective mask can be aligned with the driver electrodes 456 in the third region over the TFT backplane device 440. As discussed above, the protective mask can be determined based on information fabricating the driver electrodes 456 in the TFT backplane device 440.

After forming the arrays of second plug vias 482, topology planarization can be performed to form a second integrated device 480 including a flat surface across the second plug vias 482 and the blue LEDs 476 to expose filling metal in the second plug vias 482 and the n-electrodes 476a of the blue LEDs 476.

As shown in FIGS. 4O-1 and 4O-2, a transparent conductive layer 484, e.g., an ITO layer, is first deposited on top of the flat surface. The transparent conductive layer 484 is also configured to be an intermediate layer for bonding one or more green LED structures 422 onto the second integrated device 480 (thus onto the TFT backplane device 440). The green LED structures 422 can be integrated onto the second integrated device 480 using a method similar to the method of integrating the red LED structures 430 onto the TFT backplane device 440, as discussed above in FIGS. 4E-1 to 4H-2.

The substrate 421 of each the green LED structure 422 can be also removed by a scan and lifting-off process with a laser. In some examples, the substrate 421 is a sapphire substrate. As noted above, since sapphire is transparent and GaN (the material of the buffer layer 403) is opaque (which absorbs light), a GaN film can be lifted off from the sapphire substrate by a short pulse KrF UV excimer laser with a wavelength of 248 nm or 308 nm, e.g., in a power range of 0.4-0.8 J/cm². The sapphire substrate can be cleaned and reused.

For further processing, the green LED structures 422 on the second integrated device 480 can be also polished, e.g., by a chemical-mechanical polishing (CMP) process, to remove the buffer layer 424, and stopping when the n-electrode layer 426 is exposed. In some implementations, the n-electrode layer 426 is further thinned by polishing to remove a portion of the n-electrode layer.

As shown in FIGS. 4P-1 and 4P-2, the polished (and/or thinned) green LED structures 422 are patterned to form arrays of green LEDs 486 in the third region over the TFT backplane device 440. Each green LED 486 is on a respective second plug via 482 that is on a respective first plug via 472 on top of a respective driver electrode 456 in the third region. Before patterning, a protective mask can be aligned with the respective driver electrodes 456 in the third region over the TFT backplane device 440. The protective mask can be determined based on information fabricating the driver electrodes 456 in the TFT backplane 450.

After the alignment, the patterning can be performed with the following steps: 1) patterning a hard mask layer, e.g., SiNx such as $Si_3N_4$, on top of the green LED structures 422, e.g., on the n-electrode layers 426 of the green LED structures 422; 2) etching through the layers of the green LED structures 422; 3) removing the remaining hard mask layer.

Each green LED 486 can have a size no smaller than (e.g., same as or larger than) a size of the respective driver electrode 456 and a size of the second plug via 482. Each green LED 486 includes n-electrode 486*a*, MQW 486*b*, and p-electrode 486*c*. Each green LED 486 is conductively coupled to a respective non-volatile memory through the bonded p-electrode 486*c* and the second plug via 482 by the transparent conductive layer 484, the first plug via 472, and the respective driver electrode 456, such that an active-matrix green LED pixel is formed. Accordingly, arrays of active-matrix green LED pixels are formed in the third region after the patterning. Accordingly, the arrays of active-matrix red LED pixels, the arrays of active-matrix blue LED pixels, and the arrays of active-matrix green LED pixels form arrays of active-matrix multi-color LED display pixels. Each LED display pixel can include at least one red LED 464, at least one blue LED 476, at least one green LED 486, and respective non-volatile memories coupled to the LEDs 464, 476, and 486 in the pixel.

As shown in FIGS. 4Q-1 and 4Q-2, the transparent conductive layer 484 is selectively etched. The etched transparent conductive layer 484 forms metal lines 478*b* for the arrays of blue LEDs 476 in the second region. A metal line 478*b* conductively connects the n-electrodes of the blue LEDs 476 in one column or row to form a common electrode of the blue LEDs 476. The etched transparent conductive layer 484 also forms conductive layers 460*c* for the green LEDs 486. Each conductive layer 460*c* conductively couples a p-electrode of the green LED 486 to a respective second plug via 482 then a respective first plug via 472 which conductively connects to a respective driver electrode 456 in the second region over the TFT backplane device 440. The green LED 486 and the respective conductive layer 460*c* can have the same size and be self-signed with each other. The green LED 486 and the conductive layer 460*c* can be also aligned with the respective driver electrode 456.

Then, an isolation material such as a dielectric material 487 is filled into gaps between the green LEDs 486, e.g., in two dimensions along columns and rows, and on top of the red LEDs 464 and the blue LEDs 476. The dielectric material 487 can be transparent material, e.g., SiOx. The dielectric material 487 can be deposited in the gaps by chemical vapor deposition (CVD). Topology planarization, e.g., polishing by chemical-mechanical polishing (CMP), is performed to form a flat surface across the arrays of green LEDs 486 to expose n-electrodes 486*a* of the green LEDs 486.

Figures 1, 4R:
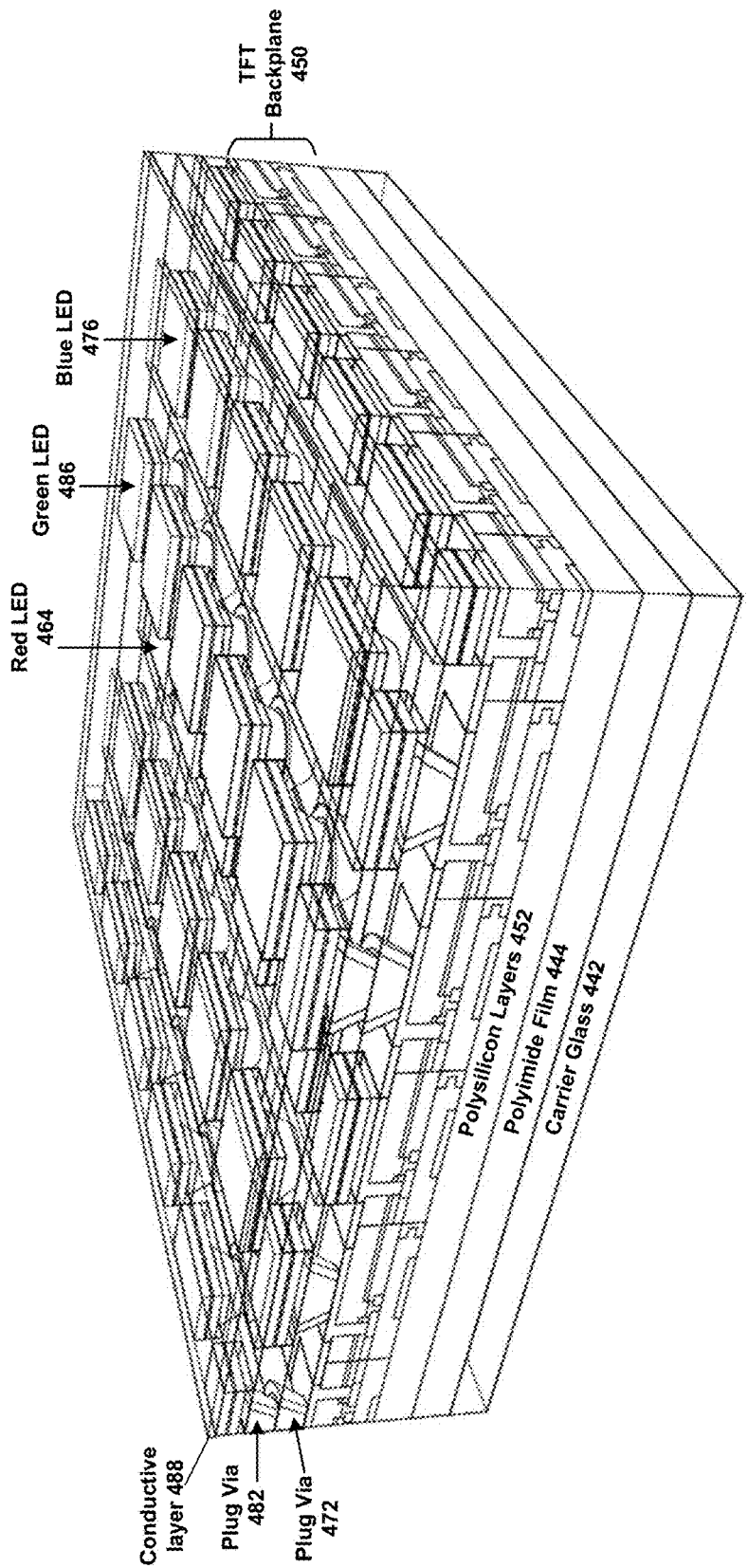
Figures 2, 4R:
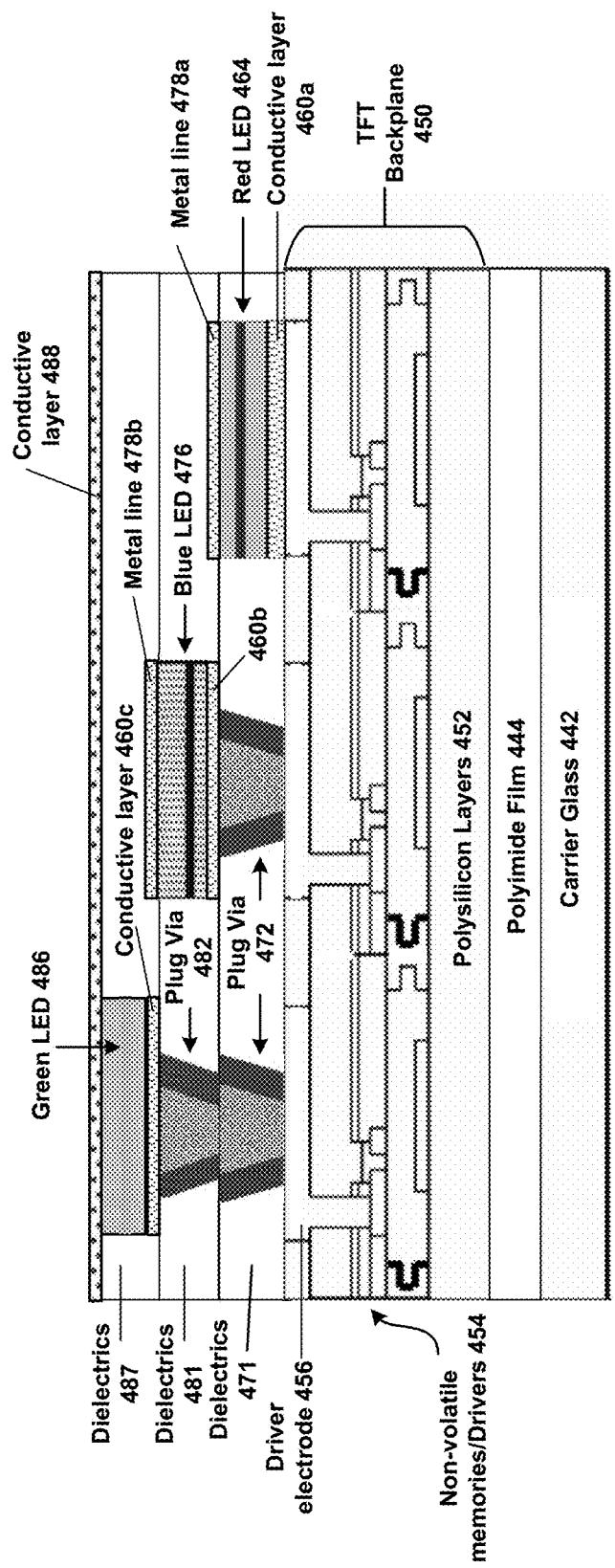

As shown in FIGS. 4R-1 and 4R-2, a transparent conductive layer 488, e.g., an ITO layer, is deposited on top of the flat surface. The transparent conductive layer 488 is also configured to connect the n-electrodes 486*a* of the green LEDs 486 to form a common electrode.

In some implementations, as the conductive layer 488 is transparent, it is unnecessary to etch the transparent conductive layer 488 to form the metal lines 478*c* as the common electrodes. That is, the transparent conductive layer 488 can be kept from etching and form a common electrode for all the green LEDs 486.

Figures 1, 4S:
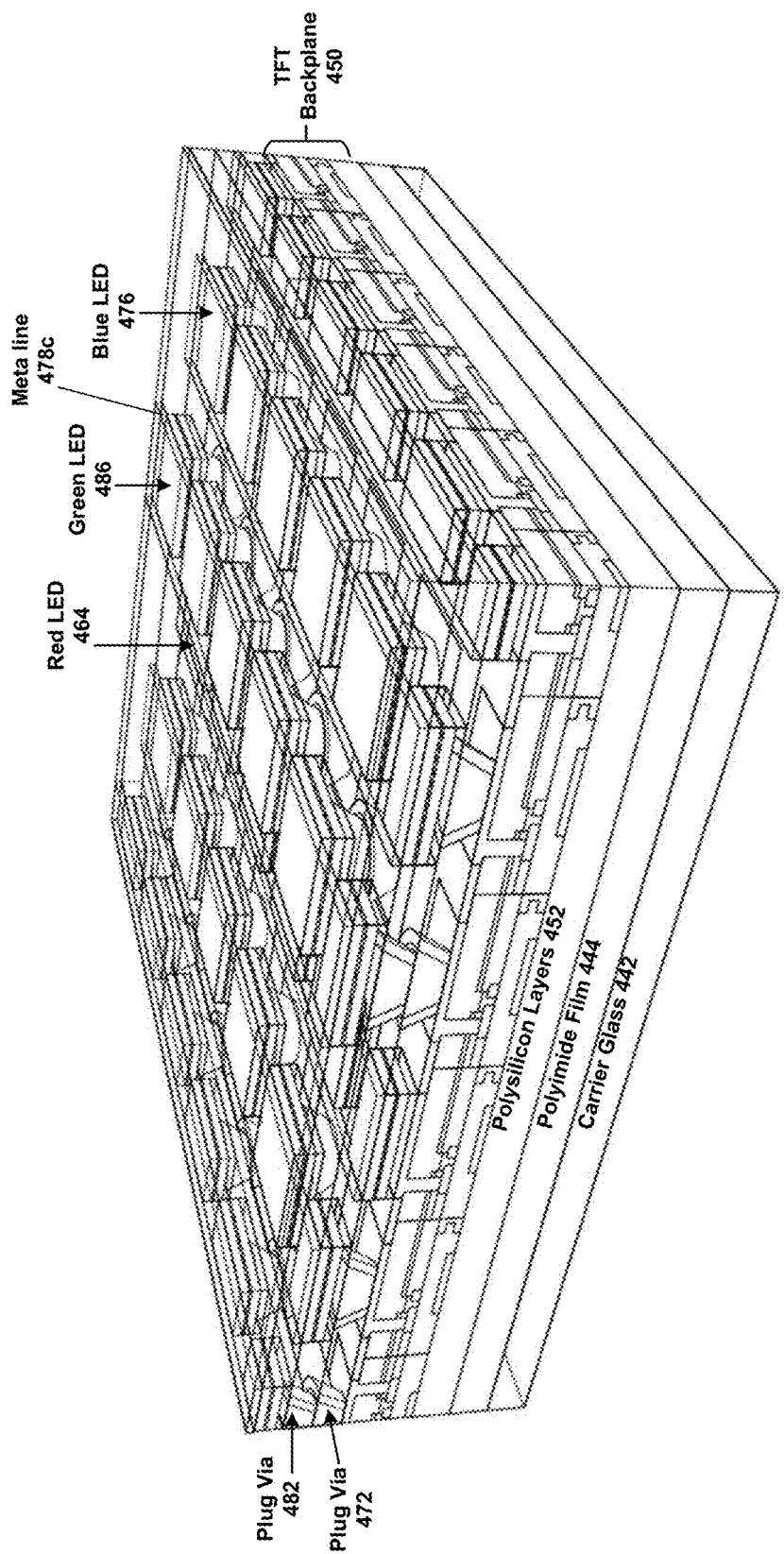
Figures 2, 4S:
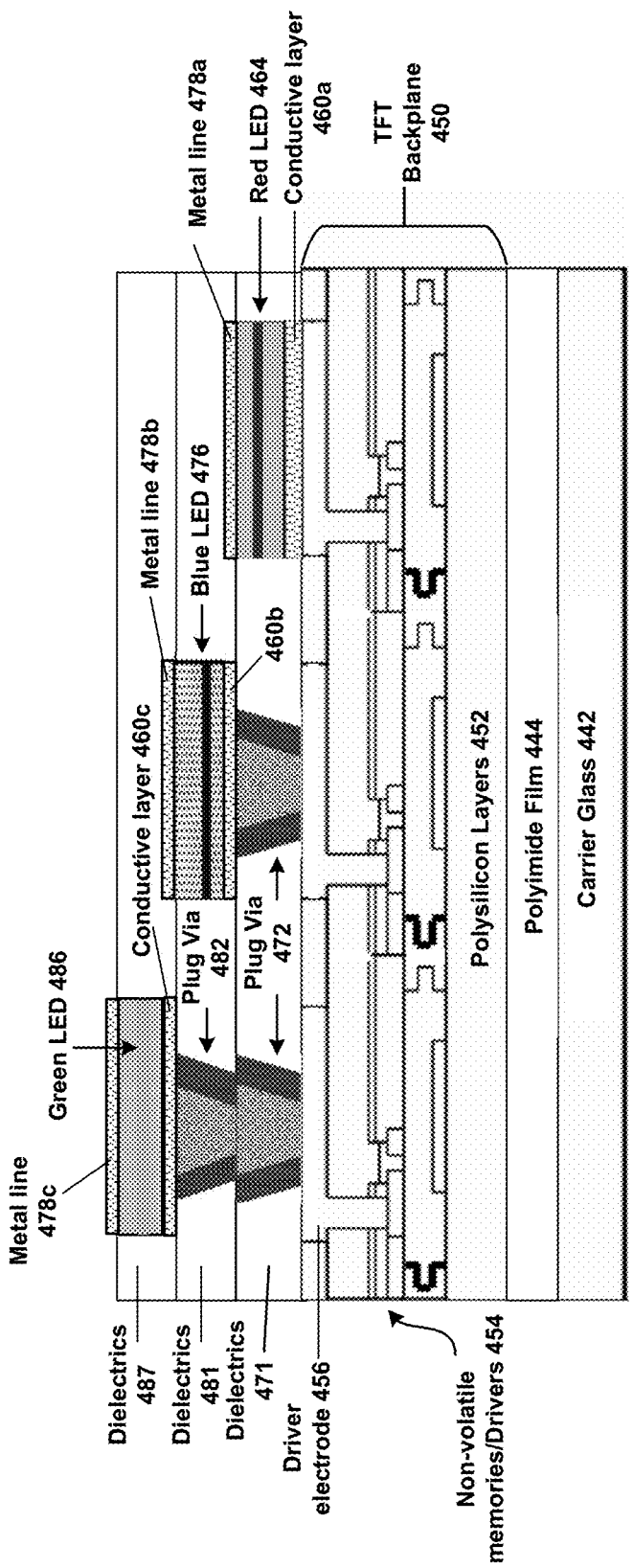

In some implementations, as shown in FIGS. 4S-1 and 4S-2, the transparent conductive layer 488 is selectively etched to form metal lines 478*c* on top of the arrays of green LEDs 486 to form common electrodes for the green LEDs 886.

Figures 1, 4T:
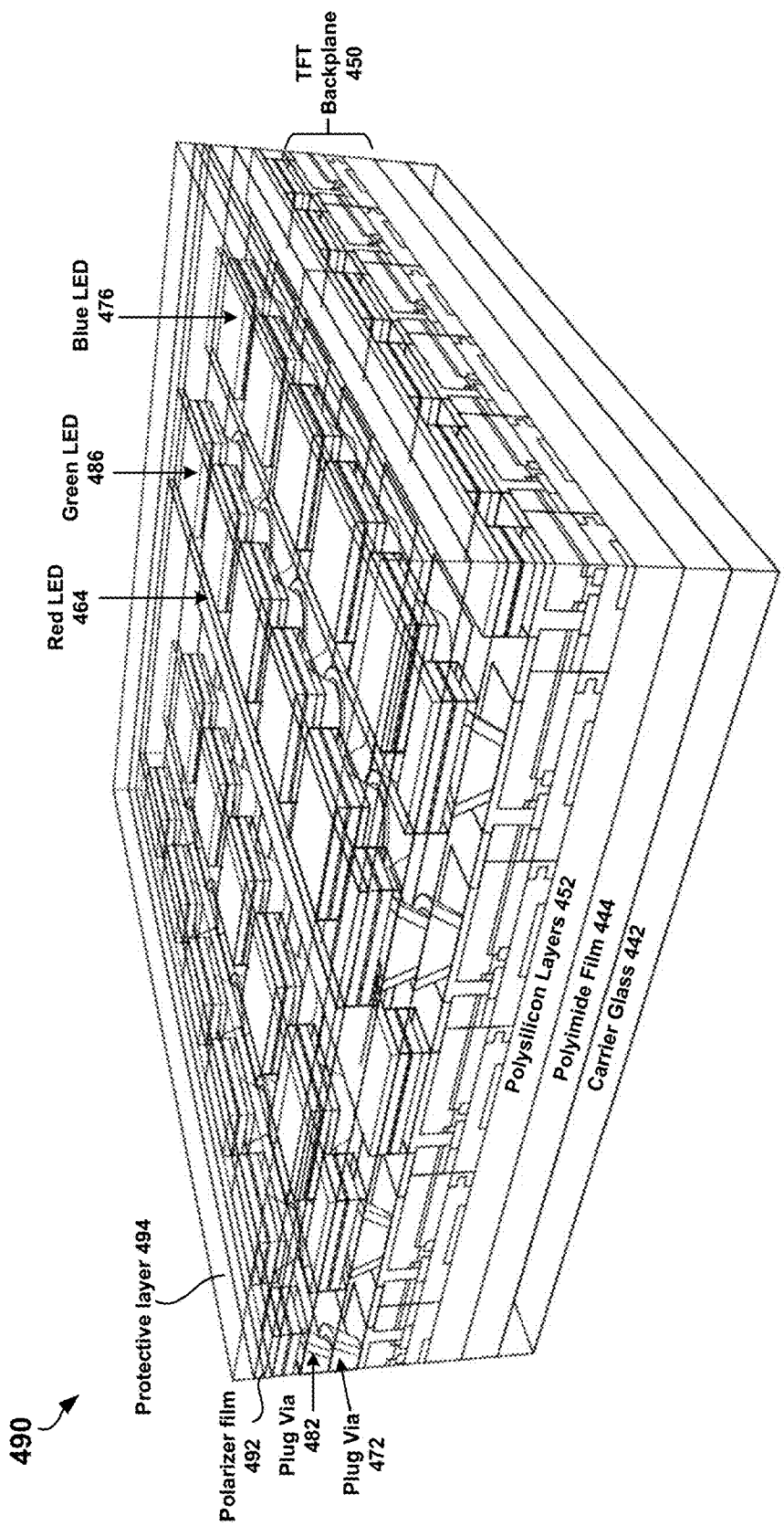
Figures 2, 4T:
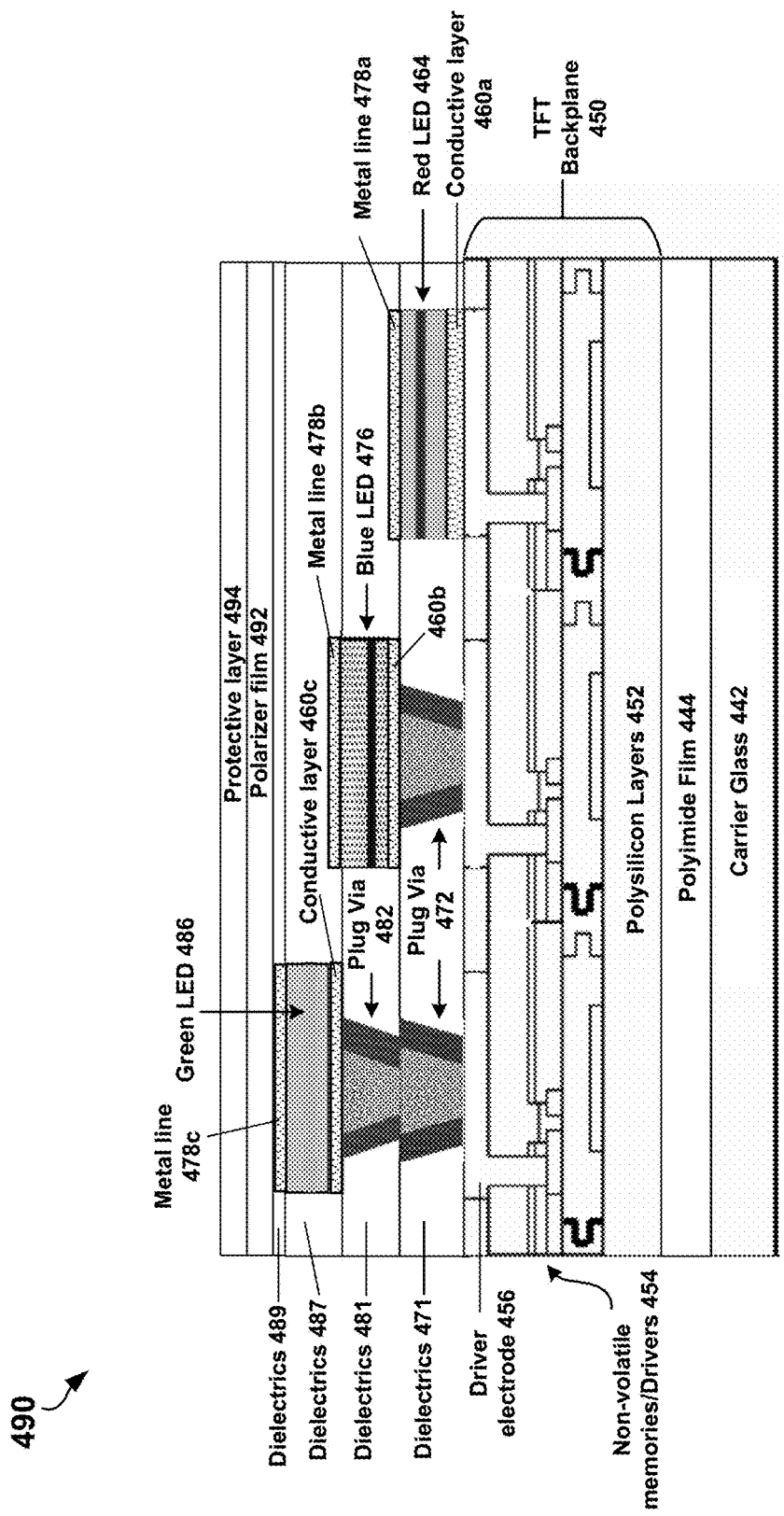

As shown in FIGS. 4T-1 and 4T-2, an isolation material 489 such as a dielectric material is filled into gaps between the metal lines 478*c* and on top of the red LEDs 464 and the blue LEDs 476. The dielectric material 489 can be transparent material, e.g., SiOx. The dielectric material 487 can be deposited in the gaps by chemical vapor deposition (CVD). Topology planarization, e.g., polishing by chemical-mechanical polishing (CMP), is performed to form a flat surface across the arrays of active-matrix multi-color LED display pixels including the arrays of green LEDs 486, the arrays of blue LEDs 476, and the arrays of red LEDs 464.

A polarizer film 492 can be deposited on the flat top surface. The polarizer film 492 is configured to allow light from the LED display pixels to propagate through along a polarization direction to become a polarized light, which can also reduce scattering and get more uniform light. A protective layer 494 can be then formed on the polarizer film 492. As noted above, the protective layer 494 can be a touch-sensitive transparent layer and can form, together with the metal lines 478*c*, 478*b*, 478*a* (as the common electrodes), a capacitive touch screen position sensor. The protective layer 494 can be made of transparent material, e.g., glass or plastic, coated with a conductive material, e.g., indium tin oxide (ITO). FIGS. 4T-1 and 4T-2 show the formed integrated device 490 including the arrays of active-matrix multi-color LED display pixels formed on the TFT array backplanes 450 and covered with the polarizer film 492 and the protective layer 494.

The integrated device 490 has the polyimide film 444 on the carrier glass 442 as the substrate. To form a flexible device, the carrier glass 442 can be removed from the integrated device 490, e.g., by laser lift-off. For example, the polyimide-coated carrier glass 442 can be delaminated via UV excimer laser lift-off, e.g., at 308 nm, with an ablation threshold, e.g., at 235 mJ/cm^2.

Figures 1, 4U:
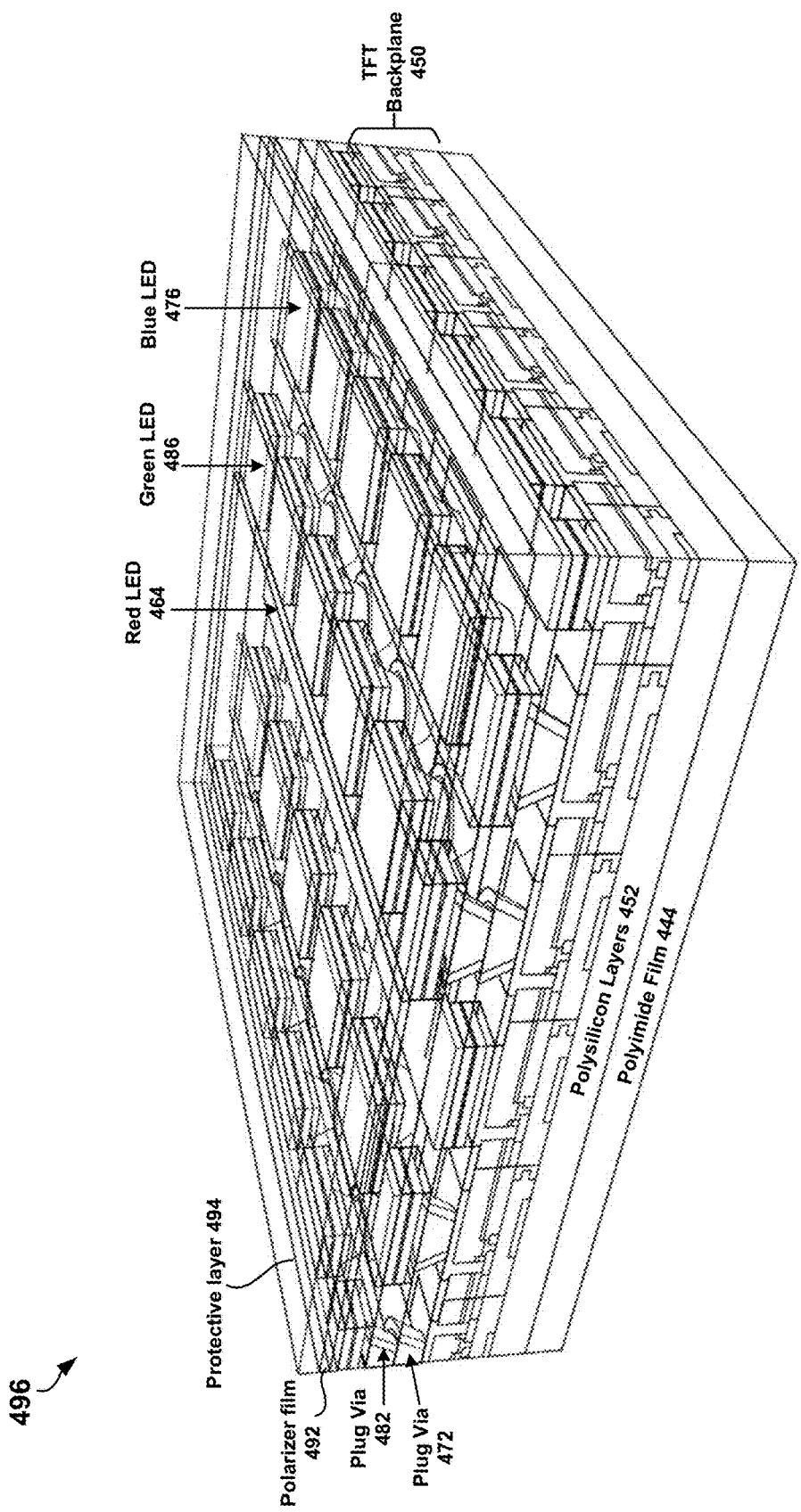
Figures 2, 4U:
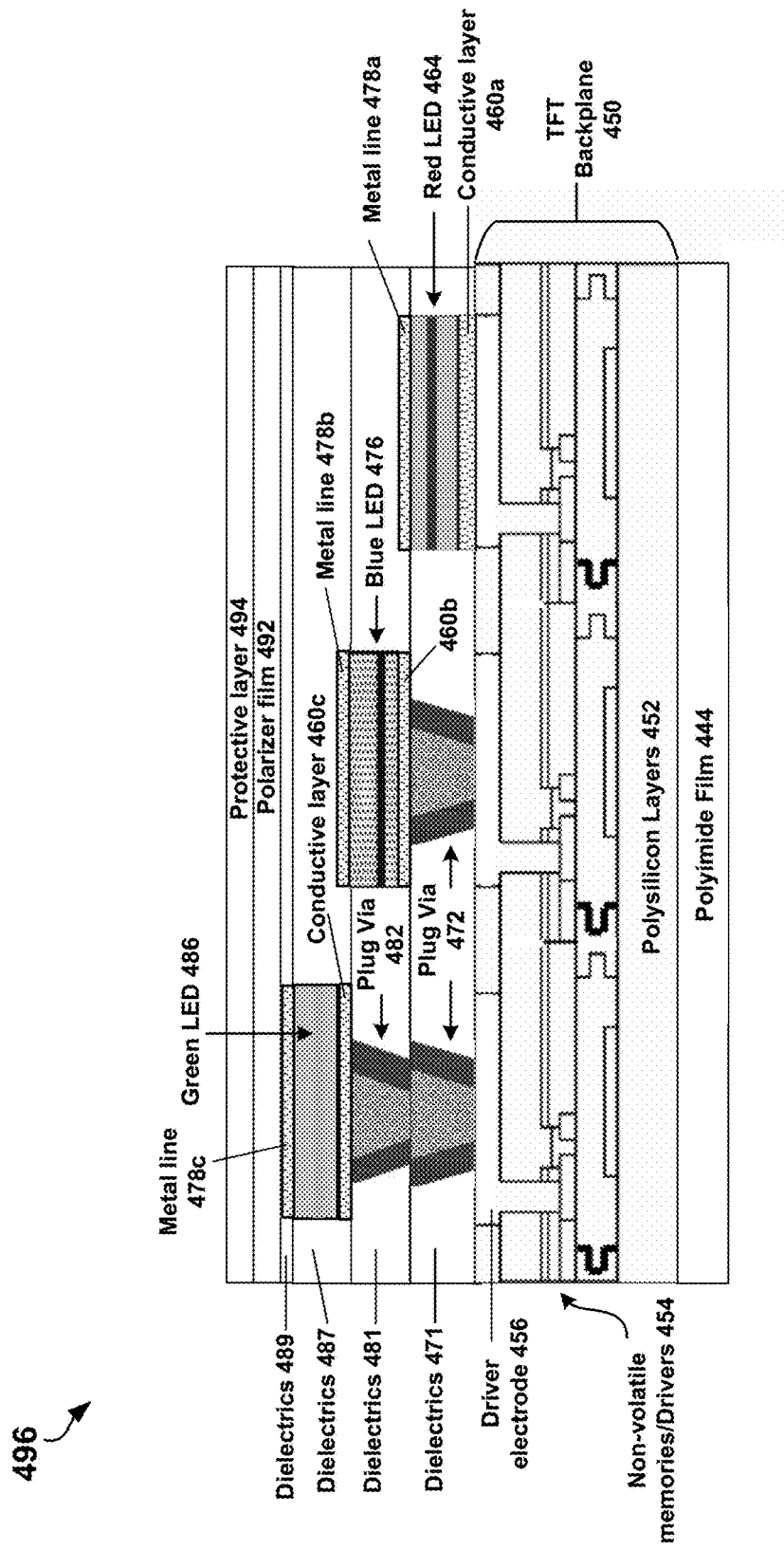

FIGS. 4U-1 and 4U-2 show an integrated active-matrix multi-color LED pixel array based device 496 formed by the above fabrication process, after removing the carrier glass 442. The integrated device 496 can be similar to the integrated device 300 of FIGS. 3A-3C.

Although the implementation discussed above has the LEDs arranged with red, then blue, then green in order from the TFT backplane, the colors can be arranged in other orders, there can be just two colors or four or more colors of LEDs, and other colors can be used.

Example Process

FIG. 5 is a flow diagram of an example process 500 of forming an integrated active-matrix multi-color light-emitting pixel display system by bonding. The integrated system can be the integrated LED pixel array based display system 100 of FIG. 1, 300 of FIGS. 3A-3C, or 350 of FIG. 3D. The example process 500 can be similar to the processes described according to FIGS. 4A-1 to 4U-2.

A first color light emitting structure formed on a first substrate is integrated with a backplane device (502). The backplane device includes at least one backplane having a plurality of pixel circuits. Each pixel circuit can include a non-volatile memory conductively coupled to a driver electrode in a top layer of the backplane. The backplane can be a TFT backplane formed on a flexible film on a carrier substrate. For example, the backplane can be a low temperature polysilicon (LTPS) thin-film transistors (TFT) array control backplane formed on a polyimide (PI) film on a carrier glass.

The first color light emitting structure can be an LED structure, e.g., the blue LED structure 410 of FIG. 4A-1, the green LED structure 422 of FIG. 4B, or the red LED structure 432 of FIG. 4C. The LED structure can include multiple semiconductor layers epitaxially grown on a semiconductor substrate. The semiconductor layers can include first multiple quantum well (MQW) layers having Group III-V compounds, e.g., GaN, as an active medium to emit light with a particular color, e.g., red, blue, or green. The first color light emitting structure can include a first contact electrode layer, e.g., a p-electrode, as a top layer and a second contact electrode layer, e.g., a n-electrode, as a bottom layer, and the MQW layers are between the first contact electrode layer and the second contact electrode layer. The first color light emitting structure can also include a buffer layer between the second contact electrode layer and the first substrate.

The first color light emitting structure formed on the first substrate can be integrated with the backplane device by using low temperature bonding to bond the top layer of the first light emitting structure on the top layer of the backplane device through an intermediate conductive layer. The intermediate conductive layer can be formed by depositing a conductive material on the top layer of the backplane device. The conductive material can include iridium-tin-oxide (ITO) metal material.

The backplane device can have a large substrate to accommodate multiple first light emitting structures. The multiple first color light emitting structures formed on the first substrates can be integrated onto the backplane device by sequential laser scan-and-lift-off processes, as discussed above in FIGS. 4F-1 to 4G. The multiple first color light emitting structures can be aligned with different areas on the backplane device such that the first color light emitting structures remaining bonded to the backplane device after the laser scan-and-lift off processes are adjacent to each other on the backplane device.

After the integration, the first color light emitting structures bonded on the backplane device can be polished to remove the buffer layers to expose the second contact electrode layers, e.g., n-electrodes, of the first color light emitting structures.

After the integration, the first color light emitting structure is patterned to form a plurality of first color light emitting elements in a first region over the backplane device (504). Each of the first color light emitting elements is operable to emit light with a first color, e.g., red, blue, or green. Each first color light emitting element is conductively coupled to a respective pixel circuit in the first region to thereby form a first color light-emitting pixel through a respective patterned intermediate conductive layer and a respective driver electrode. Accordingly, the plurality of first color light emitting elements is conductively coupled to respective pixel circuits in the first region to form a plurality of active-matrix first color light-emitting pixels. The first color light-emitting structure and the intermediate conductive layer can be simultaneously patterned. Each first color light emitting element can have a size same as a respective patterned intermediate conductive layer and is self-aligned with the respective patterned intermediate conductive layer.

Before patterning the first color light emitting structure, a protective mask can be aligned with the respective driver electrodes in the first region, such that each of the first color light emitting elements is formed on a respective driver electrodes in the first region. The first color light emitting element can have a size substantially same as the respective dielectric electrode.

A plurality of plug vias is formed on a remaining region of the backplane device (506). The remaining region is non-overlapping with and separate from the first region. Before forming the plurality of plug vias, a protective mask can be aligned with the respective driver electrodes in the remaining region, such that each of the plug vias is arranged on a respective driver electrode in the remaining region. Each plug via can be conductively coupled to a respective pixel circuit through the respective driver electrode.

After patterning the first color light emitting structure, an isolation material can be filled in gaps of the first color light emitting elements. The isolation material can be transparent dielectric material, e.g., SiOx. The isolation material can also be opaque dielectric material, e.g., SiNx.

Then the plurality of first plug vias can be formed through the isolation material in the remaining region over the backplane device. A plurality of trenches can be formed by etching through the isolation material onto a top layer of the backplane device, and a conductive material can be filled inside the trenches to form the plug vias. Before filling the conductive material, a barrier metallic layer can be first deposited on inner surfaces of the trenches. In some examples, the filled conductive material is transparent metal material such as ITO. In some examples, the filled conductive material is opaque metal material such as Cu or Al.

In some implementations, the trenches are over etched through the isolation material into a portion of the top layer of the backplane device, e.g., into the respective driver electrodes in the remaining region. That is, each of the formed trenches extends into a respective driver electrode in the remaining region, such that each of the formed plug vias is anchored in the respective driver electrode. In such a way, the formed first color light emitting elements can be fixed or integrated on the backplane device at least partially by the formed plug vias and the isolation material between the plug vias and the first color light emitting elements.

After forming the plug vias, the first color light emitting elements, the plug vias, and the isolation material can be polished to form a flat surface across the first plug vias and the second contact electrodes of the first color light emitting elements. A transparent conductive layer can be then deposited on the flat surface.

A second color light emitting structure formed on a second substrate is integrated with the backplane device that is integrated with the first color light emitting elements and plug vias (508). The second color light emitting structure can be another LED structure, e.g., the blue LED structure 410 of FIG. 4A-1, the green LED structure 422 of FIG. 4B, or the red LED structure 432 of FIG. 4C. The second color light emitting structure can include multiple semiconductor layers epitaxially grown on a semiconductor substrate. The semiconductor layers can include second multiple quantum well (MQW) layers having Group III-V compounds as an active medium to emit light with a second color different from the first color emitted from the first color light emitting structure. The second color light emitting structure can also include a first contact electrode layer, e.g., a p-electrode, as a top layer and a second contact electrode layer, e.g., a n-electrode, as a bottom layer, and the MQW layers are between the first contact electrode layer and the second contact electrode layer. The second color light emitting structure can also include a buffer layer between the second contact electrode layer and the second substrate.

The second color light emitting structure can be integrated on the backplane device by using low temperature bonding to bond the top layer of the second light emitting structure on the transparent conductive layer as an intermediate conductive layer. The transparent conductive layer can include an iridium-tin-oxide (ITO) metal film.

The second color light emitting structure is patterned to form a plurality of second color light emitting elements in a second region over the backplane device (510). The second region is in the remaining region and separate from the first region. Each second color light emitting element is operable to emit light with a second color different from the first color from the first color light emitting element. Each second color light emitting element is conductively coupled to a respective pixel circuit in the second region through a respective plug via and a respective driver electrode under the respective plug via to form an active-matrix second color light emitting pixel. Accordingly, the plurality of second color light emitting elements is conductively coupled to respective pixel circuits in the second region to form a plurality of active-matrix second color light emitting pixels. The plurality of active-matrix second color light emitting pixels and the plurality of active-matrix first color light emitting pixels form an array of active-matrix multi-color light emitting pixels. Thus, the first color light emitting elements formed in a first planar layer on top of the backplane device. The first planar layer includes the plug vias that penetrate through the isolation material in the first planar layer. The second color light emitting elements are formed in a second planar layer on top of the plug vias in the first planar layer. Thus, the second planar layer is higher than the first planar layer.

Before patterning the second color light emitting structure, a protective mask can be aligned with the driver electrodes in the second region such that the second color light emitting structure can be selectively etched to from the plurality of second color light emitting elements on the plug vias in the second region.

After patterning the second color light emitting structure, the transparent conductive layer can be selectively etched to form at least one conductive metal line on the second contact electrodes (e.g., n-electrodes) of the first color light emitting elements and respective patterned transparent conductive layers under the second color light emitting elements. The conductive metal line conductively connects the second contact electrodes of the first color light emitting elements to form a common electrode. Each of the second light emitting elements can be conductively coupled to a respective pixel circuit in the second region through a respective patterned transparent conductive layer and a respective plug via on the second region.

After patterning the second color light emitting structure and the transparent conductive layer, an isolation material can be filled between gaps of the second color light emitting elements and on top of the first color light emitting elements. The isolation material can be transparent dielectric material. Then the second color light emitting elements and the isolation material can be polished to form a flat surface to expose the second contact electrodes of the second color light emitting elements. A second transparent conductive layer can be deposited on the flat surface to connect the second contact electrodes of the second color light emitting elements as a common electrode. The second transparent conductive layer can be made of transparent ITO metal material.

One or more additional light emitting structures, e.g., LED structures, can be integrated on the integrated device to add more colors into the pixels. As illustrated in FIGS. 3A-3D, the array of active-matrix multi-color light emitting pixels can include three primary colors red, blue, and green. A third color light emitting structure can be further integrated onto the integrated device through additional plug vias.

In some implementations, before depositing the second transparent conductive layer, a plurality of second plug vias is formed in a second remaining region over the backplane device. The second remaining region is in the remaining region and non-overlapping with the second region. Each of the second plug vias is conductively coupled to a respective pixel circuit in the second remaining region through a respective plug via in the second remaining region.

The second plug vias can be formed in the same planar layer as the second color light emitting elements. For example, after patterning the second light emitting structure to form the plurality of second light emitting elements, an isolation material can be filled between gaps of the second color light emitting elements and on top of the first color light emitting elements. The plurality of second plug vias can be formed in the second remaining region by selectively etching to form a plurality of trenches through the isolation material on respective plug vias in the second remaining region and filling a conductive material inside the trenches to form the second plug vias. In some implementations, the plurality of trenches is over etched through the isolation material into the plug vias in the second remaining region such that each of the formed trenches extends into a corresponding plug via in the second remaining region, such that each of the formed second plug vias is anchored in the corresponding plug via that can be anchored in the backplane device. Then the second color light emitting elements, the second plug vias, and the isolation material can be polished to form a flat surface across the second plug vias and the second contact electrodes of the second color light emitting elements. A second transparent conductive layer is then deposited on the flat surface.

A third color light emitting structure formed on a third substrate can be integrated on the backplane device that is integrated with the first color light emitting elements, the second color light emitting elements and the first plug vias and the second plug vias. The third light emitting structure can be an LED structure including multiple semiconductor layers having one or more third MQW layers as an active medium.

The third light emitting structure can then be patterned to form a plurality of third light emitting elements in a third region over the backplane device, the third region being in the second remaining region. The third region can be the second remaining region, and the second region and the third region can form the remaining region. Each of the third light emitting elements is operable to emit light with a third color different from the first color and the second color. Each of the third light emitting elements is conductively coupled to a respective pixel circuit in the third region through a respective plug via and a respective second plug via in the third region to thereby form a plurality of active-matrix third color light emitting pixels.

The plurality of first color light emitting pixels, the plurality of second color light emitting pixels, and the plurality of third color light emitting pixels can form an array of active-matrix multi-color light emitting display pixels. The first, second, and third colors can include blue, green, and red. Each of the multi-color light emitting pixels includes at least one first color light emitting element, e.g., a red LED, at least one second color light emitting element, e.g., a blue LED, and at least one third color light emitting element, e.g., a green LED, and respective pixel circuits coupled to the first, second, third light emitting elements. The first, second, and third light emitting elements in the multi-color light emitting pixel can be adjacent to each other.

The third color light emitting structure formed on the third substrate can be integrated with the second plug vias on the backplane device by using low temperature bonding to bond a top layer of the third color light emitting structure on the second transparent conductive layer as an intermediate conductive layer. The second transparent conductive layer can include a transparent iridium-tin-oxide (ITO) metal film.

The third color light emitting structure can be patterned by selectively etching the third color light emitting structure to form the plurality of third color light emitting elements on the third region. After patterning the third color light emitting structure, the second transparent conductive layer can be selectively etched to form at least one conductive metal lines on the second contact electrodes of the second color light emitting elements and respective patterned second transparent conductive layers under the third color light emitting elements. The conductive metal lines conductively connect the second contact electrodes of the second light emitting elements to form at least one common electrode. Each of the third color light emitting elements is conductively coupled to a respective pixel circuit in the third region through the respective patterned second transparent conductive layer and the respective plug via and second plug via on the third region.

After patterning the third color light emitting structure, a transparent isolation material can be filled between gaps of the third color light emitting elements and on top of the second color light emitting elements and the first color light emitting elements. Then the third color light emitting elements and the isolation material are polished to form a flat surface across contact electrodes of the third light emitting elements. A third transparent conductive layer, e.g., an ITO film, can be deposited on the flat surface to connect the contact electrodes of the third light emitting elements to form a common electrode.

A transparent protective layer can be formed on top of the array of multi-color light emitting pixels. The formed transparent protective layer can be a transparent touch-sensitive protective layer, and the transparent touch-sensitive protective layer is configured to form, together with common electrodes of the first, second, and third light emitting elements, a capacitive touch screen position sensor. In some implementations, a polarizer film is formed between the transparent protective layer and the array of multi-color light emitting pixels.

As noted above, the backplane can be a TFT array control backplane formed on a flexible film on a carrier substrate. The carrier substrate can be removed, e.g., by laser peel-off, such that the integrated device fabricated on the flexible film becomes flexible.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments.

Thus, particular embodiments of the subject matter have been described. Nevertheless, it will be understood that various modifications may be made without departing from the spirit and scope of the subject matter. Accordingly, other embodiments are within the scope of the following claims.

What is claimed is:

1. An integrated device comprising:
   a backplane device including at least one backplane having a plurality of pixel circuits;
   a first planar layer on the backplane device, the first planar layer including:
      a plurality of first light emitting elements in a first region over the backplane device, wherein each of the first light emitting elements is operable to emit light with a first color and conductively coupled to a respective pixel circuit in the first region to thereby form a plurality of first light emitting sub-pixels, and
      a plurality of first plug vias in a remaining region over the backplane device, the remaining region being non-overlapping with the first region, wherein each of the first plug vias is conductively coupled to a respective pixel circuit in the remaining region; and
   a second planar layer on the first planar layer, the second planar layer including
      a plurality of second light emitting elements on respective first plug vias in a second region over the backplane device, the second region being in the remaining region, wherein each of the second light emitting elements is operable to emit light with a second color different from the first color and conductively coupled to a respective pixel circuit in the second region through a respective first plug via on the second region to thereby form a plurality of second light emitting sub-pixels.

2. The integrated device of claim 1, wherein the second planar layer further includes:
   a plurality of second plug vias on respective first plug vias in a third region of the backplane device, the third region being in the remaining region and non-overlapping with the second region, wherein each of the second plug vias is conductively coupled to a respective pixel circuit in the third region through a respective first plug vias,
   wherein the integrated device further comprises a third planar layer on the second planar layer, the third planar layer including a plurality of third light emitting elements in the third region, wherein each of the third light emitting elements is operable to emit light with a third color different from the first color and the second color, and wherein each of the third light emitting elements is conductively coupled to a respective pixel circuit in the third region through a respective first plug via and a respective second plug via in the third region to thereby form a plurality of third light emitting sub-pixels, and wherein the plurality of first light emitting sub-pixels, the plurality of second light emitting sub-pixels, and the plurality of third light emitting sub-pixels form an array of multi-color light emitting pixels.

3. The integrated device of claim 2, wherein the first, second, and third colors comprise red, blue, and green.

4. The integrated device of claim 2, wherein each of the multi-color light emitting pixels comprises at least one first light emitting element, at least one second light emitting element, and at least one third light emitting element and respective pixel circuits coupled to the first, second, third light emitting elements, and wherein the first, second, and third light emitting elements in the multi-color light emitting pixel are adjacent to each other.

5. The integrated device of claim 2, wherein each of the pixel circuits is coupled to a respective driver electrode in a top layer of the backplane device, wherein each of the first plug vias extends into a respective driver electrode in the remaining region, such that the first plug via is anchored in the respective driver electrode, and wherein each of the second plug vias extends into a respective first plug vias in the third region, such that the second plug via is anchored in the respective first plug via.

6. The integrated device of claim 1, wherein each of the pixel circuits is coupled to a respective driver electrode in a top layer of the backplane device, wherein each of the first light emitting elements comprises one or more first quantum well layers between a first top contact electrode and a first bottom contact electrode, wherein the first top contact electrodes of the first light emitting elements are conductively connected by one or more first conductive lines as one or more first common electrodes, and wherein the first bottom contact electrode of each of the first light emitting elements is bonded to a respective driver electrode through a respective first intermediate conductive layer, and each of the first light-emitting elements has a size same as the respective first intermediate conductive layer and is self-aligned with the respective first intermediate conductive layer.

7. The integrated device of claim 6, wherein each of the second light emitting elements comprises one or more second quantum well layers between a second top contact electrode and a second bottom contact electrode, wherein the second top contact electrodes of the second light emitting elements are conductively connected by one or more second conductive lines as one or more second common electrodes, and wherein the second bottom contact electrode of each of the second light emitting elements is bonded to a respective first plug via through a respective second intermediate conductive layer, and each of the second light-emitting elements has a size same as the respective second intermediate conductive layer and is self-aligned with the respective second intermediate conductive layer.

8. The integrated device of claim 7, wherein each of the first intermediate conductive layers, the second intermediate conductive layers, the first conductive lines, and the second conductive lines is made of transparent ITO metal material.

9. The integrated device of claim 1, wherein each of the pixel circuits is coupled to a respective driver electrode in a top layer of the backplane device, wherein each of the first plug vias is on a respective driver electrode in the remaining region and conductively coupled to the respective driver electrode, and wherein each of the first plug vias has a size on a top surface no larger than a size of a respective second light-emitting elements and a size a bottom surface no larger than the respective driver electrode in the second region.

10. The integrated device of claim 1, further comprising: isolation material between adjacent first light emitting elements, between adjacent first plug vias, between adjacent first emitting elements and first plug vias, and between adjacent second light emitting elements.

11. The integrated device of claim 1, wherein each of the pixel circuits comprises a non-volatile memory conductively coupled to a corresponding driver electrode in a top layer of the backplane, wherein the backplane comprises scanning drivers and data drivers, and each of the non-volatile memories is coupled to one of the scanning drivers through at least one word line and to one of the data drivers through at least one bit line, and wherein each of the first light emitting elements is conductively coupled to a respective non-volatile memory in the first region through a corresponding driver electrode in the first region, and wherein each of the second light emitting elements is conductively coupled to a respective non-volatile memory in the second region through a respective first plug via and a corresponding driver electrode in the second region, the respective first plug via being in touch with the corresponding driver electrode and conductively coupled to the corresponding driver electrode.

12. The integrated device of claim 11, wherein the transparent protective layer is touch-sensitive, and configured to form, together with one or more first common electrodes of the first light-emitting elements and one or more second common electrodes of the second light-emitting elements, a capacitive touch screen position sensor.

13. The integrated device of claim 1, further comprising:
a polarizer film on the array of multi-color light-emitting pixels; and
a transparent protective layer on the polarizer film.

14. The integrated device of claim 1, wherein the backplane comprises a low temperature polysilicon (LTPS) thin-film transistors (TFT) array control backplane.

15. The integrated device of claim 14, wherein each of the pixels includes at least one of:
a size less than 10 μm,
a respond time faster than 1.0 μs, or
an emitting light flux higher than 10 cd/mm^2.

16. The integrated device of claim 14, comprising at least one of:
a thickness less than 1.0 mm, or
a device area larger than 100 mm×100 mm.

17. The integrated device of claim 14, wherein the device is flexible, rollable, and foldable.

18. The integrated device of claim 1, wherein the backplane is operable to drive the array of multi-color light emitting pixels by pulse-width-modulation (PWM).

19. The integrated device of claim 1, wherein each of the multi-color light-emitting pixels includes at least one first sub-pixel and at least one second sub-pixel having respective first and second light brilliances to emit the first color and the second color, and wherein the backplane is configured to drive the first and second sub-pixels with respective first and second currents, and a current ratio between the first and second currents is based on a ratio between the first and second light brilliances.

20. An integrated device comprising:

a backplane device including at least one backplane having a plurality of pixel circuits;

a first light emitting device arranged in a first planar layer on the backplane device, the first light emitting device including a plurality of first light emitting elements each conductively coupled to respective pixel circuits in the backplane device to form an array of first light emitting pixels, each of the first light emitting elements being operable to emit light with a first wavelength; and a second light emitting device arranged in a second planar layer higher than the first planar layer relative to the backplane device, the second light emitting device including a plurality of second light emitting elements each conductively coupled to respective pixel circuits in the backplane device to form an array of second light emitting pixels, each of the second light emitting element being operable to emit light with a second wavelength different from the first wavelength.

21. The integrated device of claim 20, further comprising:

a third light emitting device arranged in a third planar layer higher than the second planar layer relative to the backplane device, the third light emitting device including a plurality of third light emitting elements each conductively coupled to respective pixel circuits in the backplane device to form an array of third light emitting pixels, each of the third light emitting element being operable to emit light with a third wavelength different from the first wavelength and the second wavelength, wherein the array of first light emitting pixels, the array of second light emitting pixels, and the array of third light emitting pixels form an array of multi-color light emitting pixels.

22. The integrated device of claim 20, wherein the second light emitting elements are vertically higher than the first light emitting elements, such that there is substantially no cross-talk at least in a horizontal direction between the light emitted from the second light emitting elements and the light emitted from the first light emitting elements.

23. The integrated device of claim 20, configured to be a three-dimensional (3D) light emitting device with light emitting elements with different wavelengths in planar layers at different heights from the backplane device.

24. The integrated device of claim 20, further comprising:

a plurality of plug vias formed in the first planar layer and separated from the first light emitting elements, wherein each of the plug vias is arranged between a respective second light emitting element and a respective pixel circuit for the respective second light emitting element and conductively couples the respective second light emitting element to the respective pixel circuit.

25. The integrated device of claim 24, wherein each of the plug vias extends through the first planar layer into the respective pixel circuit in the backplane device and is anchored into the respective pixel circuit, such that the first planar layer is fixed together with the backplane device by the plug vias.

26. The integrated device of claim 20, further comprising:

a plurality of plug vias formed in the second planar layer and separated from the second light emitting elements, wherein each of the plug vias extends through the second planar layer into the first planar layer and is anchored into the first planar layer, such that the second planar layer is fixed together with the first planar layer by the plug vias, and wherein the plug vias are anchored into an area of the first planar layer that non-overlaps with an area including the first light emitting elements.

27. The integrated device of claim 26, wherein each of the plug vias extends through the second planar layer and the first planar layer into the backplane device and is anchored into the backplane device, such that the second planar layer and the first planar layer are fixed together with the backplane device by the plug vias.

28. An integrated device comprising:

a backplane device including at least one backplane having a plurality of pixel circuits;

a light emitting device arranged in a planar layer on the backplane device, the light emitting device including a plurality of light emitting elements each conductively coupled to respective pixel circuits in the backplane device to form an array of light emitting pixels; and a plurality of plug vias penetrating through the planar layer into the backplane device such that the plug vias are anchored in the backplane device, such that the light emitting device is fixed onto the backplane device.

* * * * *